United States Patent
Florian Lohse et al.

(10) Patent No.: US 10,948,658 B2
(45) Date of Patent: Mar. 16, 2021

(54) OPTICAL INTERCONNECTION ASSEMBLIES, GLASS INTERCONNECTION SUBSTRATES, AND METHODS OF MAKING AN OPTICAL CONNECTION

(71) Applicant: CORNING OPTICAL COMMUNICATIONS LLC, Hickory, NC (US)

(72) Inventors: Chenueh Abongwa Florian Lohse, Berlin (DE); James Scott Sutherland, Corning, NY (US)

(73) Assignee: Corning Optical Communications LLC, Charlotte, NC (US)

( * ) Notice: Subject to any disclaimer, the term of this patent is extended or adjusted under 35 U.S.C. 154(b) by 81 days.

(21) Appl. No.: 15/898,967

(22) Filed: Feb. 19, 2018

(65) Prior Publication Data

US 2018/0246279 A1     Aug. 30, 2018

Related U.S. Application Data

(60) Provisional application No. 62/464,001, filed on Feb. 27, 2017.

(51) Int. Cl.
   *G02B 6/30*             (2006.01)
   *G02B 6/13*             (2006.01)
   (Continued)

(52) U.S. Cl.
   CPC ........... *G02B 6/305* (2013.01); *G02B 6/1228* (2013.01); *G02B 6/13* (2013.01); *G02B 6/3839* (2013.01);
   (Continued)

(58) Field of Classification Search
   CPC ...... G02B 6/12004; G02B 6/124; G02B 6/13; G02B 6/305; G02B 6/4206; G02B 6/1228;
   (Continued)

(56) References Cited

U.S. PATENT DOCUMENTS 4,084,130 A * 4/1978 Holton ..................... G02B 6/30
                                                     257/E27.12
5,259,049 A * 11/1993 Bona ........................ G02B 6/42
                                                     385/49
(Continued)

FOREIGN PATENT DOCUMENTS

CN         102116898 B     8/2012
JP         2004046031 A     2/2004
(Continued)

OTHER PUBLICATIONS

Akiyama et al; "Air Trench Bends and Splitters for Dense Optical Integration in Low Index Contrast"; Journal of Lightwave Technology, vol. 23, No. 7, Jul. 2005; pp. 2271-2277.
Almeida et al; "Nonlinear Optical Properties and Femtosecond Laser Micromachining of Special Glasses"; J. Braz. Chem. Soc. vol. 26, No. 12, 2015; pp. 2418-2429.
Boisset et al; "Design and Construction of an Active Alignement Demonstrator for a Free-Space Optical Interconnect"; IEEE Photonics Technology Letters, vol. 7, No. 6, Jun. 1995; pp. 676-678.
Brusberg et al; "Single-Mode Glass Waveguide Platform for DWDM Chip-To-Chip Interconnects"; IEEE, 2012; pp. 1532-1539.
(Continued)

*Primary Examiner* — Thomas A Hollweg
*Assistant Examiner* — Mary A El-Shammaa
(74) *Attorney, Agent, or Firm* — Grant A. Gildehaus

(57) ABSTRACT

Optical interconnection assemblies, glass interconnection substrates, and methods for making optical connections are disclosed. In one embodiment, an optical interconnection assembly includes a base substrate, a substrate optical waveguide coupled to the base substrate, the substrate optical waveguide having an end surface, an optical chip comprising an optical coupling surface, and a glass interconnection substrate. The glass interconnection substrate includes a first end optically coupled to the end surface of the substrate optical waveguide, a second end optically coupled to the optical coupling surface of the optical chip, and a curved portion disposed between the first end and the second end.

(Continued)

The glass interconnection substrate further includes an optical waveguide at least partially positioned within the curved portion.

62 Claims, 44 Drawing Sheets

(51) Int. Cl.
  *G02B 6/42* (2006.01)
  *G02B 6/38* (2006.01)
  *G02B 6/122* (2006.01)
  *H05K 1/02* (2006.01)
  *H05K 1/18* (2006.01)

(52) U.S. Cl.
  CPC ......... *G02B 6/4204* (2013.01); *G02B 6/4227* (2013.01); *G02B 6/4249* (2013.01); *H05K 1/0274* (2013.01); *H05K 1/181* (2013.01); *H05K 2201/10121* (2013.01)

(58) Field of Classification Search
  CPC ........ G02B 6/136; G02B 6/42; G02B 6/4214; G02B 6/4227; G02B 6/4247; G02B 6/3839; G02B 6/4204
  See application file for complete search history.

(56) References Cited

U.S. PATENT DOCUMENTS

| | | | |
|---|---|---|---|
| 6,154,593 A | | 11/2000 | Miura et al. |
| 6,240,235 B1 | * | 5/2001 | Uno .................. C03B 11/08 385/137 |
| 6,438,295 B1 | | 8/2002 | McGarry et al. |
| 6,768,850 B2 | | 7/2004 | Dugan et al. |
| 6,997,554 B2 | | 2/2006 | Nakada et al. |
| 7,329,050 B1 | | 2/2008 | Dugan et al. |
| 7,409,118 B2 | | 8/2008 | Said et al. |
| 8,270,784 B2 | | 9/2012 | Thomson et al. |
| 8,270,788 B2 | | 9/2012 | Herman et al. |
| 8,270,792 B1 | | 9/2012 | Ng |
| 8,597,871 B2 | | 12/2013 | Mcleod |
| 9,034,222 B2 | | 5/2015 | Koos et al. |
| 9,124,959 B2 | | 9/2015 | Xu et al. |
| 9,594,220 B1 | * | 3/2017 | Sutherland ............. G02B 6/125 |
| 9,766,411 B2 | | 9/2017 | Butler et al. |
| 2003/0099452 A1 | | 5/2003 | Borrelli et al. |
| 2004/0258359 A1 | | 12/2004 | Corkum et al. |
| 2009/0310906 A1 | | 12/2009 | Miyatake |
| 2014/0126030 A1 | | 5/2014 | Crespi et al. |
| 2017/0293102 A1 | | 10/2017 | Bauco et al. |
| 2018/0172905 A1 | * | 6/2018 | Fortusini ............... G02B 6/125 |
| 2018/0246286 A1 | * | 8/2018 | Lohse ..................... G02B 6/43 |

FOREIGN PATENT DOCUMENTS

| | | |
|---|---|---|
| JP | 2005010373 A | 1/2005 |
| JP | 2005156945 A | 6/2005 |
| JP | 200601014 A | 8/2006 |
| JP | 03925209 B2 | 6/2007 |
| JP | 04514999 B2 | 7/2010 |
| WO | 2018022318 A1 | 2/2018 |
| WO | 2018022319 A1 | 2/2018 |

OTHER PUBLICATIONS

Brusberg et al; "Thin Glass Based Packaging Technologies for Optoelectronic Modules"; Electronic Components and Technology Conference; IEEE, 2009; pp. 207-212.

Butler et al; "Optical-Electrical Printed Circuit Boards With Integrated Optical Waveguide Arrays and Photonic Assemblies Using Same"; Filed as U.S. Appl. No. 15/789,132, filed Oct. 20, 2017; 68 Pages.

Cheng et al; "Dye-Doped Polymer Based Self-Written Waveguide for Optical Interconnection," Portable Information Devices, 2008 and the 2008 7th IEEE Conference on Polymers and Adhesives in Microelectronics and Photonics. Portable-Polytronic 2008. 2nd IEEE International Interdisciplinary Conference on, pp. 1-6, 2008.

Chu et al; "Densities and Refractive Indices of Alcohol-Water Solutions N-Propyl, Isopropyl, and Methyl Alcohols"; Journal of Chemical and Engineering Data; vol. 7, No. 3, Jul. 1962; pp. 358-360.

Dai et al; "Deeply Etched SIO2 Ridge Waveguide for Sharp Bends"; Journal of Lightwave Technology, vol. 24, No. 12, Dec. 2006; pp. 5019-5024.

Deng et al; "Self-Aligned Single-Mode Polymer Waveguide Interconnections for Efficient Chip-To-Chip Optical Coupling"; IEEE Journal of Selected Topics in Quantum Electronics, vol. 12, No. 5, Sep./Oct. 2006; pp. 923-930.

Eaton et al; "Heat Accumulation Effects in Femtosecond Laser-Written Waveguides With Variable Repetition Rate"; Optics Express, vol. 13, No. 12, pp. 4708-4716.

Fernandes et al; "Stress Induced Birefringence Tuning in Femtosecond Laser Fabricated Waveguides in Fused Silica"; Optics Express, vol. 20, No. 22; Oct. 2012; pp. 24103-24114.

Fortusini et al; "Flexible Glass Optical-Electrical Interconnection Device and Photonic Assemblies Using Same"; Filed as U.S. Appl. No. 15/846,312, filed Dec. 19, 2017; 67 Pages.

Hiramatsu et al; "Laser-Written Optical-Path Redirected Waveguide Device for Optical Back-Plane Interconnects"; IEEE Photonics Technology Letters, vol. 16, No. 9, Sep. 2004; pp. 2075-2077.

Hirose et al; "Optical Component Coupling Using Self-Written Waveguides," Optical Communication, 2001. ECOC '01. 27th European Conference on, vol. 2, pp. 140-141, 2001.

Huang et al; "Ultrafast Laser Fabrication of 3D Photonic Components in Flexible Glasses"; Optical Fiber Communication Conference; Mar. 2014; 3 Pages.

Jackson et al; "A High-Density, Four-Channel, OEIC Transceiver Module Utilizing Planar-Processed Optical Waveguides and Flip-Chip, Solder-Bump Technology"; Journal of Lightwave Technology, vol. 12, No. 7; Jul. 1994; pp. 1185-1191.

Koos et al; "Photonic Wire Bonding: Nanophotonic Interconnects Fabricated by Direct-Write 3D Lithography"; IEEE, 2013; pp. 1-4.

Kouskousis et al; "Quantitative Phase and Refractive Index Analysis of Optical Fibers Using Differential Interference Contrast Microscopy"; Applied Optics, vol. 47, No. 28, Oct. 2008; pp. 5182-5189.

Knack et al; "180° Light Path Conversion Device With Tapered Self-Written Waveguide for Optical Interconnection"; IEEE Photonics Technology Letters, vol. 22, No. 15; Aug. 2010; pp. 1126-1128.

Lindenmann et al; "Connecting Silicon Photonic Circuits to Multicore Fibers by Photonic Wire Bonding"; Journal of Lightwave Technology, vol. 33, No. 4, Feb. 2015; pp. 755-760.

Lindenmann et al; "Photonic Wire Bonding for Single-Mode Chip-To-Chip Interconnects"; IEEE, 2011; pp. 380-382.

Marcuse; "Length Optimization of an S-Shaped Transition Between Offset Optical Waveguides"; Applied Optics, vol. 17, No. 5; Mar. 1978; pp. 763-768.

Nasu et al; "Developments in Laser Processing for Silica-Based Planar Lightwave Circuits"; Proc. of SPIE, vol. 6107; 2006; pp. 61070B-1-61070B-9.

Nasu et al; "Low-Loss Waveguides Written With a Femtosecond Laser for Flexible Interconnection in a Planar Light-Wave Circuit"; Optics Letters; vol. 30, No. 7; Apr. 2005; pp. 723-725.

Nasu et al; "Waveguide Interconnection in Silica-Based Planar Lightwave Cicruit Using Femtosecond Laser"; Journal of Lightwave Technology, vol. 27, No. 18, Sep. 2009; pp. 4033-4039.

Ozawa et al; "Self-Written Waveguide Connection Between VCSEL and Optical Fiber With 45° Mirror Using Green Laser"; IEEE Photonic Technology Letters, vol. 18, No. 3, Feb. 2006; pp. 532-534.

(56) References Cited

OTHER PUBLICATIONS

Ryu et al; "Optical Interconnection for a Polymeric PLC Device Using Simple Positional Alignment"; Optics Express, vol. 19, No. 9; Apr. 2011; pp. 8571-8579.

Salter et al; "Focussing Over the Edge: Adaptive Subsurface Laser Fabrication Up to the Sample Face"; Optics Express, vol. 20, No. 18; Aug. 2012; pp. 19978-19989.

Schroder et al; "New Options for Chip-To-Chip Photonic Packaging by Using Thin Glass Based Waveguide Substrates on Board and Module Level"; Proc. of SPIE, vol. 7607; 2010; pp. 76070F-1-76070F-10.

Streltsov et al; "Laser-Written High-Contrast Waveguides in Glass"; Proc. of SPIE; vol. 7366; 2009; pp. 73661l-1-73661l-8.

Sugihara et al; "Light-Induced Self-Written Polymeric Optical Waveguides for Single-Mode Propagation and for Optical Interconnections"; IEEE Photonics Technology Letters, vol. 16, No. 3, Mar. 2004; pp. 804-806.

Thomson et al; "Ultrafast-Laser Inscription of a Three Dimensional Fan-Out Device for Multicore Fiber Coupling Applications"; Optics Express, vol. 15, No. 18, Sep. 2007; pp. 11691-11697.

Van Thourhout et al; "Technologies for On-Chip Optical Interconnects"; IEEE; 2005; pp. 204-205.

Vazquez et al; "Integration of Femtosecond Laser Written Optical Waveguides in a Lab-On-Chip"; Lab Chip; 2009, 9, pp. 91-96.

Yagisawa et al; "Novel Trace Design for High Data-Rate Multi-Channel Optical Tranceiver Assembled Using Flip-Chip Bonding"; IEEE, Electronic Component & Technology Conference; 2014; pp. 1048-1053.

Yanagisawa et al; "Film-Level Hybrid Integration of AlGaAs Laser Diode With Glass Waveguide on Si Substrate"; IEEE Photonics Technology Letters, vol. 4, No. 1, Jan. 1992; pp. 21-23.

Yoshimura et al; "Self-Organized Lightwave Network Based on Waveguide Films for Three-Dimensional Optical Wiring Within Boxes"; Journal of Lightwave Technology; vol. 22, No. 9, Sep. 2004; pp. 2091-2100.

* cited by examiner

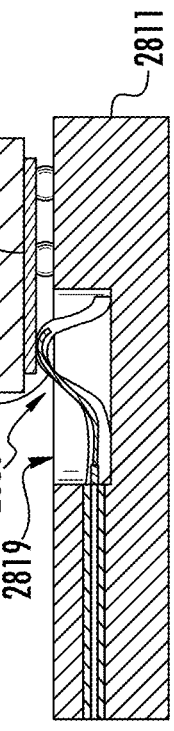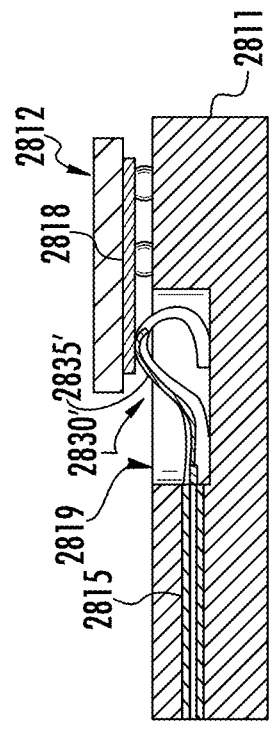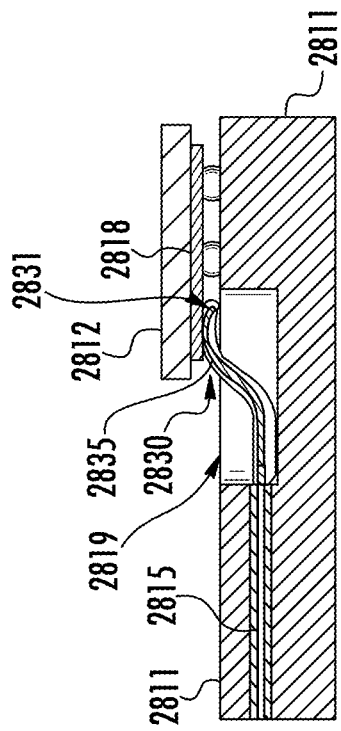
FIG. 34A  FIG. 34B  FIG. 34C
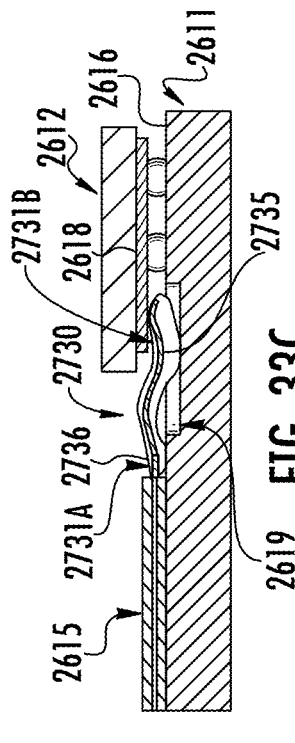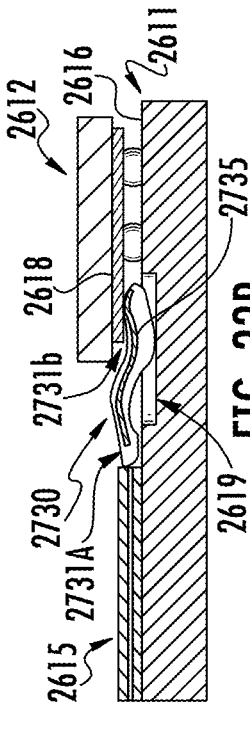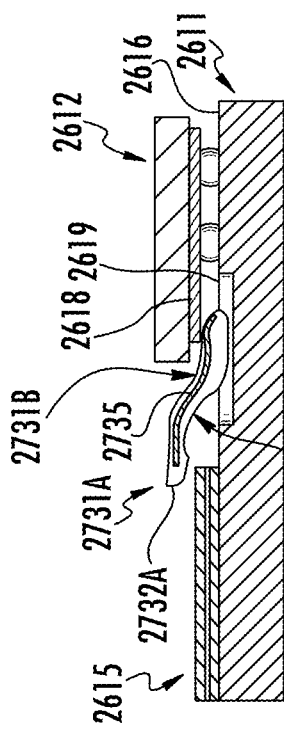
FIG. 33A  FIG. 33B  FIG. 33C

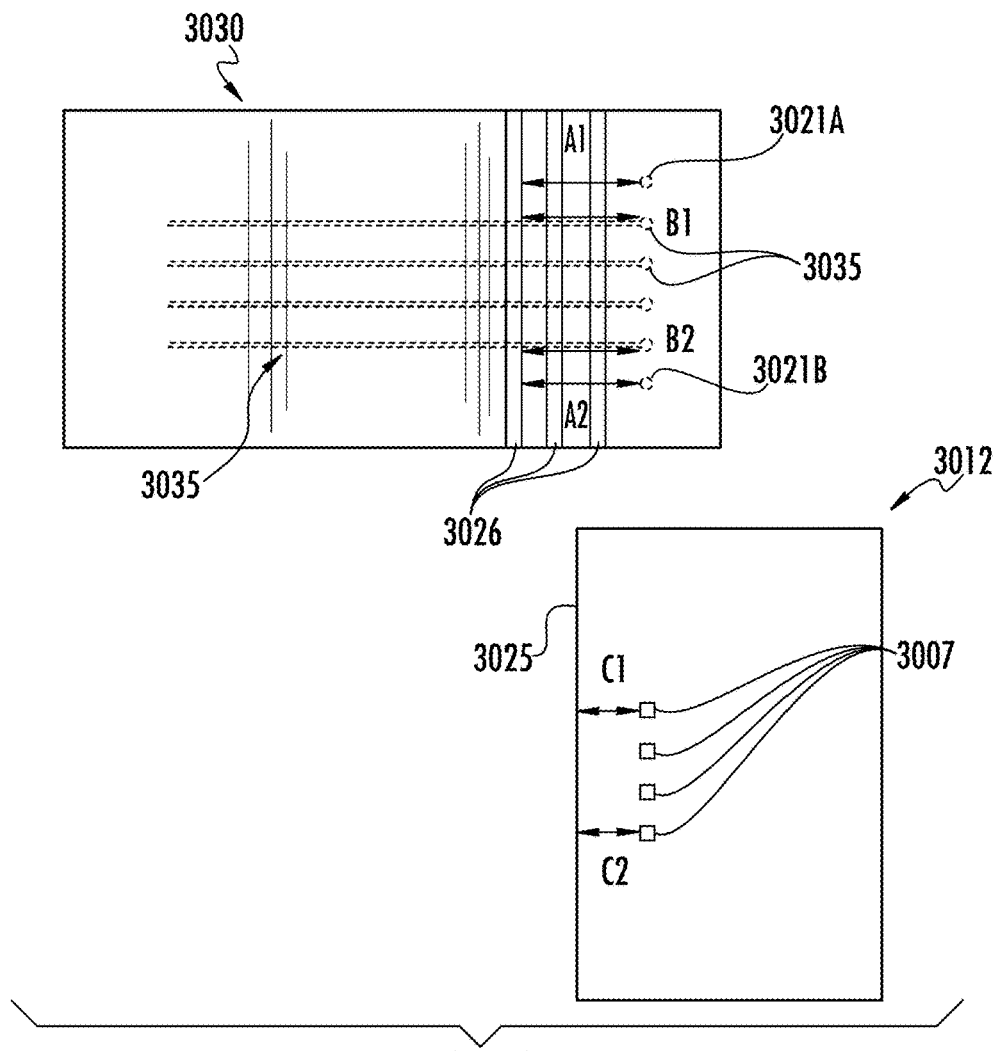
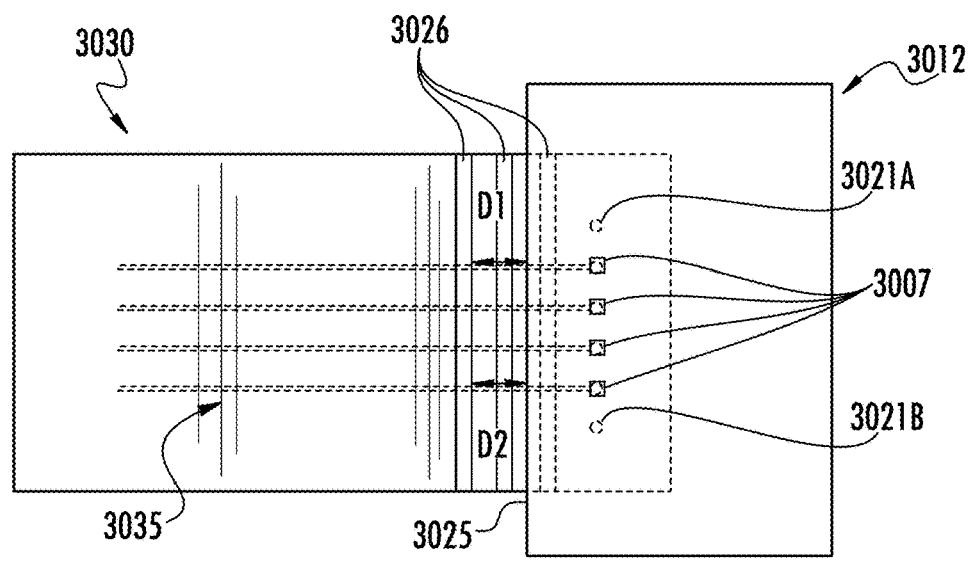
FIG. 38A
FIG. 38B

OPTICAL INTERCONNECTION ASSEMBLIES, GLASS INTERCONNECTION SUBSTRATES, AND METHODS OF MAKING AN OPTICAL CONNECTION

PRIORITY APPLICATION

This application claims the benefit of U.S. Provisional Application No. 62/464,001, filed on Feb. 27, 2017, the content of which is relied upon and incorporated herein by reference in its entirety.

BACKGROUND

The present disclosure generally relates to high-bandwidth optical communication and, more particularly, to optical interconnection assemblies, glass interconnection substrates, and methods for optically coupling optical components.

Benefits of optical fiber include extremely wide bandwidth and low noise operation. Because of these advantages, optical fiber is increasingly being used for a variety of applications, including, but not limited to, broadband voice, video, and data transmission. Connectors are often used in data center and telecommunication systems to provide service connections to rack-mounted equipment and to provide inter-rack connections. Accordingly, optical connectors are employed in both optical cable assemblies and electronic devices to provide an optical-to-optical connection wherein optical signals are passed between components.

As the bandwidth of optical transceiver devices increases by advanced techniques such as silicon-based laser systems and wavelength division multiplexing, large amounts of data must be electronically transferred from the active devices and associated electronics to electronic components of the computing device (e.g., a data switching device of a data center) for further processing (e.g., up to 100 Gbps per channel). Further, the size of optical transceiver devices (e.g., laser diodes, photodiodes) continues to decrease, which presents challenges in maintaining proper alignment between the transceiver device and the optical connector to which it is connected.

In silicon-based photonic devices, such as hybrid-silicon lasers and silicon optical modulators, optical signals are propagated through the device within optical waveguides. In some laser devices, the laser signals exit the device through a side facet such that the laser signal does not turn prior to being emitted. Currently, the alignment of the waveguides at the side facet to a mated optical connector requires an expensive and time consuming active alignment process (e.g., a vision-based active alignment process). Such active alignment processes add significant costs, and severely reduces throughput.

Accordingly, alternative optical interconnection devices including optical waveguides are desired.

SUMMARY

Embodiments of the present disclosure are directed to flexible glass interconnection substrates for optically coupling various optical components, such as optical waveguides of a circuit board and active optical components of an optical chip.

In this regard, in one embodiment, an optical interconnection assembly includes a glass interconnection substrate that includes a first end and a second end, a curved portion disposed between the first end and the second end, and an optical waveguide at least partially positioned within the curved portion.

In another embodiment, an optical interconnection assembly includes a base substrate, a substrate optical waveguide coupled to the base substrate, the substrate optical waveguide having an end surface, an optical chip comprising an optical coupling surface, and a glass interconnection substrate. The glass interconnection substrate includes a first end optically coupled to the end surface of the substrate optical waveguide, a second end optically coupled to the optical coupling surface of the optical chip, and a curved portion disposed between the first end and the second end. The glass interconnection substrate further includes an optical waveguide at least partially positioned within the curved portion.

In yet another embodiment, an optical interconnection assembly includes a glass interconnection substrate further including a first end and a second end, an optical waveguide disposed between the first end and the second end, and at least one slot disposed between the first end and the second end and adjacent the optical waveguide.

In yet another embodiment, a method of making an optical connection between a substrate optical waveguide having an end surface and a chip optical waveguide of an optical chip having an end surface, the chip optical waveguide terminating at the end surface of the chip, is disclosed. The method includes compressing a glass interconnection substrate such that a first end and a second end of the glass interconnection substrate are moved toward one another. The glass interconnection substrate includes a curved portion disposed between the first end and the second end, and an optical waveguide at least partially positioned within the curved portion. The method further includes positioning a first end surface of the first end of the glass interconnection substrate against the end surface of the optical waveguide and positioning a second end surface of the second end of the glass interconnection substrate against the end surface of the optical chip.

In yet another embodiment, a method of making an optical connection within an optical assembly includes positioning a first end of a glass interconnection substrate into a through-hole of a base substrate of the optical assembly, wherein the base substrate includes a first surface and a second surface. The optical assembly further includes a substrate optical waveguide proximate the first surface of the base substrate, and an optical chip coupled to the second surface of the base substrate. The optical chip includes an active optical component at a surface of the optical chip such that the active optical component faces the through-hole. The method further includes aligning an optical waveguide of the glass interconnection substrate to the active optical component, securing the first end of the glass interconnection substrate to the surface of the optical chip, and securing a second end of the glass interconnection substrate to an end surface of the substrate optical waveguide.

In yet another embodiment, a method of making an optical connection within an optical assembly includes positioning a glass interconnection substrate into a well within a surface of a base substrate of the optical assembly. The glass interconnection substrate includes a first end, a second end, and a curved portion between the first end and the second end. The curved portion has a first peak and a second peak. The second end of the glass interconnection substrate contacts a wall of the well. The optical assembly further includes a substrate optical waveguide coupled to the surface of the base substrate, and an optical chip coupled to the surface of the base substrate and partially covering the well. The optical chip has a chip optical waveguide positioned on a surface facing the well. The method further includes positioning the first end of the glass interconnection substrate against an end surface of the substrate optical waveguide by compressing the glass interconnection substrate, wherein compressing the glass interconnection substrate causes the second peak to contact the surface of the optical chip.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate embodiments, and together with the description serve to explain principles and operation of the various embodiments.

BRIEF DESCRIPTION OF THE DRAWINGS

FIGS. 33A-33C schematically depict side views of an example assembly process for inserting a glass interconnection substrate in a well of a base substrate and coupling the glass interconnection substrate to a substrate optical waveguide and an optical chip, according to one or more embodiments described and illustrated herein;

FIGS. 34A-34C schematically depicts side views of example glass interconnection substrates coupled to a bottom surface of an optical chip, according to one or more embodiments described and illustrated herein;

FIGS. 38A and 38B schematically depict an example method of coupling an example glass interconnection substrate to an example optical chip using a plurality of alignment ridges according to one or more embodiments described and illustrated herein.

DETAILED DESCRIPTION

Embodiments described herein are directed to optical interconnection assemblies including one or more flexible glass interconnection substrates for optically coupling at least two optical components, such as optical waveguides and optical chips. The glass interconnection substrates described herein provide low coupling loss, high optical interconnection density, high alignment tolerances, high reliability, and low costs.

More particularly, embodiments of the present disclosure are directed to various approaches for providing reliable low cost optical interconnections between optical waveguides mounted on or within a circuit board and active optical components (e.g., laser diodes, photo diodes, and the like) on optical chips. In one example, a glass interconnection substrate manufactured in a low-cost glass drawing process serves as a flexible interconnection substrate between the optical waveguides of a circuit board (or other base substrate) and an optical chip or other structure operable to send and/or receive optical signals of light.

Optical waveguides may be formed in the glass interconnection substrate using, for example, femtosecond pulse laser writing technology. Because optical circuit boards and optical chips (e.g., photonic integrated chips) are typically fabricated from materials with different coefficients of thermal expansion (CTE), the flexible interconnection approach improves reliability by decoupling mechanical strains that would otherwise be transferred to and through a more rigid optical connection.

Embodiments described herein are categorized into three different coupling scenarios based on the coupling method at the optical chip of the optical interface: 1) at the chip edge, via butt-coupling to chip waveguides routed parallel to the plane of the chip, 2) normal to the optical chip, with the optical path directed vertically to provide interconnections to laser sources (e.g., vertical cavity surface emission lasers (VCSELs)), planar photodetectors, or waveguide grating couplers, and 3) underneath and parallel to the optical chip via evanescent coupling (taper or directional coupler interconnections with chip waveguides).

Common to all variants is the use of high precision redrawn glass parts as the interconnection substrates in which waveguides are integrated before attachment to the circuit board and optical chip. The prepared interconnection substrates may not need active alignment to the circuit board and optical chip in most cases since a second step of laser writing waveguides after attachment provides low loss optical coupling.

Figure 1:
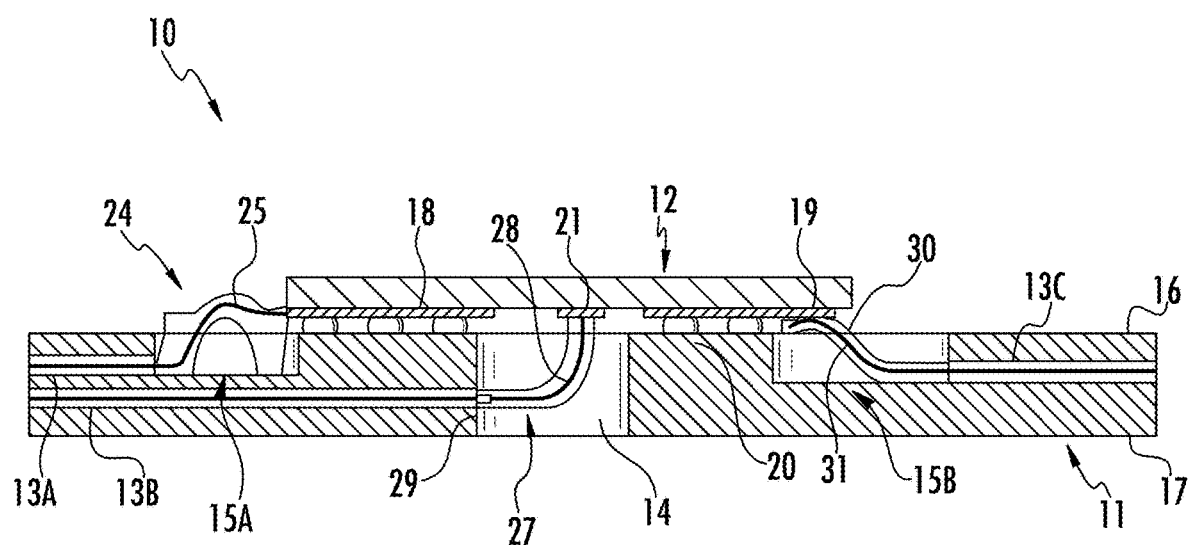
FIG. 1 schematically depicts an example optical interconnection assembly including three glass interconnection substrates according to one or more embodiments described and illustrated herein.

FIG. 1 schematically depicts a non-limiting example optical interconnection assembly 10 that illustrates all three attachment methods. The assembly 10 includes a base substrate 11 as an optical circuit board to which an optical chip 12 is coupled, such as by solder balls 20 or bumps on a first surface 16. The example optical chip 12 comprises one or more first chip optical waveguides 18, one or more active optical components 21 (e.g., laser devices, photodetectors, and the like), and one or more second chip optical waveguides 19. The base substrate 11 includes one or more first substrate optical waveguides 13A, one or more second substrate optical waveguides 13B, and one or more third substrate optical waveguides 13C. Although each of the first, second and third substrate optical waveguides 13A-13C are depicted as embedded within the base substrate 11, embodiments are not limited thereto. The substrate optical waveguides may be disposed on a surface of the base substrate 11, for example.

A first glass interconnection assembly 24 provides an example of the first coupling method, which is edgewise attachment at an edge of the optical chip 12. The example first glass interconnection assembly 24 is disposed within a first well 15A of the base substrate 11, and within a gap between the one or more first substrate optical waveguides 13A and an edge of the optical chip 12. The first glass interconnection assembly 24 includes one or more pre-written interconnection optical waveguides 25 operable to guide optical signals therein. After the first glass interconnection assembly 24 is attached to the one or more first substrate optical waveguides 13A, the base substrate 11, and the optical chip 12, laser written optical waveguides 26 are formed by a laser writing process to optically couple the one or more pre-written interconnection optical waveguides 25 to the one or more first substrate optical waveguides 13A and the one or more chip optical waveguides 18, as described in more detail below. As used herein, the term "optically coupled" means that optical signals are able to pass between two elements with low optical loss, such as between adjacent optical waveguides, for example.

A second glass interconnection assembly 27 provides an example of the second coupling method, which is beneath and normal to the optical chip 12. The second glass interconnection assembly 27 is at least partially disposed within a through-hole via 14 of the base substrate 11, and is bent from the one or more second substrate optical waveguides 13B toward one or more active optical components 21 disposed on the optical chip 12. One or more laser written optical waveguides 29 may be written to optically couple one or more interconnection optical waveguides 28 to the one or more second substrate optical waveguides 13B. The one or more interconnection optical waveguides 28 are further optically coupled to the one or more active optical components 21.

A third glass interconnection substrate 30 provides an example of the third coupling method, which is beneath and parallel to the optical chip 12. The third glass interconnection substrate 30 is disposed within a second well 15B of the third glass interconnection substrate 30. One or more interconnection optical waveguides 31 within the third glass interconnection substrate 30 have an optical coupling end with a structure that provides evanescent coupling with one or more second chip optical waveguides 19 in a direction parallel to the optical chip 12. One or more laser written optical waveguides 32 optically couple the one or more interconnection optical waveguides 31 to the one or more third substrate optical waveguides 13C.

The optical waveguides described herein may be fabricated by any known or yet-to-be-developed method. Short pulse duration (e.g., femtosecond pulse) laser written waveguides have been written in glasses over a range of processing conditions, such as, without limitation:

Laser wavelength: 790-1060 nm
Average laser power: 80-500 mW
Laser pulse width: 100-300 fs
Pulse repetition rate: 100-10000 MHz
Laser pulse energy: 2-4000 nJ/pulse
Waveguide writing speed: 0.1-35 mm/sec
Laser spot size: 0.5-3.2 µm While short pulse duration, laser written waveguides are described throughout the present disclosure, the approach may also be applied to components that utilize other types of waveguides located at or near the surface of a glass substrate, such as ion exchanged waveguides and lithographically patterned organic or inorganic dielectric waveguides, for example.

In general, the optical interconnection concepts presented in the present disclosure are applicable to any optical circuit board waveguide technology (e.g., planar optical waveguides, embedded planar optical waveguides, embedded optical fibers, and the like). The drawings of the present disclosure may display only one waveguide technology option, and in only one configuration (e.g., where waveguides are located at the surface of the optical PCB (printed circuit board) or embedded within the optical PCB). It should be understood that, in the embodiments described and illustrated herein, any optical waveguide technology and/or configuration may be utilized.

It is noted that practical laser writing of optical waveguides in glass substrates involves consideration of how the shape of the glass substrate may limit precise and consistent formation of optical waveguide structures. Laser beam clipping may present challenges. Raised features on glass substrates or adjacent optical chips can occlude focused laser beams, leading to aberrations that locally alter the shape of the focal spot of the laser beam. Glass substrate designs should consider focusing lens numerical aperture and working distance limitations to develop practical interconnection solutions. Designs that provide wide clearance for focused beams away from opaque or transparent obstacles should be considered.

Glass substrate surface damage is also a consideration. Laser written waveguides should be formed very close to the surface of glass substrates (e.g., <10 µm) in order to couple to neighboring waveguides with low loss. Because laser writing processes in glass involve focal spot heating to high temperatures, writing near surfaces can result in surface damage that scatters light and introduces optical losses. Therefore, there may be limits to writing waveguides extremely close to glass surfaces that must be overcome by design (e.g., expanded beam interconnections). As mentioned above, laser beam clipping near a substrate edge can also distort the beam focus spot and alter waveguide shape. Modification of the laser beam shape when writing near surfaces may be used to adaptively compensate for edge clipping affects.

Laser beam distortion by non-flat glass substrate surfaces is a further consideration. Many of the glass interconnection substrates of the present disclosure include surfaces that are curved to enable mechanical flexibility as well as optical waveguide confinement in tight bends. These curved surfaces can be expected to introduce aberrations in focused laser beams that distort the beam focus spot and alter waveguide shape. Adaptive optics may be employed to pre-compensate the focused beam to maintain consistent focus spot size. Index matching materials placed between the curved glass substrate surface and a flat cover glass can also be used to minimize beam distortion during laser writing.

Various embodiments of optical interconnection assemblies including glass interconnection substrates are described in detail below.

Figure 2:
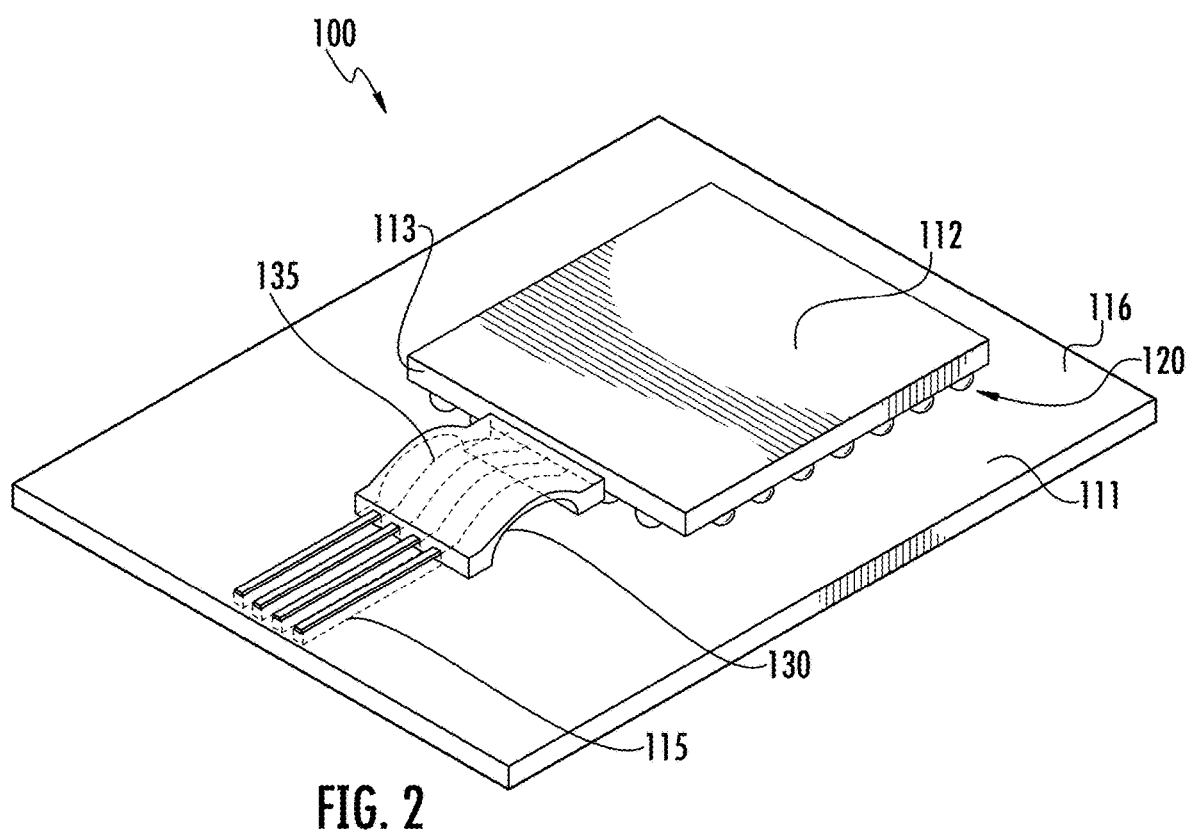
FIG. 2 schematically depicts an example optical interconnection assembly including a glass interconnection substrate coupled to an edge of an optical chip according to one or more embodiments described and illustrated herein.

Referring now to FIG. 2, an optical interconnection assembly 100 comprising a glass interconnection substrate 130 coupled to a plurality of substrate optical waveguides 115 and an end surface 113 of an optical chip 112 is schematically depicted. Thus, in this example, an optical interface is formed between an end surface of the glass interconnection substrate 130 and an end surface 113 of the optical chip. It should be understood that the glass interconnection substrate 130 may also be disposed between two optical chips, or between two sets of substrate optical waveguides 115.

In the illustrated embodiment, the plurality of substrate optical waveguides 115, the glass interconnection substrate 130 and the optical chip 112 are disposed on a surface 116 of a base substrate 111, such as a circuit board substrate. The optical chip 112 may be any optical component that is operable to transmit and/or receive optical signals of light. The optical chips 112 described herein may be configured as silicon-based photonic devices, such as hybrid-silicon lasers and silicon optical modulators. In the optical chip 112 illustrated in FIG. 2, the optical signals enter and/or exit the optical chip 112 via optical waveguides through an end surface 113 (i.e., a side facet) such that the optical signals do not turn out of the plane of the chip prior to being emitted. In the illustrated embodiment, optical chip 112 is electrically and mechanically coupled to the surface 116 of the base substrate 111 by electrical contacts 120, which may be configured as solder balls of a ball grid array, for example.

In embodiments, the glass interconnection substrate 130 is fabricated by redrawing a larger glass preform. As an example and not a limitation, a glass preform may be shaped with glass grinding processes that provide surfaces that are accurate to less than about 25 µm. In some embodiments, the preform may also include an array of holes formed on a precise pitch that accept core blanks to form optical waveguide arrays. During the redraw process, the preform surfaces scale precisely, allowing the resulting glass interconnection substrate 130 to provide certain surfaces that are accurate to, without limitation, less than 1 µm, and less than 1 µm, or less than 0.5 µm. In some embodiments, only those surfaces of interconnection substrate 130 that are in contact with surfaces of other components have dimensions that are tightly controlled.

Figure 3:
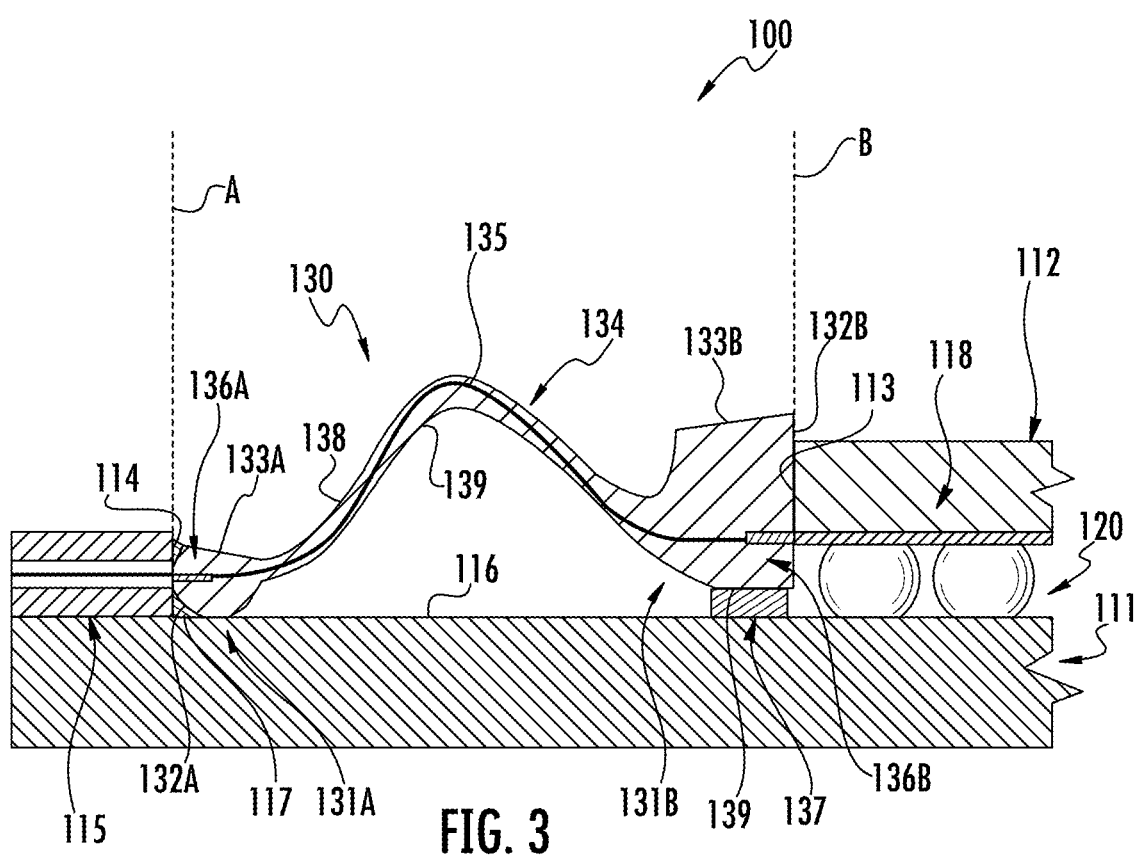
FIG. 3 schematically depicts a side view of an example optical interconnection assembly including a glass interconnection substrate coupled to an edge of an optical chip according to one or more embodiments described and illustrated herein.

In other embodiments, the glass interconnection substrate 130 is fabricated from one or more precision-thickness thin glass sheets. For example, the glass interconnection substrate 130 can be made sufficiently thin (e.g., 50-100 um thick) so that its flexibility allows it to accommodate motion and stresses associated with a coefficient of thermal expansion (CTE) mismatch between the optical chip 112 and the one or more substrate optical waveguides 115. The glass interconnection substrate 130 may have any thickness, such as, without limitation, a thickness in a range of about 50 μm and about 200 μm Referring now to FIG. 3, a partial side view of the example optical interconnection assembly 100 illustrated in FIG. 2 is schematically depicted. The optical chip 112 includes one or more chip optical waveguides 118 that terminate at the end surface 113 of the optical chip 112. The one or more chip optical waveguides 118 are operable to propagate and guide optical signals within the optical chip 112. As shown in FIG. 3, the one or more chip optical waveguides 118 are positioned at a lower surface of the optical chip 112. However, embodiments are not limited thereto. The one or more chip optical waveguides 118 may be disposed within a bulk of the optical chip 112 or on a top surface of the optical chip 112. The one or more chip optical waveguides 118 may be fabricated from any known or yet-to-be-developed process to modify the index of refraction within the desired one or more chip optical waveguides 118. Example processes include, but are not limited to, ion-exchange processes and laser writing processes. Other optical waveguides may be utilized, such as, without limitation, planar glass dielectric waveguides, embedded optical fiber waveguides, and polymer waveguides.

The one or more substrate optical waveguides 115 may have any configuration. The one or more substrate optical waveguides 115 may be any waveguides capable of guiding optical signals. In the embodiment depicted in FIG. 3, the one or more substrate optical waveguides 115 are embedded circuit board waveguides. For example, the one or more substrate optical waveguides 115 are embedded within the base substrate 111. The base substrate 111 is severed or otherwise cut to expose an end surface 114 of the one or more substrate optical waveguides 115. The one or more substrate optical waveguides 115 may also be configured as discrete waveguides that are disposed on the surface 116 of the base substrate 111, for example. One or more additional layers may also be disposed on the one or more substrate optical waveguides 115 in embodiments.

As shown in FIGS. 2 and 3, the glass interconnection substrate 130 is disposed between the one or more substrate optical waveguides 115 and the optical chip 112. The glass interconnection substrate 130 includes a curved portion 134 that provides the glass interconnection substrate 130 with flexibility such that first end 131A and second end 131B may be moved closer to one another (i.e., the glass interconnection substrate 130 may be compressed). As shown in FIG. 3, a thickness of the glass interconnection substrate 130 at a point along a length of the glass interconnection substrate 130 is less than a thickness of the glass interconnection substrate 130 at the first end 131A or the second end 131B, which may increase the flexibility of the glass interconnection substrate 130.

The flexibility of the glass interconnection substrate 130 allows the glass interconnection substrate 130 to be positioned between two components that are located at different distances from one another. For example, in a first product, the optical chip 112 may be located at a first distance away from the one or more substrate optical waveguides 115. In a second product, the optical chip 112 may be located at a different, second distance away from the one or more substrate optical waveguides 115. Due to the flexibility of the glass interconnection substrate 130, the same glass interconnection substrate 130 may be included in both the first product and the second product, thereby saving on manufacturing and inventory costs.

The curved portion 134 providing the flexibility of the glass interconnection substrate 130 also provides a spring force on the end surface 114 of the one or more substrate optical waveguides 115 and the end surface 113 of the optical chip 112, which may make it easier to mechanically couple and align the glass interconnection substrate 130 to the one or more substrate optical waveguides 115 and the optical chip 112. As an example and not a limitation, the spring force may temporarily attach the glass interconnection substrate 130 to the one or more substrate optical waveguides 115 and the optical chip such that the position of the glass interconnection substrate 130 to align the interconnection optical waveguides 135 of the glass interconnection substrate 130 to the substrate optical waveguides 115 and the chip optical waveguides 118.

Further, the curved portion 134 providing the flexibility of the glass interconnection substrate 130 also compensates for CTE mismatch between the one or more substrate optical waveguides 115 and the optical chip 112. When thermal expansion occurs between either component, such as due to heat generated by the optical chip 112, the glass interconnection substrate 130 may flex or otherwise move to compensate for the thermal expansion.

As stated above, the glass interconnection substrate 130 is designed to be flexible so that it can deform to fit into a variable width gap between the substrate optical waveguides 115 and the optical chip 112. Since a drawn glass interconnection substrate can be fabricated in the approximate shape of the bend, it can be made thicker than a comparable flat sheet component that must be bent to accommodate variable width gaps. This may make the resulting part more mechanically robust in handling and use.

The interconnection optical waveguides 135 within the glass interconnection substrate 130 may also be used to provide optical waveguide pitch conversion between chip optical waveguides 118 and the substrate optical waveguides 115 of the base substrate 111 (e.g., cases where the substrate optical waveguides 115 are spaced at a first pitch and the chip optical waveguides 118 are spaced at a second pitch). The interconnection optical waveguides 135 may also be used to perform one dimensional to two dimensional optical waveguide array conversion.

The ends of the glass interconnection substrate 130 may take on any form. In the illustrated embodiment, a first end surface 132A of the first end 131A (i.e., the tip) is curved providing a cylindrical end, while a second end surface 132B of the second end 131B is flat. It should be understood that both end surfaces may be curved, or both end surfaces may be flat. Other configurations are also possible, some of which are discussed below. In the illustrated embodiment, the first end 131A defines a first plane A and the second end 131B defines a second plane B that is parallel to the first plane A. In other embodiments, the glass interconnection substrate 130 comprises a turn such that the second plane B is not parallel to the first plane A.

The shape of the curved first end surface 132A allows the glass interconnection substrate 130 to make firm contact with the end surface 114 of the one or more substrate optical waveguides 115 even in cases where the glass interconnection substrate 130 is compressed to fit into a small gap between the one or more substrate optical waveguides 115 and the optical chip 112. Further, the cylindrical end may provide additional space for a UV curable adhesive 117 (e.g., MasterBond UV25 adhesive) to secure the first end surface 132A to the end surface 114 of the one or more substrate optical waveguides 115.

The second end 131B of the glass interconnection substrate 130 has three flat surfaces, including the flat second end surface 132B that contacts the end surface 113 of the optical chip 112. The second end surface 132B may be mechanically coupled to the end surface 113 of the optical chip 112 by a UV curable adhesive, for example. A bottom flat surface 139 may be supported by a spacer 137 disposed on the surface 116 of the base substrate 111. In other embodiments, the bottom flat surface 139 is supported directly by the surface 116 of the base substrate 111 and not a spacer.

One or more optical waveguides 135 (i.e., interconnection optical waveguides 135) within the glass interconnection substrate 130 optically couple the one or more substrate optical waveguides 115 of the base substrate 111 to the one or more chip optical waveguides 118 of the optical chip 112. The interconnection optical waveguides 135 may be fabricated by any known or yet-to-be-developed process, such an ion-exchange and laser writing (e.g., using a femtosecond pulsed laser), for example. Other optical waveguides may also be utilized, such as, without limitation, deposited planar waveguides, ion exchange waveguides, and embedded optical fibers.

In embodiments, a depth of the one or more interconnection optical waveguides 135 may vary with respect to an upper surface 138 and a lower 139 along a length of the glass interconnection substrate 130. As a non-limiting example, a depth of the interconnection optical waveguide 135 is such that the interconnection optical waveguide 135 is closer to a convex surface of the glass interconnection substrate 130 than a corresponding concave surface of the glass interconnection substrate 130. This may assist in improving confinement of the optical signals within one or more interconnection optical waveguides 135 having weakly guiding cores. In embodiments, at least a portion of the glass interconnection substrate 130 is coated with a layer having an index of refraction between an index of refraction of air and an index of refraction of the glass interconnection substrate to improve bend reliability and control of optical confinement.

The entirety of the interconnection optical waveguides 135 may be preexisting prior to attachment of the glass interconnection substrate 130 to the end surface 114 of the substrate optical waveguides 115 and the end surface 113 of the optical chip 112. As used herein, the terms "preexisting optical waveguides" or "pre-written optical waveguides" mean optical waveguides that are previously applied to the glass interconnection substrate 130 prior to the attachment of the glass interconnection substrate 130 to the one or more substrate optical waveguides 115 and the optical chip 112. An alignment process, such as a vision alignment process, may be utilized to align the ends of the interconnection optical waveguides 135 to the ends of the substrate optical waveguides 115 and the chip optical waveguides 118.

Alternatively, ends of the one or more preexisting interconnection optical waveguides 135 may be offset from one or more of the first end surface 132A and the second end surface 132B. Thus, the preexisting interconnection optical waveguides 135 do not reach the first end surface 132A and/or the second end surface 132B after the glass interconnection substrate is disposed between the substrate optical waveguides 115 and the optical chip 112.

Laser written portions may be written using a laser writing process (e.g., by using a femtosecond laser) to optically couple the preexisting interconnection optical waveguides 135 to the substrate optical waveguides 115 and/or the chip optical waveguides 118 after the glass interconnection substrate 130 is in place. In this manner, the laser written portions complete the preexisting interconnection optical waveguides 135. Example methods of forming laser written waveguides are described in U.S. Pat. App. Ser. No. 62/320,024 filed on Apr. 8, 2016 and 62/328,326 filed on Jul. 29, 2016, which are hereby incorporated by reference in their entirety.

Referring to FIG. 3, a laser beam is used to form one or more first laser written optical waveguides 136A to optically couple an end of the one or more preexisting interconnection optical waveguides 135 to the one or more optical waveguides on the base substrate 111. A laser beam is also used to form one or more second laser written portions 136B to optically couple an end of the one or more preexisting interconnection optical waveguides 135 to the one or more chip optical waveguides 118.

In the example glass interconnection substrate 130 depicted in FIG. 3, the first end 131A and the second end 131B of the glass interconnection substrate 130 includes a first planar surface 133A and a second planar surface 133B, respectively. The first planar surface 133A and the second planar surface 133B provide a flat, planar surface for the laser beam to enter the glass material of the glass interconnection substrate 130 to form the first laser written optical waveguide 136A and the second laser written optical waveguide 136B. A curved surface may redirect the laser beam within the glass interconnection substrate 130 and prevent accurate placement of the first laser written optical waveguide 136A and the second laser written optical waveguide 136B.

Figure 4:
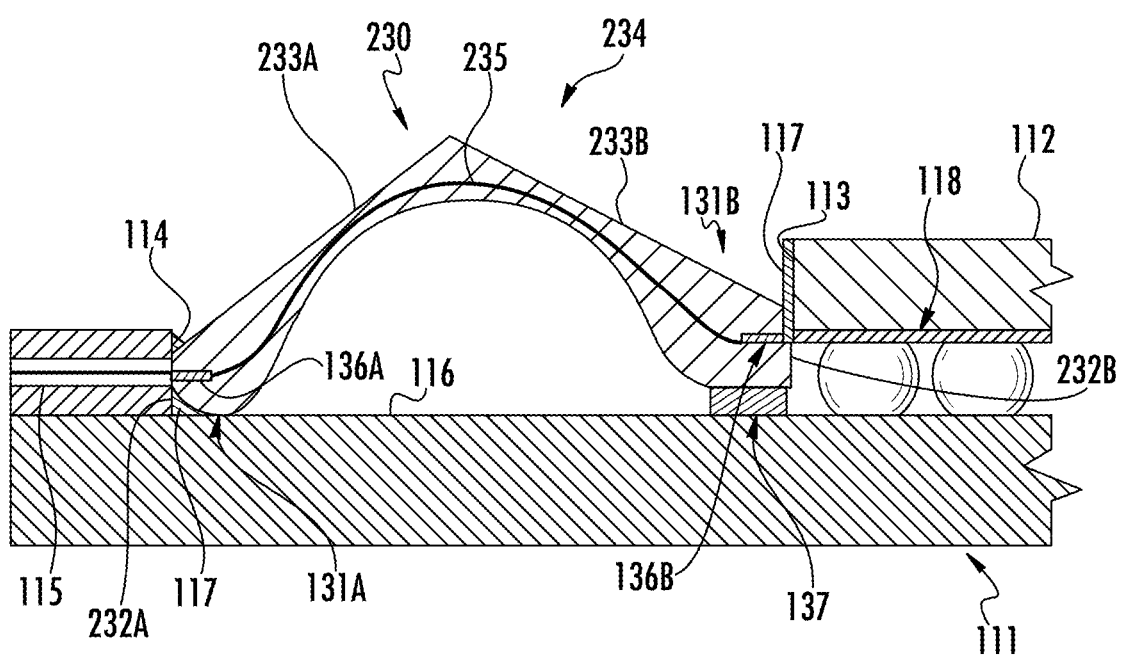
FIG. 4 schematically depicts a side view of an example optical interconnection assembly including a glass interconnection substrate having planar surfaces coupled to an edge of an optical chip according to one or more embodiments described and illustrated herein.

Referring now to FIG. 4, another example glass interconnection substrate 230 is schematically illustrated. The glass interconnection substrate 230 has a first planar surface 233A and a second planar surface 233B. The first and second planar surfaces 233A, 233B form the top side of the interconnection substrate. The first and second planar surface 233A, 233B provide a flat surface for writing first and second laser written optical waveguides 136A, 136B, respectively. One or more bent interconnection optical waveguides 235 are positioned within the curved portion 234 of the glass interconnection substrate 230.

Figure 5:
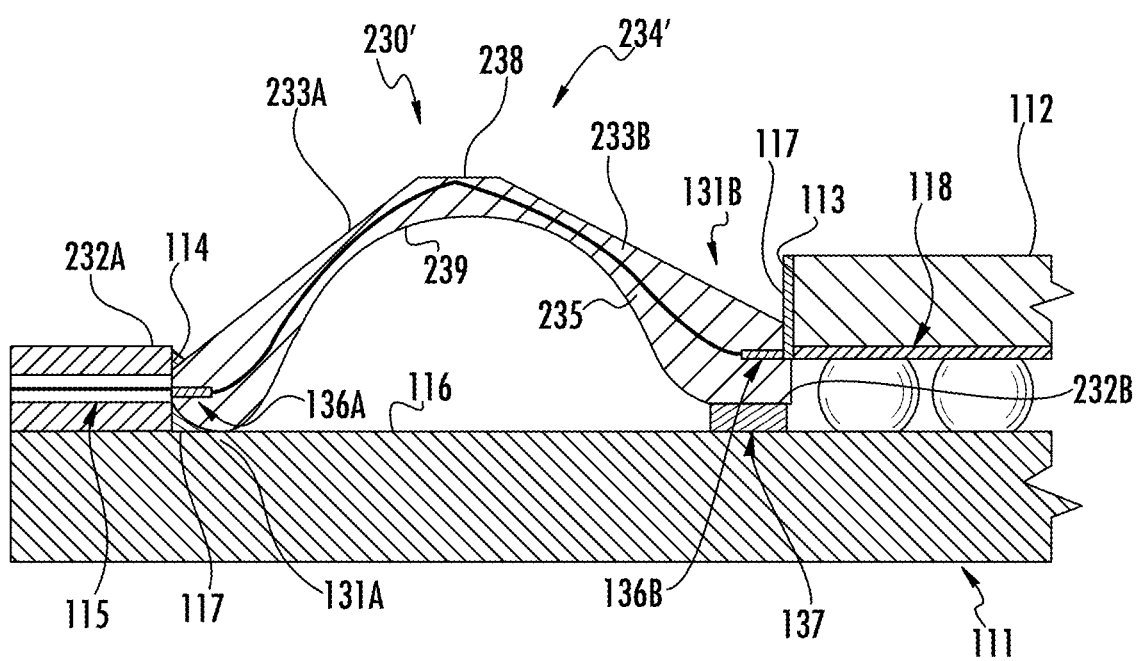
FIG. 5 schematically depicts a side view of an example optical interconnection assembly including a glass interconnection substrate having a total internal reflection surface, the glass interconnection substrate being coupled to an edge of an optical chip according to one or more embodiments described and illustrated herein.

Referring to FIG. 5, another example glass interconnection substrate 230' similar to the embodiment depicted in FIG. 4 is schematically illustrated. A flat surface is provided at the peak of the curved portion 234' to provide a total internal reflection surface 238 between the first planar surface 233A and the second planar surface 233B. The one or more interconnection optical waveguides 235 meet at the total internal reflection surface 238 at an angle, so that optical signals are reflected off of the total internal reflection surface 238 and into the portion of the interconnection optical waveguides 235 in the second leg defined in part by the second planar surface 233B. In some embodiments, the total internal reflection surface 238 may also be coated with a single or multilayer metal or dielectric high reflectivity coating to enhance reflectivity.

Referring once again to FIG. 3, the glass interconnection substrate 130 may be attached to the optical chip 112 before or after the optical chip 112 is permanently attached to the base substrate 111. In either case, a small amount of UV curable adhesive may be attached to locations on the glass interconnection substrate 130 where it will eventually make contact with other components. If the glass interconnection substrate 130 is attached to the optical chip 112 after the optical chip 122 is attached to the base substrate 111, the glass interconnection substrate 130 is partially compressed prior to insertion into the gap between the end surface 114 of the substrate optical waveguides 115 and the end surface 113 of the optical chip 112. A pick and place machine and vision system can maintain this compression while coarsely aligning (e.g., to within 25-50 µm) the ends 131A, 131B of the glass interconnection substrate 130 to the end surface 114 of the one or more substrate optical waveguides 115 and the ends of the one or more chip optical waveguides. After the glass interconnection substrate 130 is inserted into the gap, the compression force is released and the glass interconnection substrate 130 expands so that it makes contact with both the end surface 114 of the one or more substrate optical waveguides 115 and the end surface 113 of the optical chip 112.

If the glass interconnection substrate 130 is joined to the optical chip 112 before the optical chip 112 is attached to the base substrate 111, the joining adhesive should be able to survive the solder reflow process (e.g., a MasterBond UV25 adhesive). A pick and place machine may hold the optical chip and glass interconnection substrate assembly and coarsely align it to the ends of the one or more substrate optical waveguides. It may be desirable to attach glass interconnection substrates 130 on opposing faces of the optical chip 112 so that when the glass interconnection substrates 130 on opposite sides are compressed, the optical chip 112 self-centers to between the glass interconnection substrates 130.

After the glass interconnection substrate 130 is inserted, the UV curable adhesive is exposed to UV radiation and then thermally cured.

Figure 6:
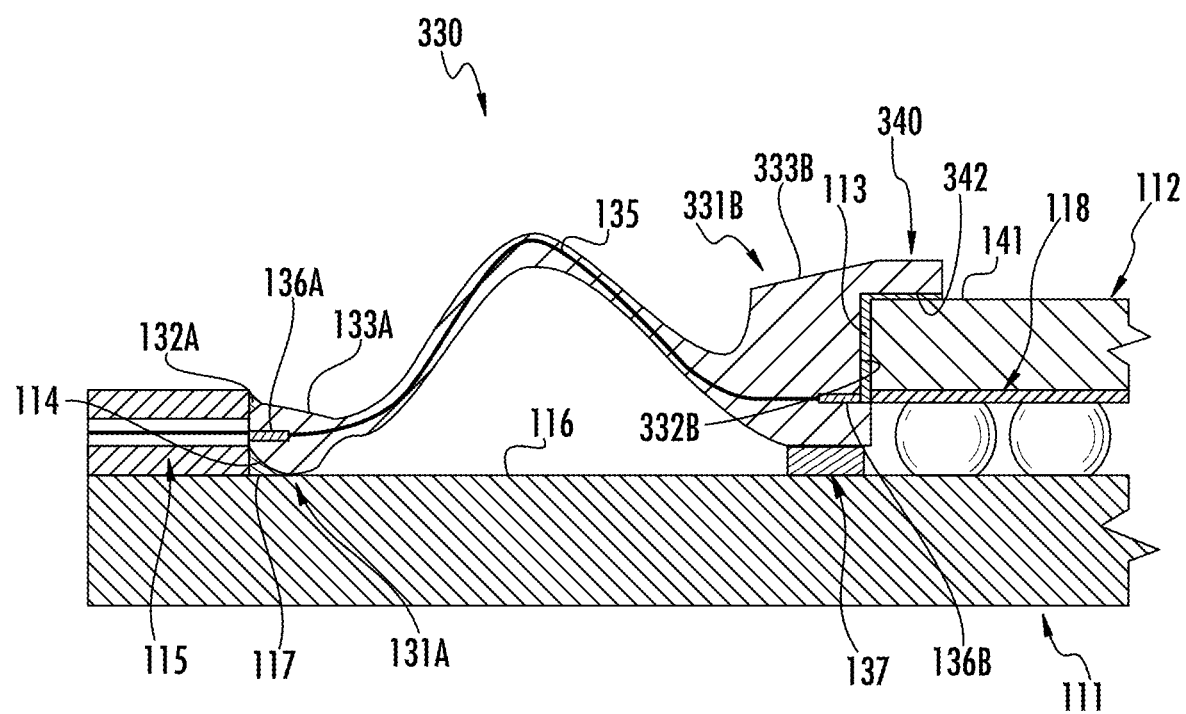
FIG. 6 schematically depicts a side view of an example optical interconnection assembly including a glass interconnection substrate having an overhang portion coupled to an edge of an optical chip according to one or more embodiments described and illustrated herein.

In either assembly process described above, coarse alignment of the glass interconnection substrate 130 to the optical chip 112 may be simplified by including an overhang portion 340 in the example glass interconnection substrate 330 as shown in FIG. 6. The second end 331B of the glass interconnection substrate 330 has a stepped shape having an overhang portion 340 with an underside surface 342 that contacts an upper surface 141 of the optical chip 112. The end surface 332B of the second end 331B contacts the end surface 113 of the optical chip 112. The second end 331B further includes a second planar surfaced 333B for laser writing the second laser written optical waveguide 136B. A layer of UV curable adhesive may be disposed between the overhang portion 340 and the upper surface 141 of the optical chip 112 and the end surface 332B of the second end 331B and the end surface 113 of the optical chip 112. The overhang portion 340 may include fiducial marks or mechanical alignment features that help to ensure that the glass interconnection substrate 330 is correctly positioned with respect to the optical chip 112. The overhang portion 340 may also serve as an alignment depth stop so that any interconnection optical waveguides 135 are coarsely aligned in the vertical direction with the chip optical waveguides 118. The overhang portion 340 may be used to increase the adhesive bond surface area between the glass interconnection substrate 330 and the optical chip 112, providing a more mechanically robust joint that increases product reliability.

Mechanical retention features may be used to help retain the glass interconnection substrate in place in the gap between the substrate optical waveguides ends and the optical chip end. These integrated mechanical retention features may reduce the need for additional fixturing to hold the glass interconnection substrate during insertion and adhesive curing.

Figure 7A:
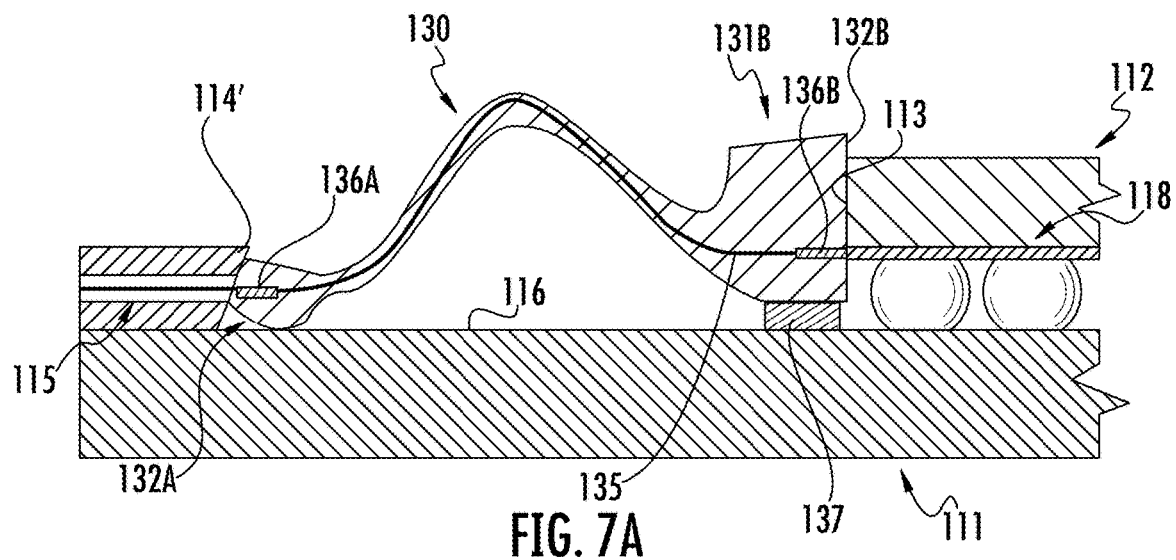
FIG. 7A schematically depicts a side view of an example optical interconnection assembly including a glass interconnection substrate coupled to an edge of an optical chip according to one or more embodiments described and illustrated herein.

Referring to FIG. 7A, the end surface 114' of the one or more substrate optical waveguides 115 is angled such that it is non-orthogonal to the surface 116 of the base substrate 111. The end of the glass interconnection substrate 130 that attaches to the one or more substrate optical waveguides 115 can be retained in place by the angled end surface 114'. The spring force provided by the slightly compressed glass interconnection substrate 130 on insertion into the gap between the substrate optical waveguides 115 and the optical chip.

Figure 7B:
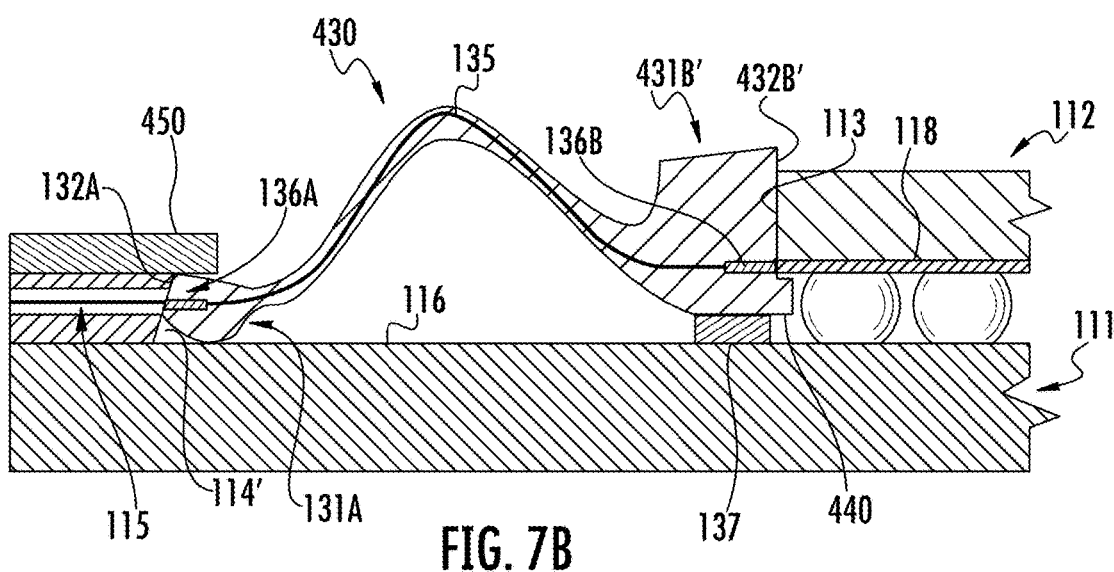
FIG. 7B schematically depicts a side view of an example optical interconnection assembly including a glass interconnection substrate having a tab portion coupled to an edge of an optical chip according to one or more embodiments described and illustrated herein.

FIG. 7B illustrates additional mechanical retention features that may be employed. The example glass interconnection substrate 430 includes a second end 431B' having a tab portion 440 configured to be disposed at a lower surface of the optical chip 112. While typical distances between flip-chip mounted chips and printed circuit boards are generally small (e.g., 50-75 µm after solder ball/bump reflow), precision features on this scale may be fabricated in drawn glass parts. The under chip tab portion 440 may also be designed to engage notches, bosses, or other alignment features formed on the lower surface of the optical chip 112. In embodiments, the tip of the second end 431B' may have a notch defined by an upper and/or lower tab portion.

In the example illustrated in FIG. 7B, one or more overhang portions 450 are positioned above the one or more substrate optical waveguides 115 such that at least a portion of the one or more overhang portions extends beyond the end surface 114 of the one or more substrate optical waveguides 115. At least a portion of the one or more overhang portions 450 is disposed over the first end 131A of the glass interconnection substrate 430. Thus, the one or more overhang portions assist in retaining the glass interconnection substrate 430. The one or more overhang portions 450 may be defined by the base substrate in embodiments that the substrate optical waveguides 115 are embedded in the base substrate 111, or the one or more overhang portions 450 may be defined by one or more additional layers disposed on the substrate optical waveguides 115.

Mechanical retention features such as under-chip tab portions and overhang portions can both be added to the glass interconnection substrate. By gripping the optical chip simultaneously from above and below, the glass interconnection substrate can be made to clip over the optical chip, possibly snapping into position as the under-chip tab portions and/or the overhang portions engage notches, bosses, or other alignment features on the optical chip.

An angled end surface 114 of the substrate optical waveguide 115 as shown in FIG. 7A or the overhang portion 450 depicted in FIG. 7B may at least partially obscure the end of the glass interconnection substrate 130, preventing optical metrology of internal and external waveguide end locations, as well as laser writing of new laser written interconnection optical waveguides. To avoid this obstruction, a notch may be formed in the angled end surface or overhanging portion to provide full top side view access to the interconnection optical waveguides 135 of the first or second end of the glass interconnection substrate end region.

Figure 7C:
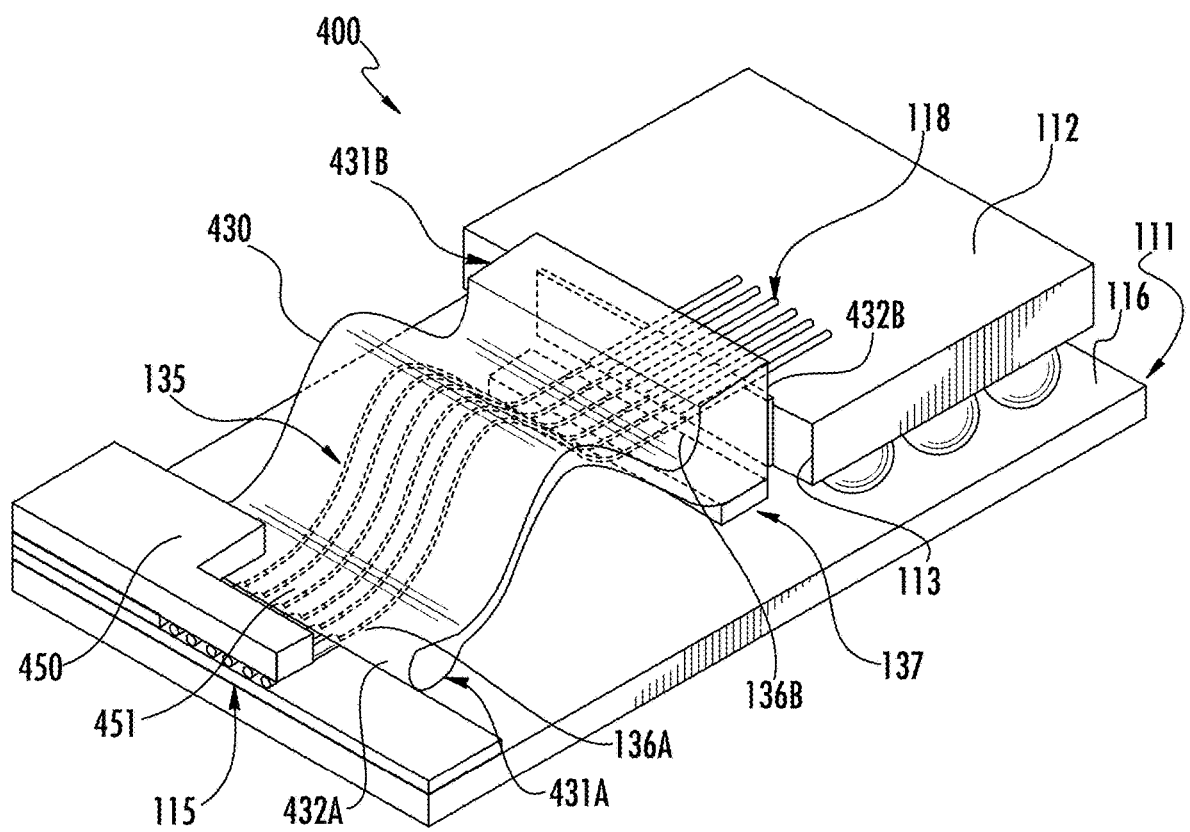
FIG. 7C schematically depicts a perspective view of an example optical interconnection assembly including a glass interconnection substrate coupled to an edge of an optical chip, and a base substrate having an overhang portion according to one or more embodiments described and illustrated herein.

FIG. 7C is a partial cutaway view of an optical interconnection assembly 400 wherein an overhang portion 450 includes a notch 451. It is noted that the only one overhang portion 450 is shown in FIG. 7C because a portion of the base substrate 111 is illustrated as being cut away. Thus, the notch 451 may be positioned between two overhang portions 450. The notch 451 provides visibility and access to the ends of the interconnection optical waveguides 135 for alignment purposes and/or laser writing processes.

It is noted that the glass interconnection substrate 430 may have a width that is wider than the width of the notch 451 so that side portions of the glass interconnection substrate 430 that are located away from the notch 451 help to retain the glass interconnection substrate 430 in place during insertion and adhesive curing processes.

Figure 8A:
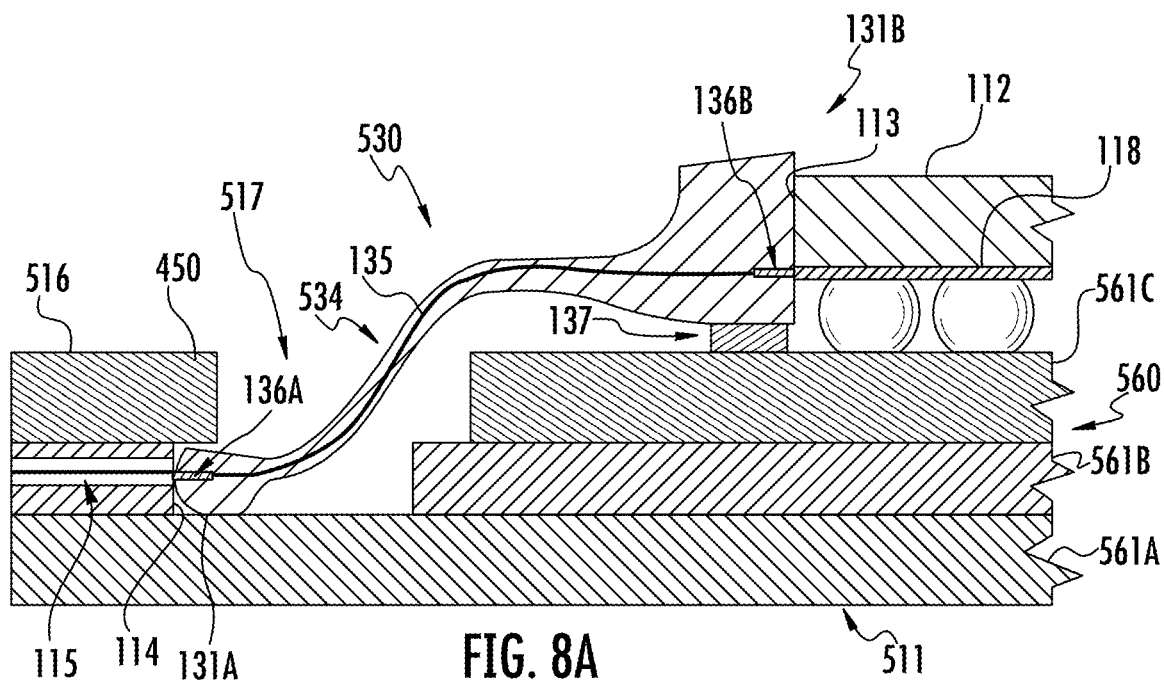
FIG. 8A schematically depicts a side view of an example optical interconnection assembly including a glass interconnection substrate coupled to an edge of an optical chip, wherein the glass interconnection substrate is disposed in a cutout of the base substrate, according to one or more embodiments described and illustrated herein.

Referring now to FIG. 8A, in embodiments where embedded substrate optical waveguides 115 are employed, the profile of the glass interconnection substrate 530 may be modified so that the bent portion 534 extends down below a surface 516 of the overhang portion 450 (which may be a layer of the base substrate 511 or another individual layer) to meet an end of an embedded substrate optical waveguide 115. Thus, in the example depicted in FIG. 8A, the first end 131A is disposed within a cutout 517 within the base substrate 511. The base substrate 511 may include multiple layers, such as, without limitation, first layer 561A, second layer 561B and third layer 561C. In the illustrated embodiment, the cutout 517 in which the first end 131A of the glass interconnection substrate 530 is positioned is formed by removal of the second layer 561B and the third layer 561C. The first end 131A is positioned on a surface of the first layer 561A while the second end 131B is positioned on a surface of the third layer 451C. In some embodiments, the second end 131B may be positioned on a spacer 137 that is disposed on the surface of the third layer 451C. It should be understood that in other embodiments, the spacer 137 is not included.

Because the glass interconnection substrate should be angled as it is positioned down into the cutout, additional gripping features may be added to the glass interconnection substrate in some embodiments. Ridges, raised bosses, and/or groove features may be integrated into the middle of the glass interconnection substrate, or toward the end of the glass interconnection substrate that is at the optical chip.

Figure 8B:
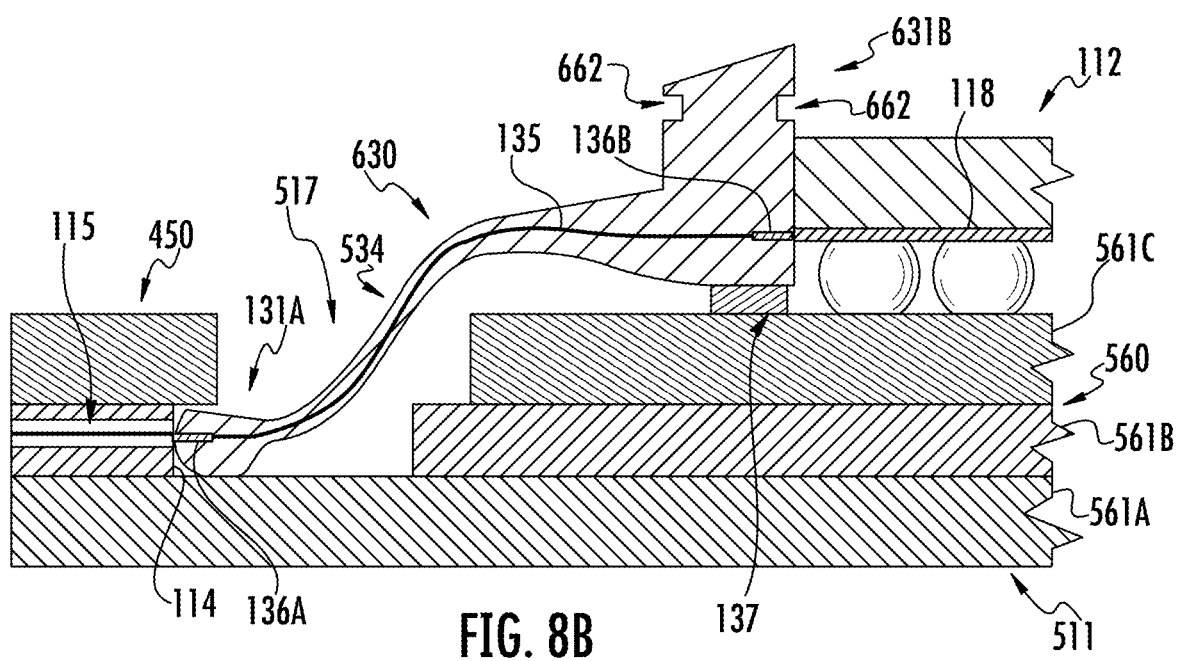
FIG. 8B schematically depicts a side view of an example optical interconnection assembly including a glass interconnection substrate coupled to an edge of an optical chip, wherein the glass interconnection substrate is disposed in a cutout of the base substrate and includes gripping features, according to one or more embodiments described and illustrated herein.

FIG. 8B illustrates a glass interconnection substrate 630 having a first end 131A disposed within the cutout 517, and a second end 631B at optical chip 112 having groove features 662 to assist in gripping the glass interconnection substrate 630 during insertion and coarse alignment. For example a gripping actuator may utilize the groove features 662 in gripping the glass interconnection substrate 630.

Further, because the gripping features (e.g., groove features 662 illustrated in FIG. 8B) are positioned on the glass interconnection substrate at a known location (based on the precision of the glass drawing process) the distance between the gripping feature(s) and the end of the glass interconnection substrate that interfaces with the ends of the substrate optical waveguides is precisely known. This allows the gripping actuator system to accurately know where the end of the glass interconnection substrate is located during the insertion process.

Figure 9A:
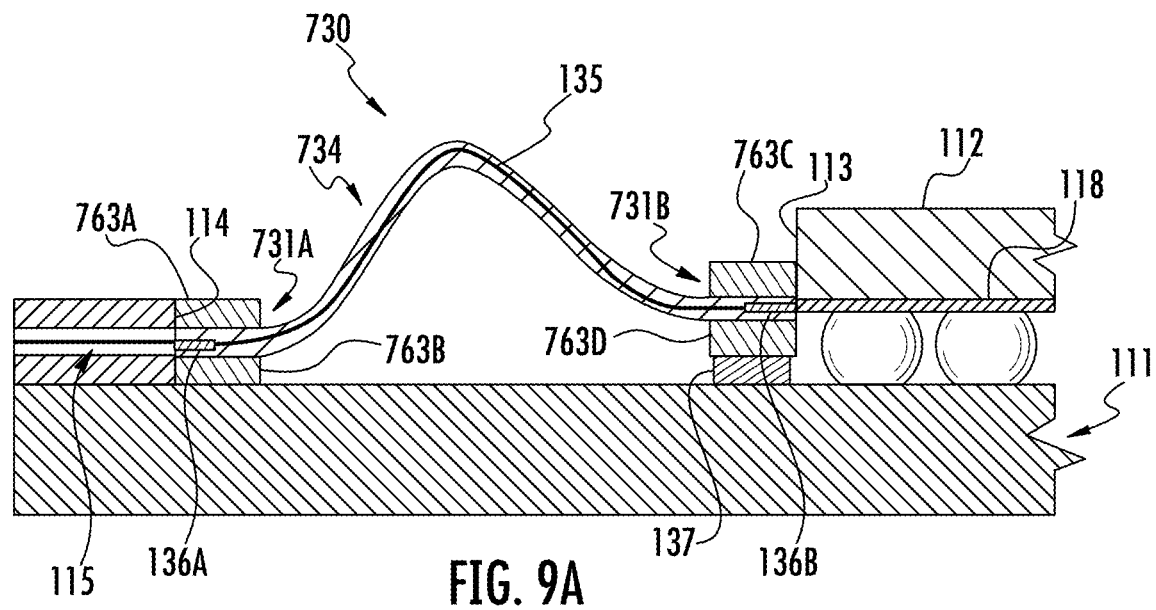
FIGS. 9A and 9B schematically depict a side view of an example optical interconnection assembly including a glass interconnection substrate coupled supporting glass sheets and to an edge of an optical chip, according to one or more embodiments described and illustrated herein.

Depending on the complexity of the shape of the glass interconnection substrate, the glass interconnection substrate may be fabricated by stacking glass strip components. Referring to FIG. 9A, the glass interconnection substrate 730 may be fabricated by adhering glass blocks 763A-763D adhered to ends of a flat glass sheet 734. In the illustrated embodiment, the first end 731A of the glass sheet 734 may be disposed between a first glass block 763A and a second glass block 763B. The first glass block 763A and the second glass block 763B may be adhered to the first end of the 731A of the glass sheet 734. The second end 731B of the glass sheet 734 may be disposed between a third glass block 763C and a fourth glass block 763D. The third glass block 763C and the fourth glass block 763D may be adhered to the second end 731B of the glass sheet 734. In some embodiments the glass blocks 763A-763D are configured as strips that are long in length to create a profiled rod after being joined to the glass sheet 734. The profiled rod may then be sawed into individual glass interconnection substrates 730. It should be understood that any number of glass strips or glass blocks may be utilized.

Fiber array alignment could be provided by incorporating glass or silicon V-groove blocks into the glass interconnection substrate. Alternatively fiber arrays could be stacked together during assembly, where the precision diameter control on drawn optical fibers enables control of optical fiber array core position (measured in in-plane and out-of-plane directions) to within 0.5 um.

Figure 9B:
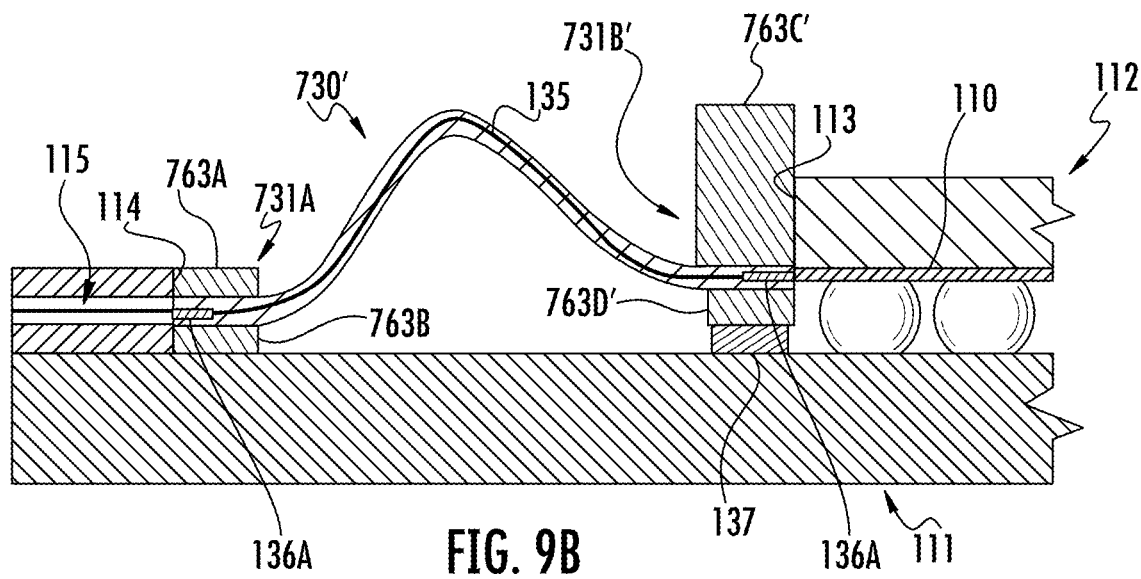

Referring now to FIG. 9B, as an aid for gripping the glass interconnection substrate 730' during insertion into the gap between the end surface 113 of the optical chip 112 and the end surface 114 of the substrate optical waveguides 115, glass strip 763C' close to the optical chip 112 may be configured as a glass block having a larger size than a first glass strip 763A, a second glass strip 763B, and a fourth glass strip 763D'. The larger glass strip 763C' provides an increased surface area to which to grip the glass interconnection substrate 730'.

Figure 10A:
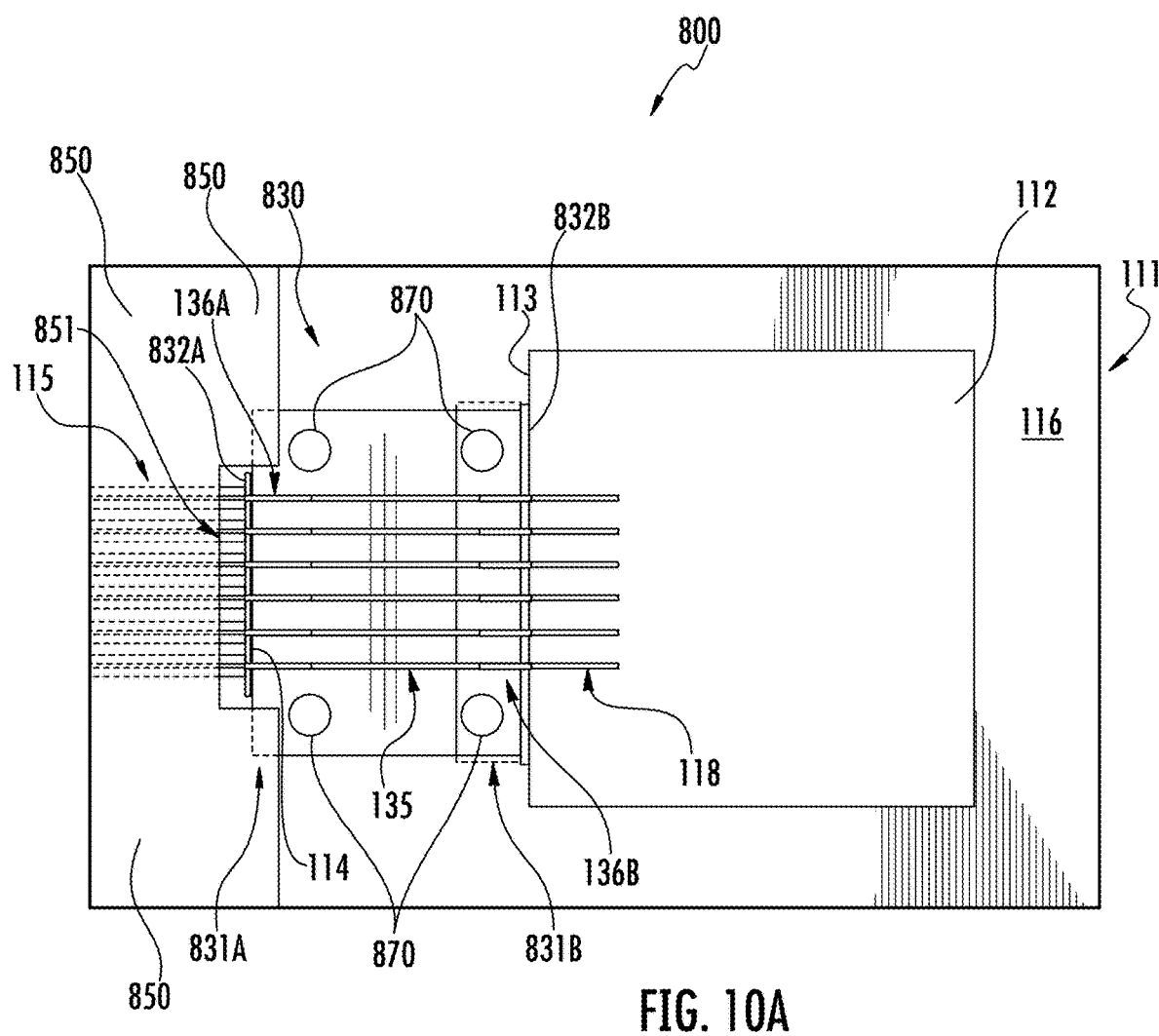
FIG. 10A schematically depicts a top view of an example optical interconnection assembly including a glass interconnection substrate having gripping features and coupled to an edge of an optical chip, according to one or more embodiments described and illustrated herein.

The glass interconnection substrates described herein may further include one or more gripping features to assist in gripping and placing the glass interconnection substrate. Referring now to FIG. 10A, a top down view of an example optical interconnection assembly 800 is schematically illustrated. The example optical interconnection assembly 800 comprises an optical chip 112, a glass interconnection substrate 830, and a plurality of substrate optical waveguides 115 disposed on or within a surface 116 of a base substrate 111. An overhang portion 850 is at least partially disposed over the plurality of substrate optical waveguides 115 and a first end 831A of the glass interconnection substrate 830. A notch 851 is present within the overhang portion 850 to provide access to the first end 831A for a vision alignment process and/or to laser write laser written optical waveguides 136A from the plurality of interconnection optical waveguides 135. A first end surface 832A of the first end 831A of the glass interconnection substrate 830 is coupled to the end surface 114 of the plurality of substrate optical waveguides 115, and a second end surface 832B of the second end 831B of the glass interconnection substrate 830 is coupled to an end surface 113 of the optical chip 112 (e.g., by a UV curable adhesive). First laser written optical waveguides 136A optically couple the plurality of substrate optical waveguides 115 to the plurality of interconnection optical waveguides 135. Second laser written optical waveguides 136B optically couple the plurality of chip optical waveguides to the plurality of interconnection optical waveguides 135.

In the example glass interconnection substrate 830 depicted in FIG. 10A, four holes 870 are provided in the corners of the glass interconnection substrate 830 as gripping features. The holes 870 may be utilized by a gripping tool or actuator to grip and place the glass interconnection substrate 830. As an example and not a limitation, the holes 870 may be formed by laser cutting. The holes 870, as well as other gripping features described herein, may be used as alignment fiducials when placing and aligning the glass interconnection substrate 830 with respect to the plurality of substrate optical waveguides and/or the optical chip 112.

Figure 10B:
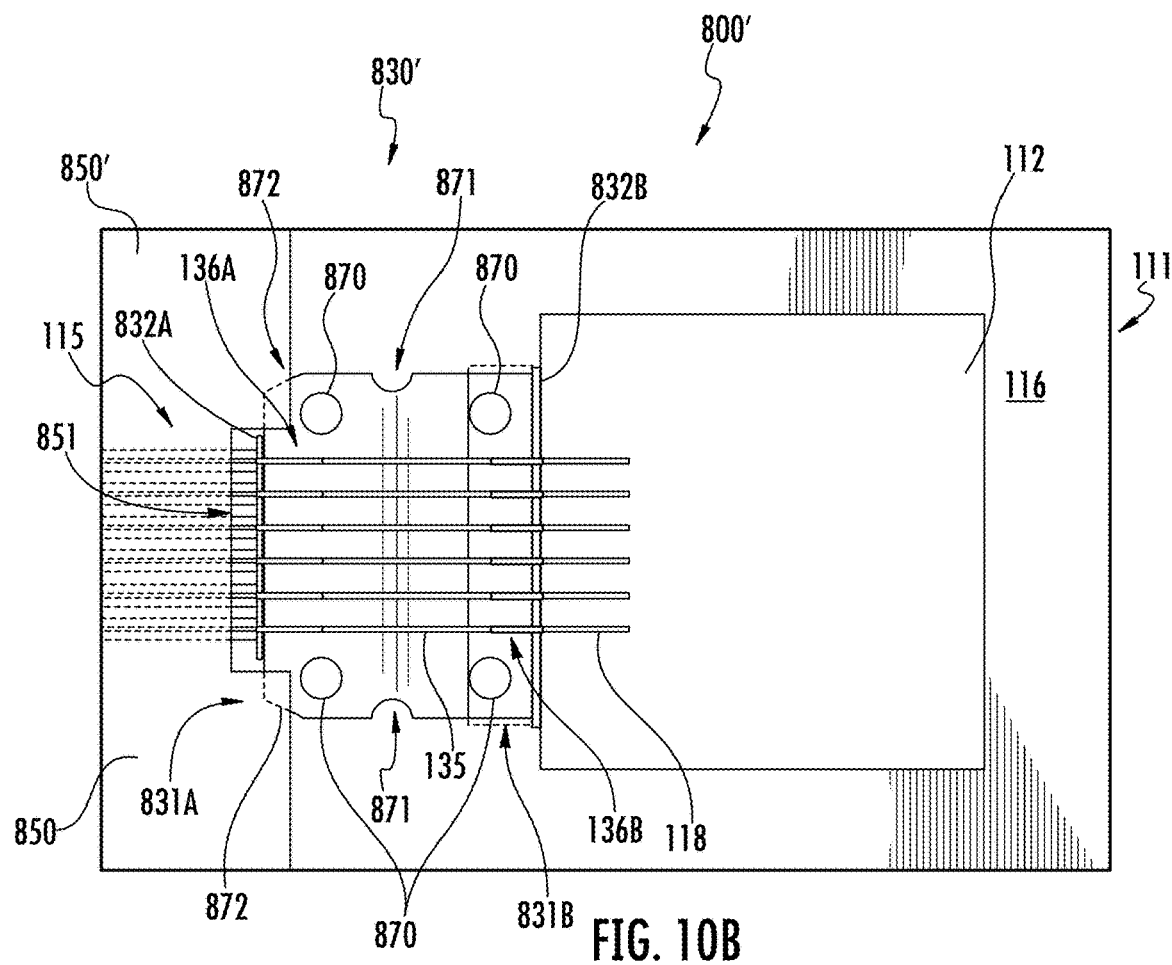
FIG. 10B schematically depicts a top view of an example optical interconnection assembly including a glass interconnection substrate having gripping features configured as holes and notches, and coupled to an edge of an optical chip, according to one or more embodiments described and illustrated herein.

FIG. 10B depicts another example glass interconnection substrate 830' including holes 870 as well as perimeter notches 871 for gripping the glass interconnection substrate 830. The example glass interconnection substrate 830' of FIG. 10B also includes tapered portions 872 (e.g., laser cut tapered ends) to guide and self-align the glass interconnection substrate 830 with the plurality of substrate optical waveguides 115 when inserted within the gap between the plurality of substrate optical waveguides 115 and the optical chip 112. It is noted that the gripping features may be employed in any of the glass interconnection substrates described herein. Various types of gripping features (e.g., holes, grooves, notches, bosses, etc.) may be employed together on the same glass interconnection substrate or individually.

Figure 10C:
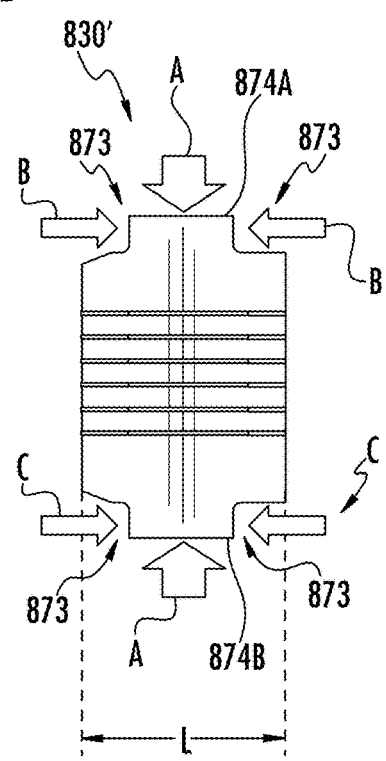
FIG. 10C schematically depicts a top view of an example glass interconnection substrate having gripping features according to one or more embodiments described and illustrated herein.

FIG. 10C depicts an example method of gripping a glass interconnection substrate 830" in one non-limiting example. Gripping force may be applied to the edges 874A, 874B of the curved portion as indicated by arrows A, while forces indicated by arrows B may be applied to portions 873 to reduce the length L of the glass interconnection substrate 830' during insertion.

Figure 11A:
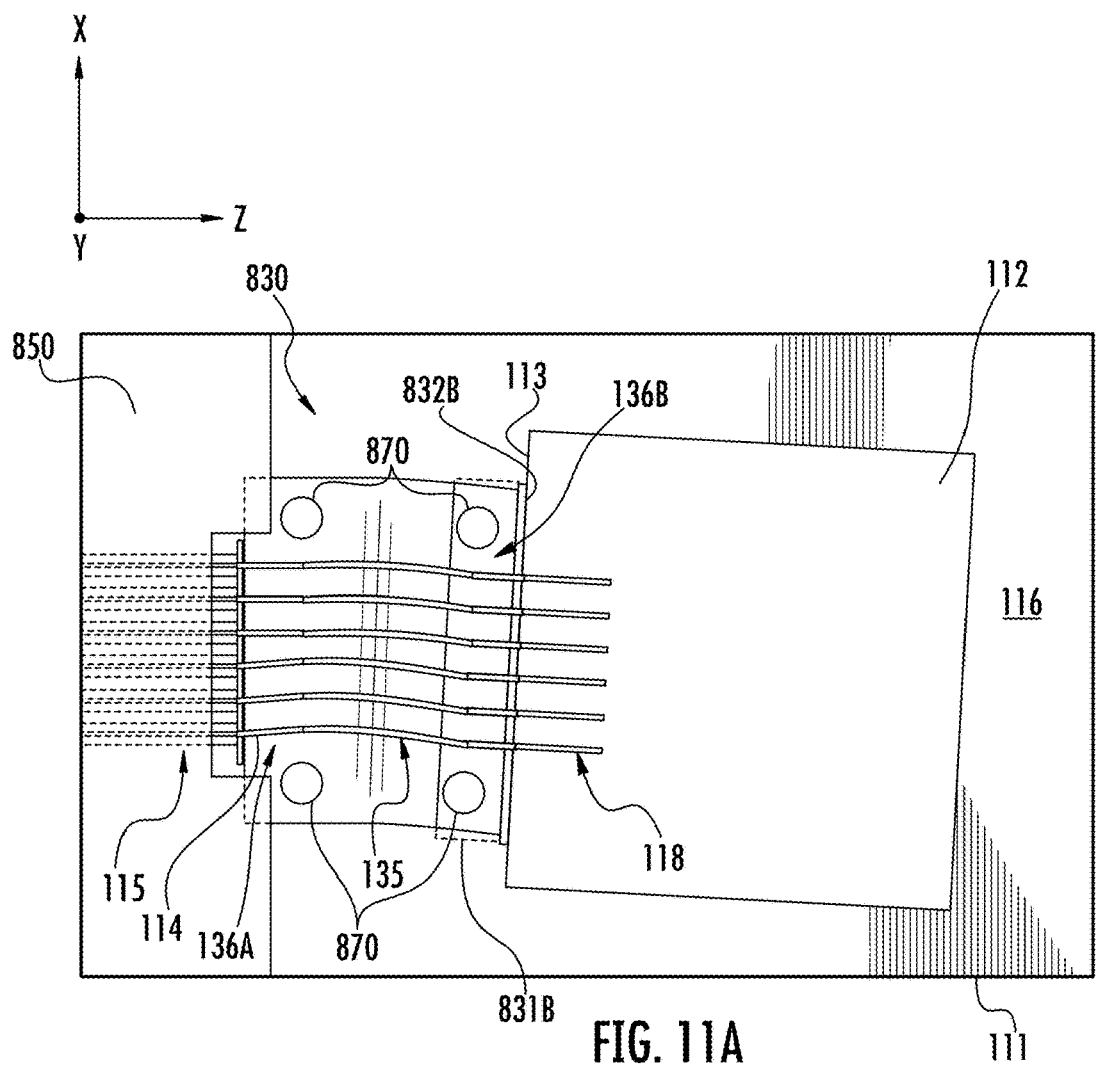
FIG. 11A schematically depicts a top view of an example optical interconnection assembly including a glass interconnection substrate having gripping features and coupled to an angled edge of an optical chip, according to one or more embodiments described and illustrated herein.

FIG. 11A depicts an optical chip 112 that is angled with respect to an X-axis as well as the end surface 114 of the substrate optical waveguides 115. Pick and place equipment used for positioning optical chips on a base substrate (e.g., a circuit board) prior to solder ball/bump reflow can be expected to introduce minor angular rotations of the optical chips (as viewed from above) relative to the substrate optical waveguides. Solder reflow processes may result in additional optical chip rotations. As a result, the end surface 113 of the optical chip 112 is not expected to be parallel to the end surface 114 of the substrate optical waveguides after solder reflow is complete.

When the glass interconnection substrate 830 is inserted into the gap between the end surface 114 of the substrate optical waveguides 115 and the end surface 113 of the optical chip 112, it should be thin and flexible enough to support the difference in compression across the substrate optical waveguides 115 that occurs as a consequence of the angular misalignment between the end surface 114 of the substrate optical waveguides 115 and the end surface 113 of the optical chip 112. The glass interconnection substrate 830 is turned such that the second end surface 832B of the second end 831B is angled with respect to the X-axis and the end surface of the plurality of substrate optical waveguides 115. In other words, a plane defined by the second end surface 832B of the glass interconnection substrate 830 is tilted relative to a plane defined by the end surface of the substrate optical waveguides 115. It is noted that curved surfaces at the ends of the glass interconnection substrate (e.g., first end surface 132A illustrated in FIG. 3) may help in maintaining close contact with the optical chip 112 and the substrate optical waveguides 115.

Figure 11B:
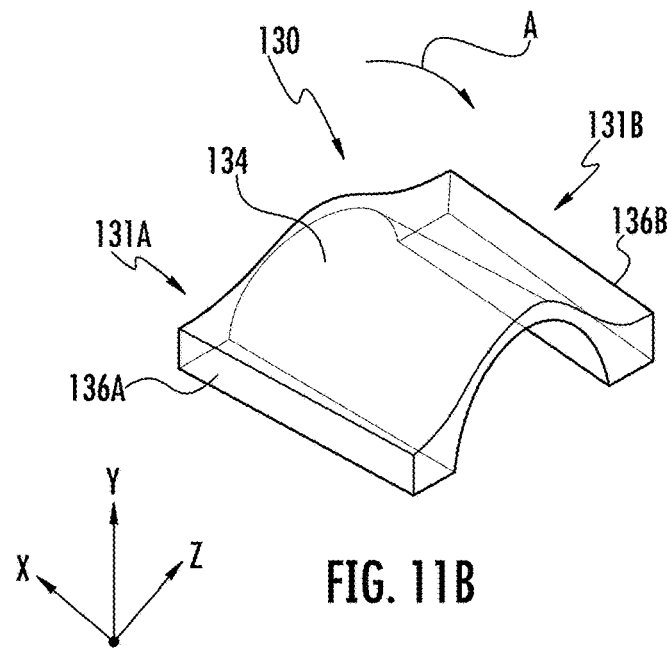
FIG. 11B schematically depicts a perspective view of an example glass interconnection substrate having an end that is turned according to one or more embodiments described and illustrated herein.

FIG. 11B schematically depicts a perspective view of a glass interconnection substrate 130 having a second end 132B turned from the X-axis as indicated by arrow A.

Figure 12A:
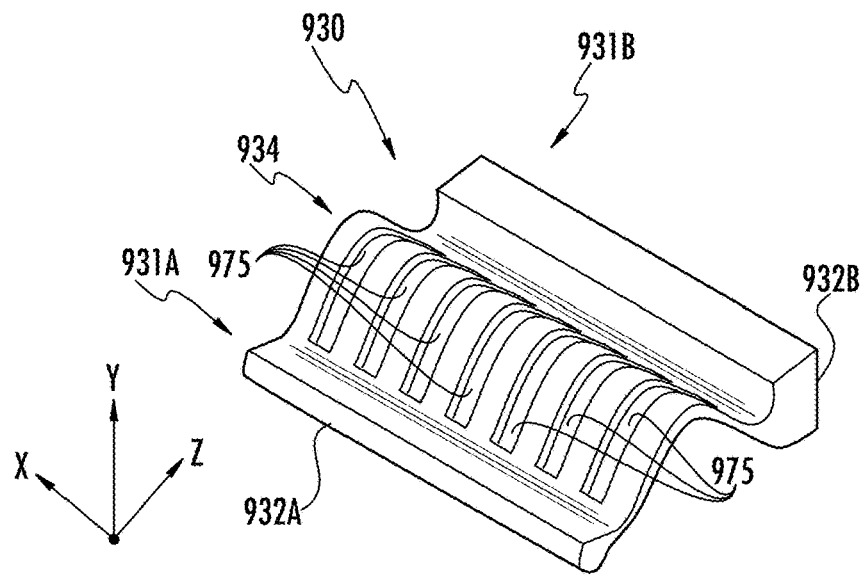
FIG. 12A schematically depicts a perspective view of an example glass interconnection substrate having a plurality of slots according to one or more embodiments described and illustrated herein.

In some embodiments, the flexibility of the glass interconnection substrate under optical chip-substrate optical waveguide misalignment may be enhanced by inclusion of periodic slots disposed within the glass interconnection substrate. FIG. 12A schematically illustrates an example glass interconnection substrate 930 having a first end 931A with a first end surface 932A and a second end 931B with a second end surface 932B. A curved portion 934 is disposed between first end 931A and the second end 931B. A plurality of slots 975 is disposed within the curved portion 934 to increase flexibility of the glass interconnection substrate 930. As non-limiting examples, the plurality of slots 975 may be formed by laser ablation, etching, water jet cutting, or sawing. The plurality of slots 975 may extend fully through the bulk of the glass interconnection substrate 930, or be configured as thinned areas that do not extend fully through the glass interconnection substrate 930.

Figure 12B:
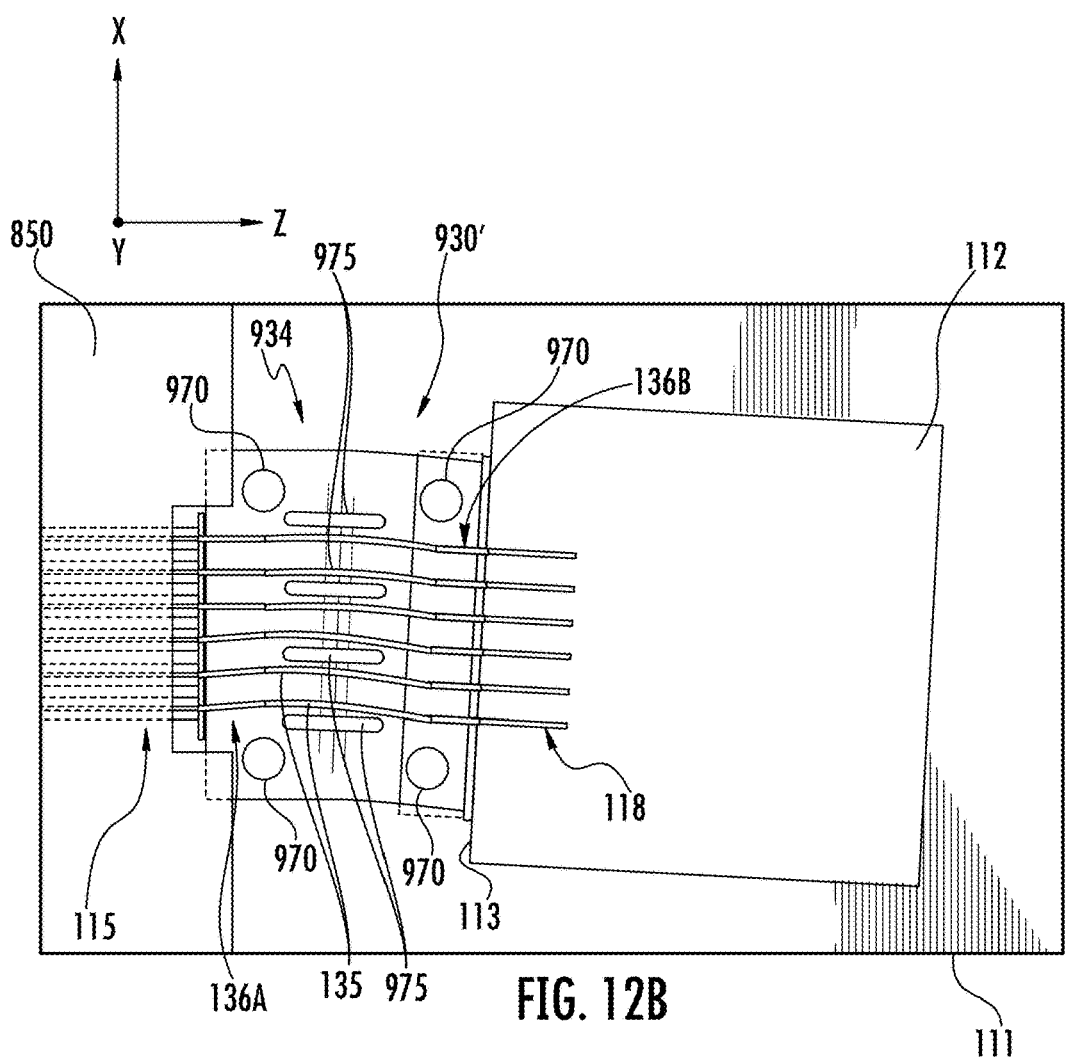
FIG. 12B schematically depicts a top view of an example optical interconnection assembly including a glass interconnection substrate having a plurality of slots and coupled to an angled edge of an optical chip, according to one or more embodiments described and illustrated herein.

FIG. 12B schematically depicts a top view of an example glass interconnection substrate 930' disposed between a plurality of substrate optical waveguides 115 and an optical chip 112. The end surface 113 of the optical chip 112 is angled with respect to the X-axis such that it is not parallel to the end surface 114 of the plurality of substrate optical waveguides 115. In the illustrated embodiment, the glass interconnection substrate 930' includes four holes 970 as gripping features. The glass interconnection substrate 930' further includes a plurality of slots 975 within the curved portion 934. In the example depicted in FIG. 12B, there are two interconnection optical waveguides 135 between two adjacent slots 975'. However, it should be understood that more or fewer slots 975' may be provided, and more or fewer interconnection optical waveguides 135 may be disposed between adjacent slots 975'.

Figure 13:
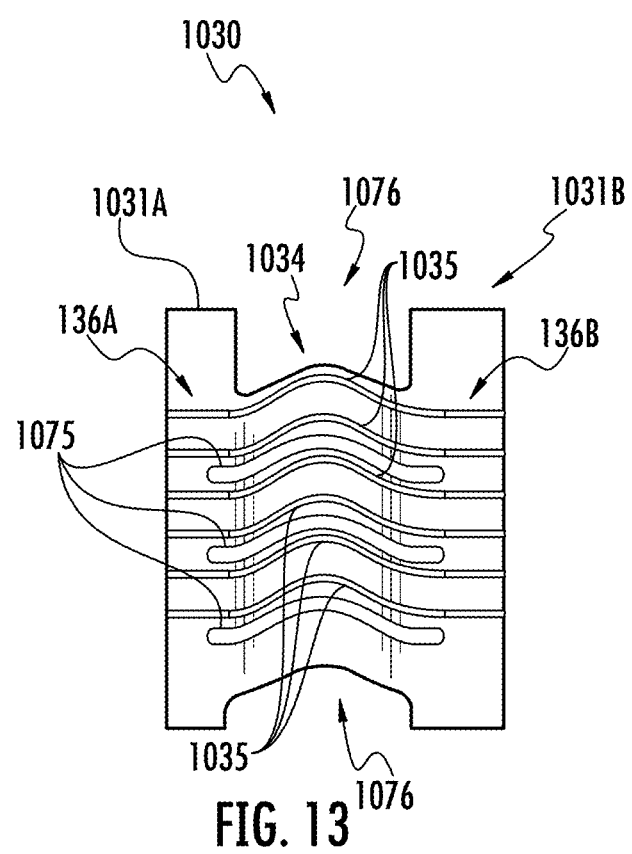
FIG. 13 schematically depicts a top view of an example glass interconnection substrate having a plurality of curved slots according to one or more embodiments described and illustrated herein.

The shape and placement of slots within the glass interconnection substrate may take on many configurations. Referring now to FIG. 13, an example glass interconnection substrate 1030 having a plurality of curved slots 1075 is schematically illustrated. The plurality of curved slots may simultaneously accommodate angular and CTE mismatch challenges. The plurality of curved slots 1075 is partially disposed within a first end 1031A and a second end 1031B, as well as within a curved portion 1034. Notches 1076 are also disposed between arms defined by the first end 1031A and the second end 1031B for increased flexibility and for gripping of the glass interconnection substrate 1030. In the illustrated example, two curved interconnection optical waveguides 1035 are disposed between adjacent curved slots 1075. However, it should be understood that any number of interconnection optical waveguides 1035 may be disposed between adjacent curved slots 1075.

Figure 14A:
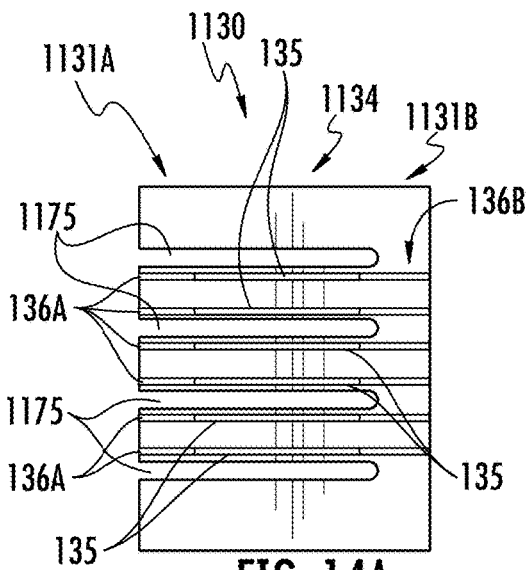
FIGS. 14A and 14B schematically depict a top view of example glass interconnection substrate having a plurality of slots according to one or more embodiments described and illustrated herein.
Figure 14B:
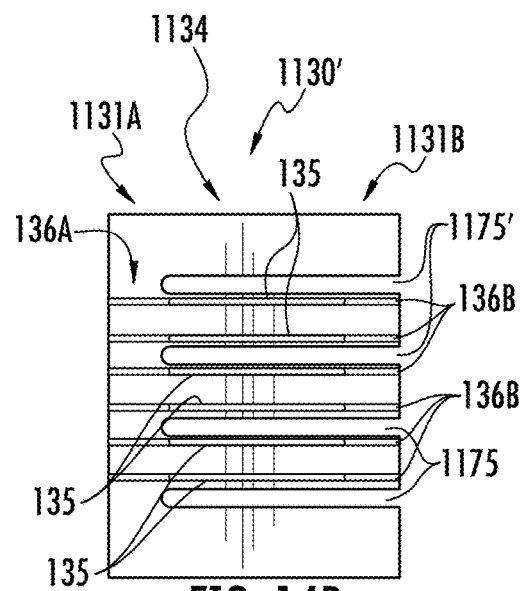

FIGS. 14A, 14B, 15A and 15B schematically depict additional, non-limiting slot examples for increasing the flexibility of the glass interconnection substrate. These slots accommodate waveguide pitch changes that may occur due to CTE mismatch between the glass interconnection substrate 1130 and mating optical chips 112. FIG. 14A schematically depicts an example glass interconnection substrate 1130 wherein a plurality of slots 1175 extend from an end surface of a first end 1131A, into a curved portion 1134, and partially into a second end 1131B. The plurality of slots 1175 does not fully extend to the end surface of the second end 1131B. Similarly, FIG. 14B schematically depicts a glass interconnection substrate 1130' having a plurality of slots 1175' extending from an end surface of a second end 1131B, into a curved portion 1134, and partially into a first end 1131A. The plurality of slots 1175' does not fully extend to the end surface of the first end 1131A.

Figure 15A:
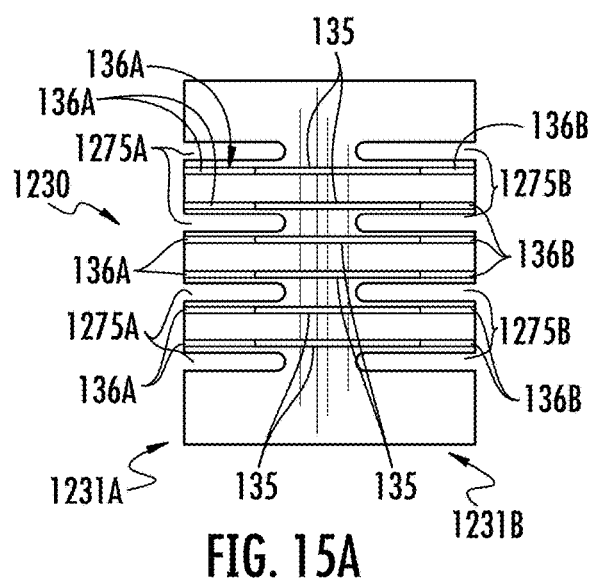
FIGS. 15A and 15B schematically depict a top view of example glass interconnection substrate having a plurality of slots according to one or more embodiments described and illustrated herein.
Figure 15B:
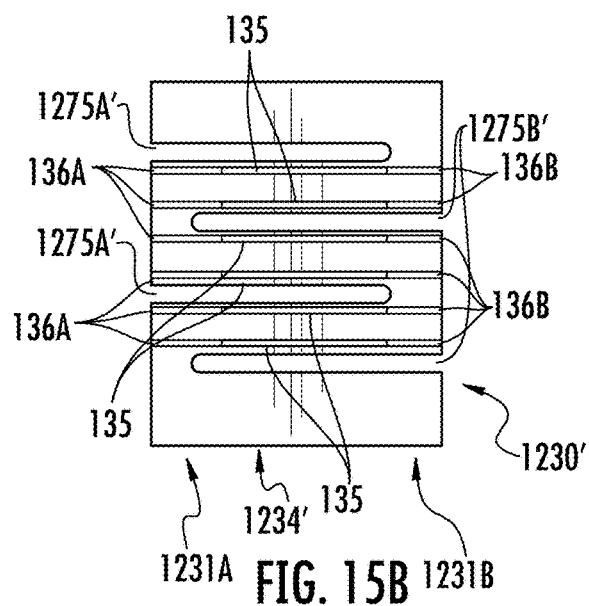

In the example glass interconnection substrate 1230 depicted in FIG. 15A, a first subset of a plurality of slots 1275A extend from an end surface of a first end 1231A and partially into a curved portion 1234, and a second subset of a plurality of slots 1275B extend from an end surface of a second end 1231B and partially into the curved portion 1234. The first plurality of slots 1275A is aligned with the second plurality of slots 1275B. In the example glass interconnection substrate 1230' depicted in FIG. 15B, a first plurality of slots 1275A' extend from an end surface of a first end 1231A and partially into a curved portion 1234', and a second plurality of slots 1275B' extend from an end surface of a second end 1231B' and partially into the curved portion 1234'. As shown in FIG. 15B, the first plurality of slots 1275A' is offset with respect to the second plurality of slots 1275B'.

Figure 16A:
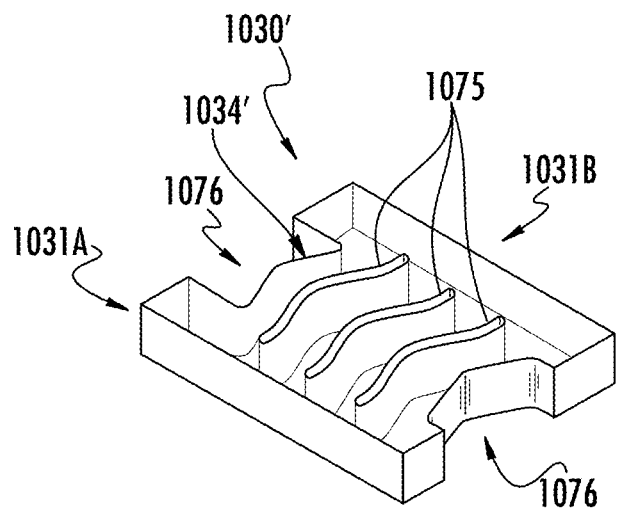
FIG. 16A schematically depicts a perspective view of example flat glass interconnection substrate having a plurality of curved slots according to one or more embodiments described and illustrated herein.
Figure 16B:
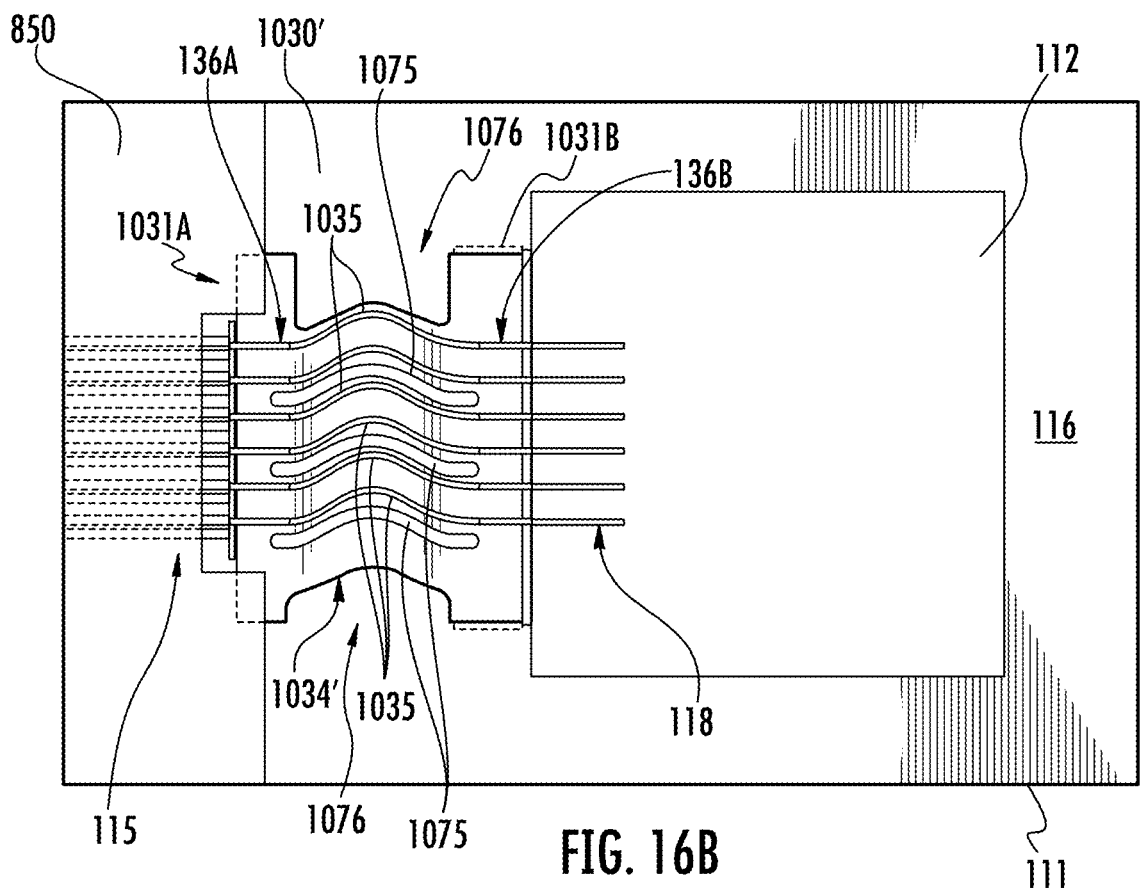
FIG. 16B schematically depicts a top view of an example optical interconnection assembly including a flat glass interconnection substrate having a plurality of curved slots, the flat glass interconnection substrate being coupled to an edge of an optical chip, according to one or more embodiments described and illustrated herein.

The glass interconnection substrates described herein may also be flat (i.e., without a curved portion). FIGS. 16A and 16B schematically depict an example flat glass interconnection substrate 1030' having a first end 1031A, a central portion 1034' and a second end 1031B. FIG. 16A illustrates the example flat glass interconnection substrate 1030' in isolation, and FIG. 16B illustrated the example flat glass interconnection substrate 1030' positioned within the gap between the substrate optical waveguides 115 and the optical chip 112.

A plurality of curved slots 1075 is disposed within the central portion 1034', and partially disposed within the first end 1031A and the second end 1031B. Each curved slot 1075 has a bell-shaped curve. The curved slots 1075 may be formed via laser cutting process on glass sheets. Alternatively, flat glass interconnection substrates may be fabricated by glass drawing a shape with a profile like the one shown in FIGS. 16A and 16B, followed by sawing/laser cutting the resulting drawn rod to form thin sheet components.

In the illustrated embodiment, notches 1076 are provided between the first end 1031A and the second end 1031B for increased flexibility. Referring to FIG. 16B, two curved interconnection optical waveguides 1035 are positioned between adjacent curved slots 1075. It should be understood that any number of interconnection optical waveguides 1035 may be positioned between adjacent curved slots 1075. It should also be understood that flat glass interconnection substrates may include any of the slot configurations, interconnection optical waveguide configurations, gripping feature configurations, and any other features described above with respect to the curved glass interconnection substrates.

Figure 17:
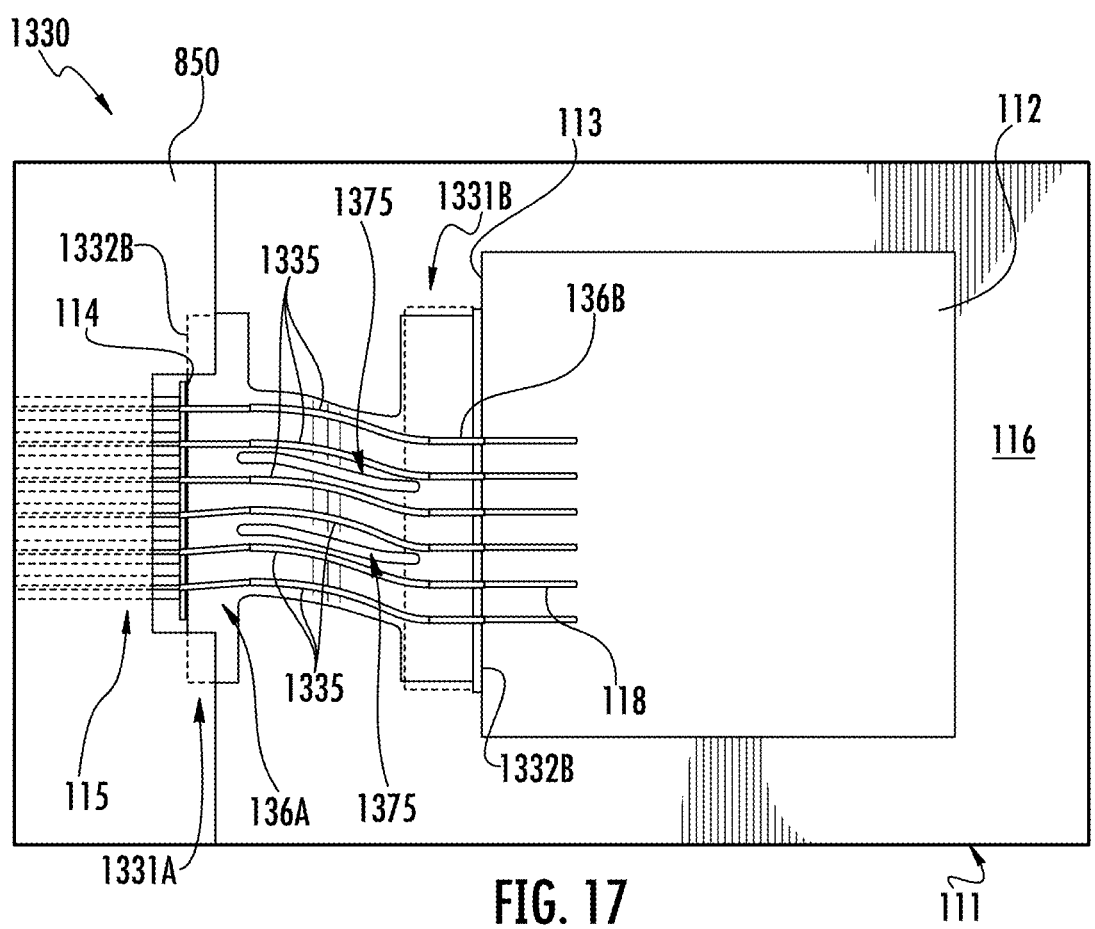
FIG. 17 schematically depicts a top view of an example optical interconnection assembly including a flat glass interconnection substrate having a plurality of curved slots and curved optical waveguides, the flat glass interconnection substrate being coupled to an edge of an optical chip, according to one or more embodiments described and illustrated herein.

Depending on interface flexibility requirements, the bell-shaped curve slots shown in FIGS. 16A and 16B may be replaced with curved slots 1375 that follow an S-shaped offset path as illustrated in FIG. 17. The bell-shaped curve slots allow the glass interconnection substrate 1330 to flexibly deform to accommodate minor lateral shifts and angular rotations of one end region relative to the other. Reducing width of glass material between slots will increase flexibility but may increase the total number of slots required. Referring to FIG. 17, the optical axis of the plurality of substrate optical waveguides 115 is offset with respect to the optical axis of the plurality of chip optical waveguides 118. The flat glass interconnection substrate 1330 has a plurality of interconnection optical waveguides 1335 and a plurality of curved slots 1375 extending from a first end 1331A to a second end 1331B. The plurality of interconnection optical waveguides 1335 and the plurality of curved slots 1375 each have an S-shaped curved such that an optical axis of the curved optical waveguide at the first end is offset from an optical axis of the curved optical waveguide at the second end. Laser written optical waveguides 136A and 136B optically couple the plurality of interconnection optical waveguides 1335 to the plurality of substrate optical waveguides 115 and the plurality of chip optical waveguides 118.

Figure 18:
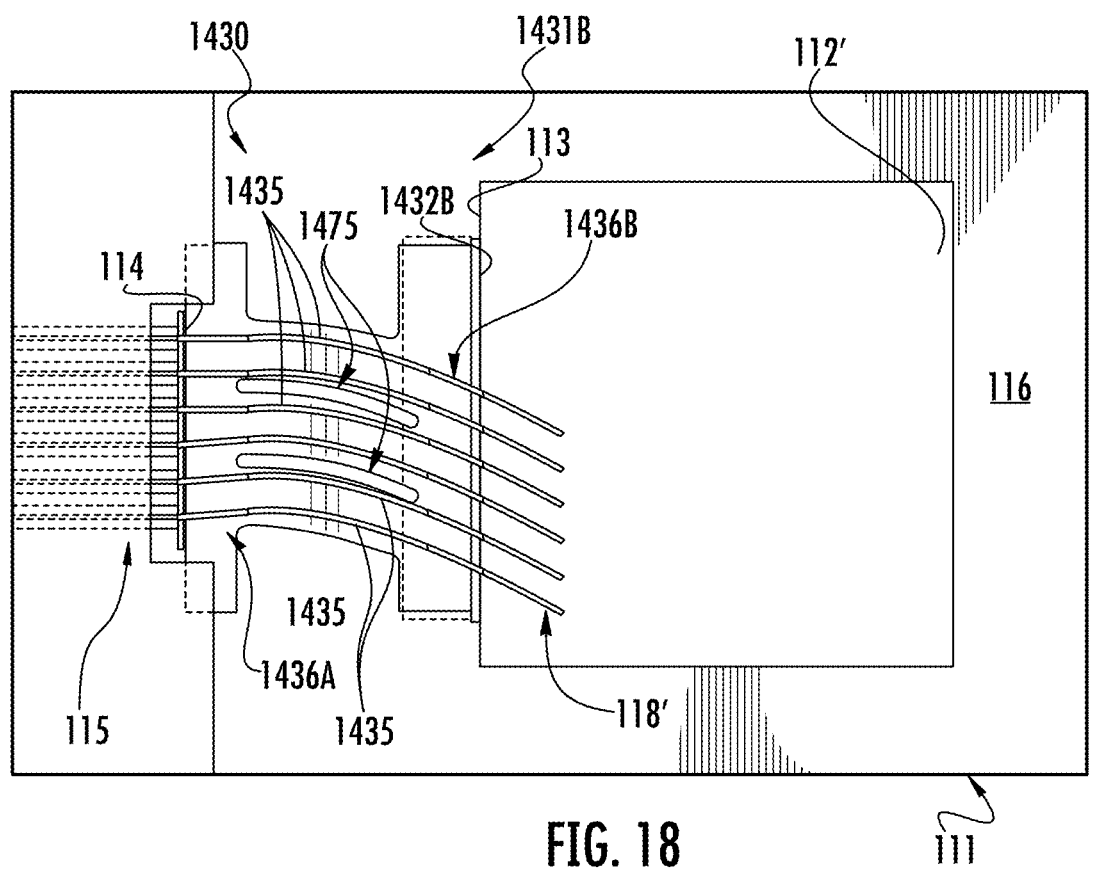
FIG. 18 schematically depicts a top view of an example optical interconnection assembly including a flat glass interconnection substrate having a plurality of curved slots and curved optical waveguides, the flat glass interconnection substrate being coupled to an edge of an optical chip having corresponding chip optical waveguides, according to one or more embodiments described and illustrated herein.

A more compact interface may be obtained by angling either the substrate optical waveguides or the chip optical waveguides. The angled optical waveguide interface may also be desirable to meet optical back reflection requirements at the optical chip. Referring to FIG. 18, an example flat glass interconnection substrate 1430 has a plurality of curved interconnection optical waveguides 1435 having an optical axis that non-orthogonally terminates at an end surface 1432B of a second end 1431B. The flat glass interconnection substrate 1430 further includes corresponding curved slots 1475. The optical chip 112' includes a plurality of chip optical waveguides 118' that non-orthogonally intersect an end surface 113 of the optical chip 112'. Angled laser written waveguides 1436B are formed to optically couple the plurality of interconnection optical waveguides 1435 to the plurality of chip optical waveguides 118'. The angled laser written waveguides 1436B non-orthogonally intersect the end surface 1432B of the second end 1431B to meet the plurality of chip optical waveguides 118'.

Figure 19:
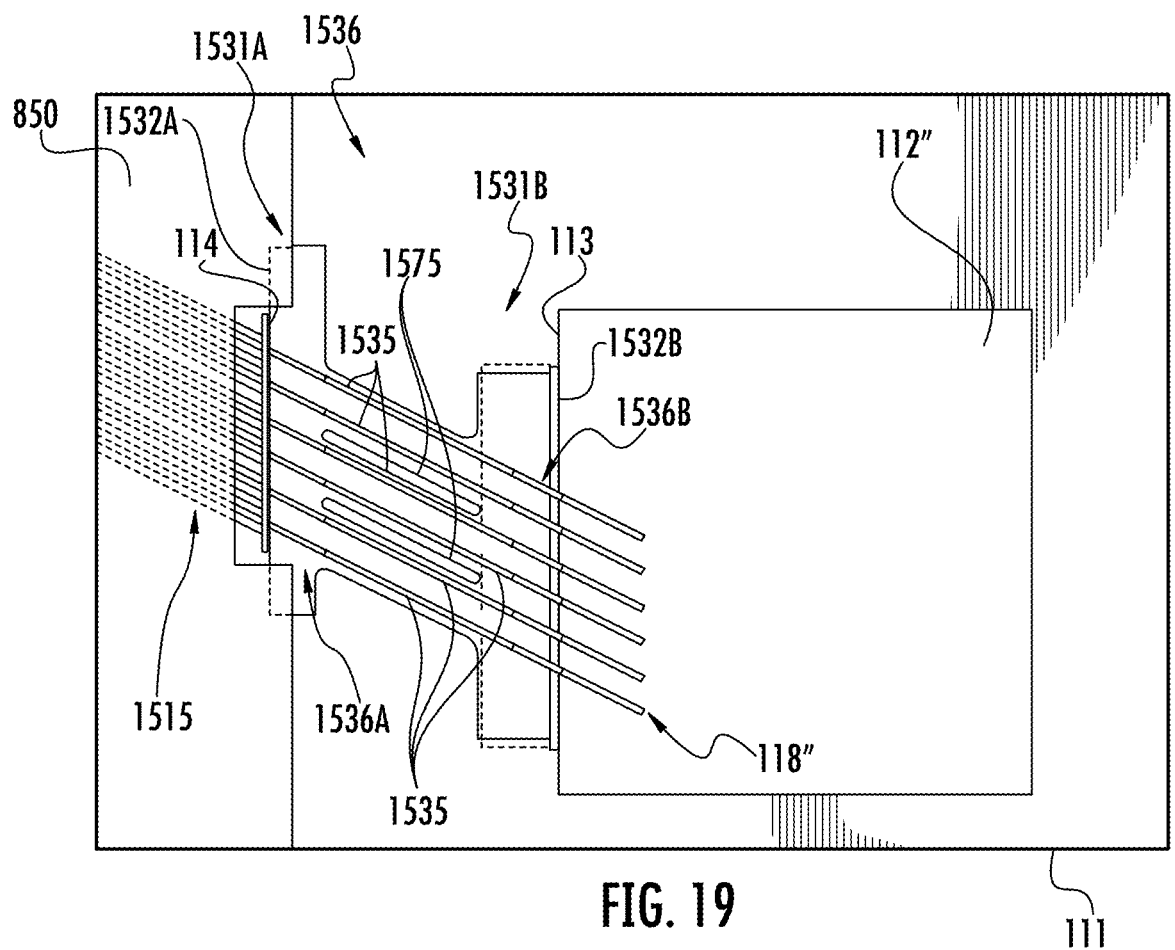
FIG. 19 schematically depicts a top view of an example optical interconnection assembly including a flat glass interconnection substrate having a plurality of angled slots and angled optical waveguides, the flat glass interconnection substrate being coupled to an edge of an optical chip having corresponding angled chip optical waveguides, according to one or more embodiments described and illustrated herein.

The glass interconnection substrate may be made more compact by angling interfaces with both the substrate optical waveguides and the chip optical waveguides. FIG. 19 schematically illustrates another example glass interconnection substrate 1530 wherein the plurality interconnection optical waveguides 1535 and the corresponding first and second plurality of laser written optical waveguides 1536A, 1536B are non-orthogonal with respect to the end surfaces 1532A. 1532B of the first and second ends 1531A, 1531B, respectively. In the illustrated embodiment, the plurality of interconnection optical waveguides 1535 and the first and second laser written optical waveguides 1536A, 1536B are fabricated straight. The plurality of substrate optical waveguides 1515 non-orthogonally terminates at the end surface 114 of the plurality of substrate optical waveguides 1515. The chip optical waveguides 118" non-orthogonally terminates at the end surface 113 optical chip 112". The glass interconnection substrate 1530 includes slots 1575 parallel to optical waveguides 1535 that allow the glass interconnection substrate to be distorted during installation or use.

Glass interconnection substrates described herein also enable optical connection between substrate optical waveguides and normal to a bottom surface of an optical chip. Particularly, the glass interconnection substrates of this design involved a laser written drawn or stacked glass bend component inserted into a through hole in the optical PCB located directly below an active optical component (e.g., a laser source, a photodetector, and the like) or an optical waveguide interface. The glass bend component provides a compact right angle turn to direct optical signals into substrate optical waveguides that extend parallel to the plane of the base substrate.

Figure 20:
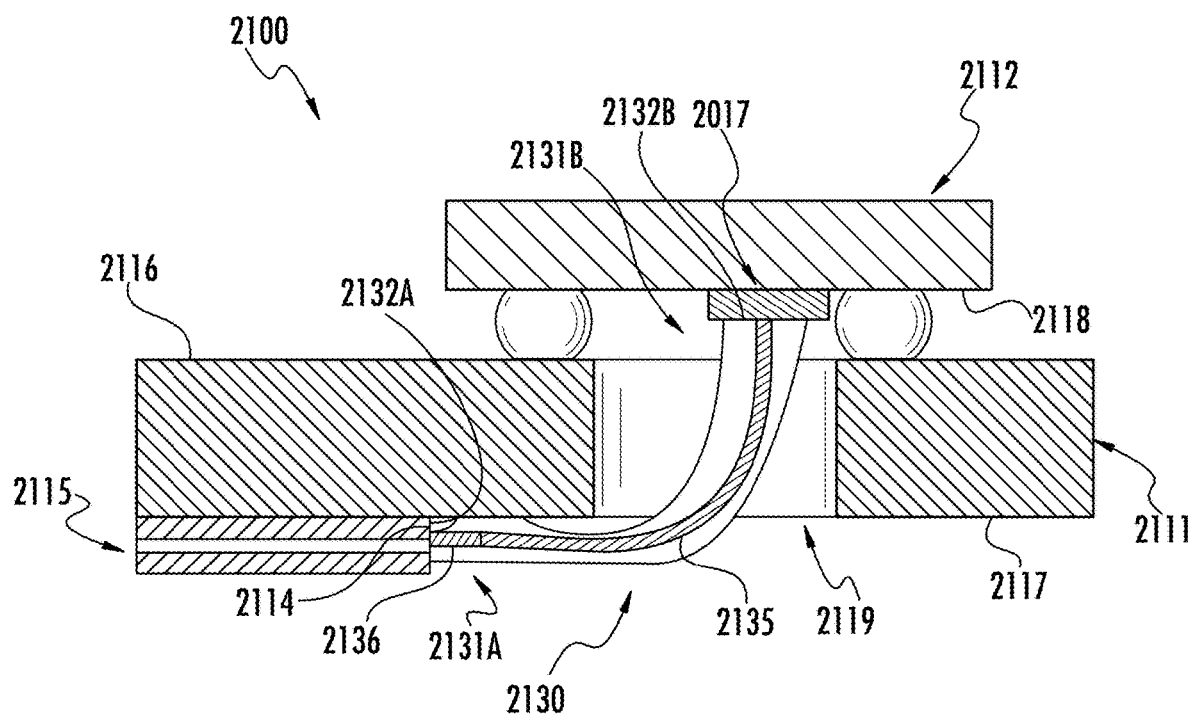
FIG. 20 schematically depicts a side view of an example optical interconnection assembly including a bent glass interconnection substrate disposed within a through-hole via of a base substrate and coupled to a bottom surface of an optical chip, according to one or more embodiments described and illustrated herein.

FIG. 20 schematically depicts an example optical interconnection assembly comprising a base substrate 2111 (e.g., a single- or multi-layer circuit board), a glass interconnection substrate 2130 having a ninety degree bend, one or more substrate optical waveguides 2115, and an optical chip 2112. The optical chip 2112 is mounted on a surface 2116 of the base substrate 2111. The optical chip 2112 includes an active optical component on an optical coupling surface 2118 of the optical chip 2112 that faces the surface 2116 of the base substrate 2111. The one or more substrate optical waveguides 2115 are positioned on or near a surface 2117 of the base substrate 2111 that is opposite from surface 2116. As described above, the one or more substrate optical waveguides 2115 may be embedded within the base substrate 2111 or disposed on the surface 2117. The example base substrate 2111 further includes a through-hole 2119 extending from surface 2116 to surface 2117.

The example glass interconnection substrate 2130 has a first end 2131A with a first end surface 2132A and a second end 2131B with a second end surface 2132B. The glass interconnection substrate 2130 is curved such that a plane defined by the first end surface 2132A is transverse to a plane defined by the second end surface 2132B. In the illustrated embodiment, the glass interconnection substrate 2130 has ninety degree bend such that the plane defined by the first end surface 2132A is orthogonal to the plane defined by the second end surface 2132B. However, the plane defined by the first end surface 2132A may be transverse with respect to the plane defined by the second end surface 2132B at angles other than ninety degrees.

The first end surface 2132A of the first end 2131A is curved. However, as described above, the first end surface 2132A may take on other configurations, such as a flat surface for example. The first end surface 2132A is coupled to an end surface 2114 of the one or more substrate optical waveguides 2115, such as by a UV curable adhesive, for example. One or more interconnection optical waveguides 2135 are optically coupled to the one or more substrate optical waveguides 2115, either directly or by one or more laser written optical waveguides 2136 as described above.

The glass interconnection substrate 2130 is bent such that a portion of the glass interconnection substrate 2130 is disposed within the through-hole 2119 of the base substrate 2111. The second end surface 2132B of the glass interconnection substrate 2130 is coupled to the active optical component 2017, such as by a UV curable adhesive, for example. In other embodiments, the second end surface 2132B is coupled to optical components other than an active optical component 2017, such as chip optical waveguides (not shown).

As stated above, the glass interconnection substrate 2130 includes one or more interconnection optical waveguides 2135. The one or more interconnection optical waveguides 2135 terminate at the second end surface 2132B, and are optically coupled to the active optical component 2017 such that optical signals may pass between the active optical component 2017 and the one or more interconnection optical waveguides 2135.

To assemble the components of the optical interconnection assembly 2100, the second end 2131B of the glass interconnection substrate is positioned into the through-hole 2119 of the base substrate 2111. The interconnection optical waveguide 2135 is aligned to the active optical component 2017, such as by the methods described in more detail below. The second end 2131B of the glass interconnection substrate is secured to a surface of the active optical component 2017 or the optical chip 2112, such as by use of a UV curable adhesive. The first end 2131A of the glass interconnection substrate 2130 is secured to the end surface 2114 of the substrate optical waveguide 2115, such as by a UV curable adhesive. A laser written waveguide may be formed within the first end 2131A to optically couple the interconnection optical waveguide to the substrate optical waveguide 2115.

Figure 21:
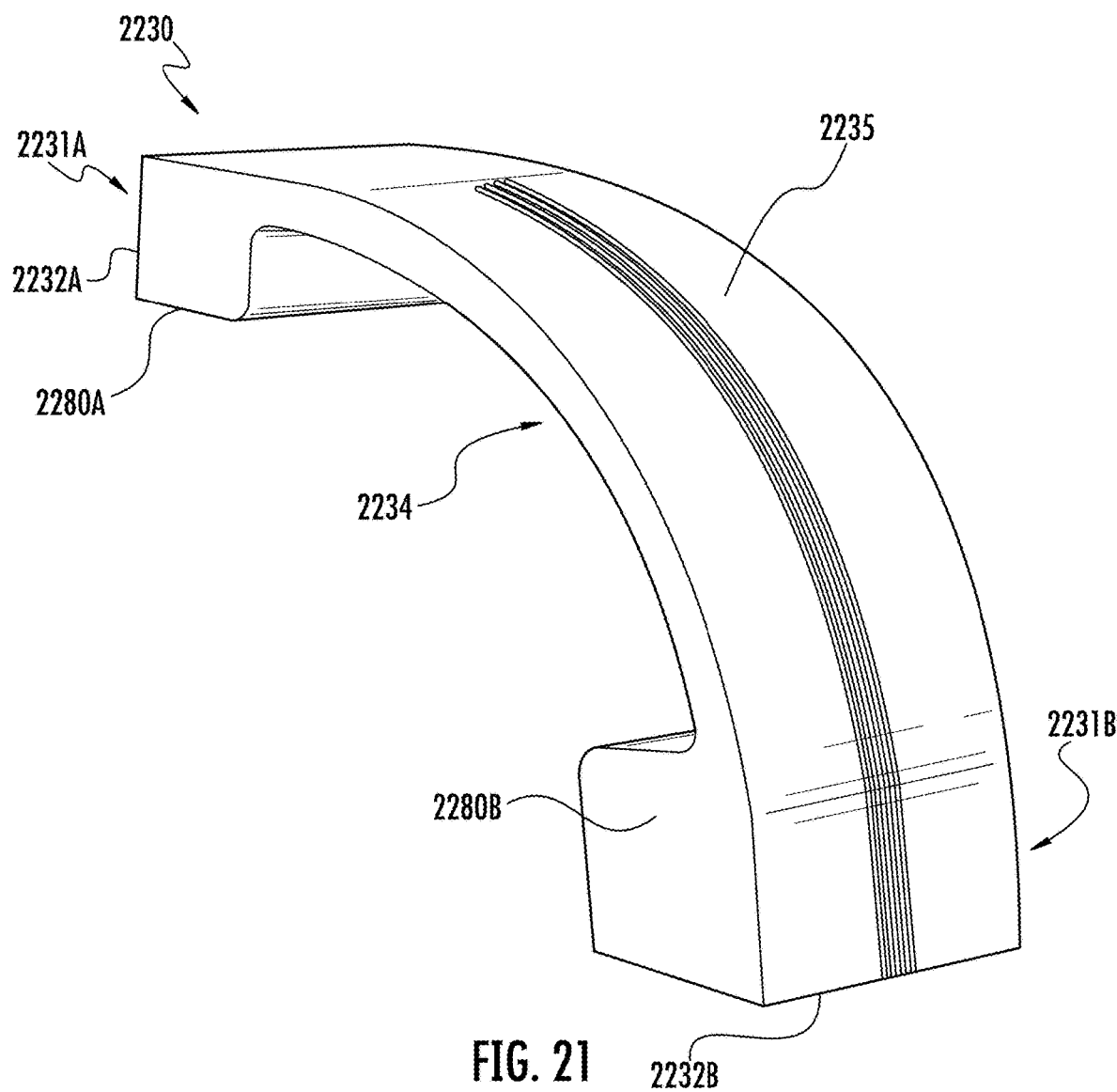
FIG. 21 schematically depicts a perspective view of an example bent glass interconnection substrate according to one or more embodiments described and illustrated herein.

Referring to now to FIG. 21, another bent glass interconnection substrate 2230 is schematically depicted. The example bent glass interconnection substrate 2230 has a continuously curved portion 2234 between a first end 2231A and a second end 2231B. The first end 2231A includes a first support block 2280A and a first end surface 2232A, and the second end 2231B includes a second support block 2280B and a second end surface 2232B. The first and second support block 2280A, 2280B may provide additional surface area and support for mechanical coupling to the end surface of a plurality of substrate optical waveguides and a plurality of optical components of an optical chip.

A plurality of interconnection optical waveguides 2235 extends from the second end surface 2232B through the continuously curved portion 2234 and toward the first end 2231A. The plurality of interconnection optical waveguides 2235 may be completed by a plurality of laser written optical waveguides (not shown) after attachment to an optical chip and substrate optical waveguides, as described above.

Figure 22:
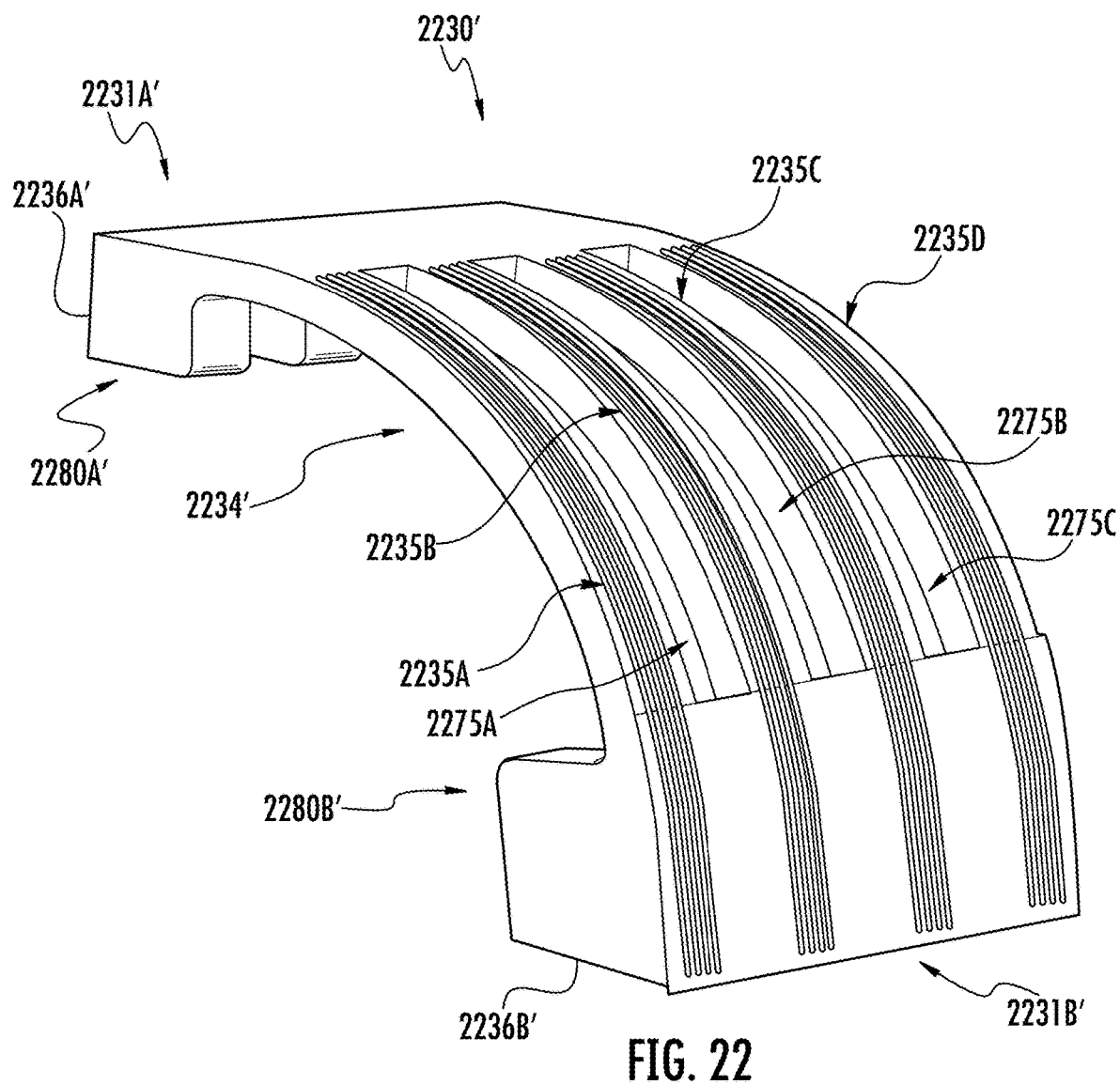
FIG. 22 schematically depicts a perspective view of an example bent glass interconnection substrate having a plurality of slots and a plurality of sets of optical waveguides according to one or more embodiments described and illustrated herein.

To increase the number of interconnection optical waveguides that can be routed on a single glass interconnection substrate, the width of the glass interconnection substrate 2230' may be increased, as shown in the example depicted in FIG. 22. In the illustrated embodiment, the glass interconnection substrate 2230' includes a plurality of first support blocks 2280A' at a first end 2231A', and a second plurality of second support blocks 2280B' at a second end 2231B'. In other embodiments, the first support block 2280A' is continuous rather than a plurality of first support blocks. Similarly, the second support block 2280B' may be continuous.

Further, the example glass interconnection substrate 2230' includes a first plurality of interconnection optical waveguides 2235A, a second plurality of interconnection optical waveguides 2235B, a third plurality of interconnection optical waveguides 2235C, and a fourth plurality of interconnection optical waveguides 2235D. Notches 2275A-2275C may be provided between sets of interconnection optical waveguides to provide flexibility to accommodate different CTEs of materials located at each end of the bent glass interconnection substrate 2230 (e.g., optical chips and substrate optical waveguides).

In the bent glass interconnection substrates depicted in FIGS. 20-22, light propagating through the curved region is confined within the substrate by the large index difference between the glass interconnection substrate and surrounding air or reduced index coating material on the surface of the glass interconnection substrate. To make a more compact right angle bend, the continuously curved region may be replaced by a total internal reflection (TIR) or, alternatively may also be coated with a single or multilayer metal or dielectric high reflectivity coating to enhance reflectivity that reflects the light through a right angle bend.

Figure 23:
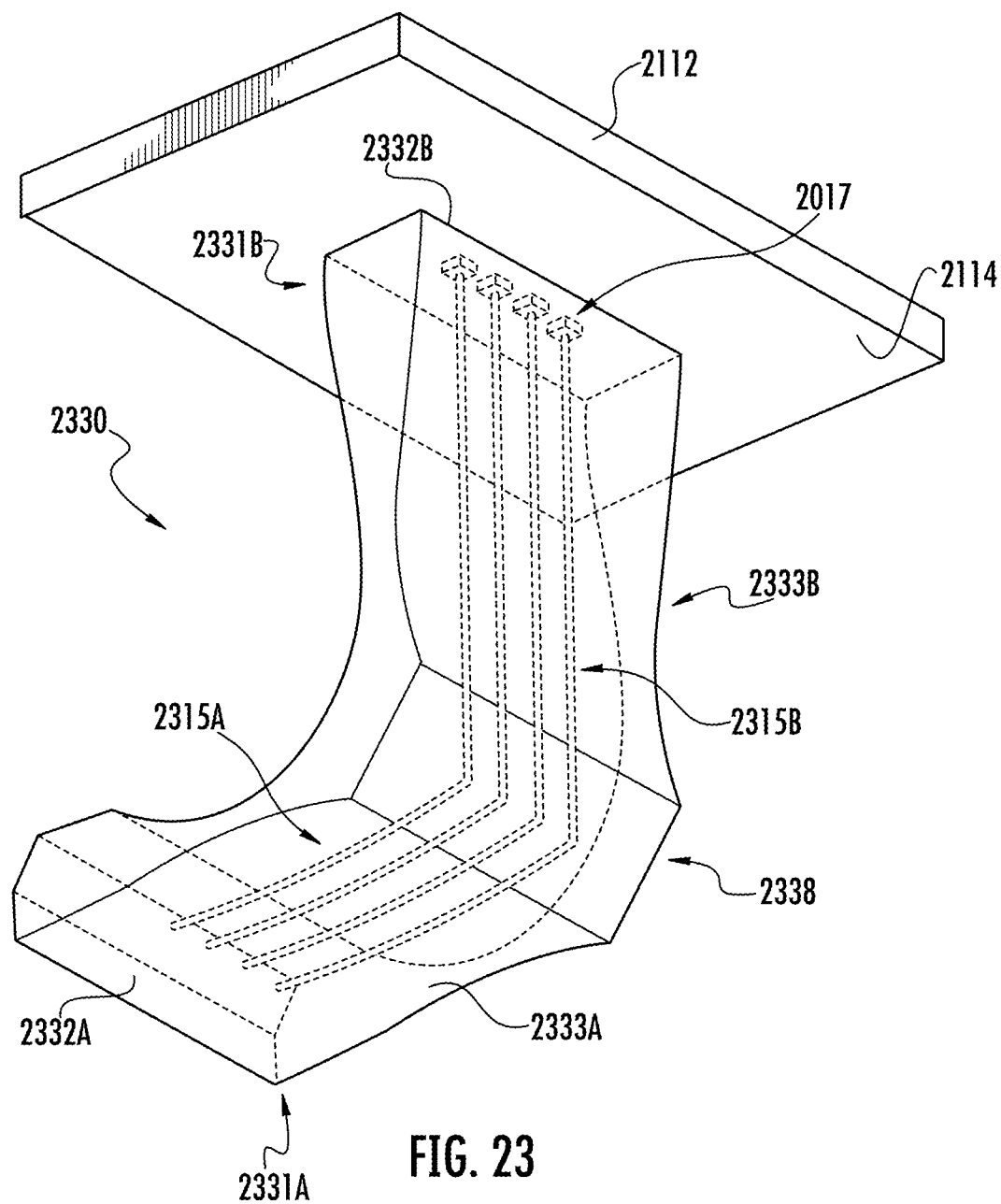
FIG. 23 schematically depicts a perspective view of an example right-angle glass interconnection substrate coupled to an optical chip according to one or more embodiments described and illustrated herein.

Referring now to FIG. 23, a right-angle glass interconnection substrate 2330 coupled to an optical surface 2114 (i.e., lower surface) of an optical chip 2112 is schematically depicted. The glass interconnection substrate 2330 has a first leg 2333A terminating in a first end surface 2332A at a first end 2331A, and a second leg 2333B terminating in a second end surface 2332B at a second end 2331B. A reflection surface 2338 is located between the first leg 2333A and the second leg 2333B. The reflection surface 2338 may be a TIR surface, or may also be coated with a single or multilayer metal or dielectric high reflectivity coating to enhance reflectivity.

In the illustrated embodiment, a first plurality of interconnection optical waveguides 2315A is within the first leg 2333A, and a second plurality of interconnection optical waveguides 2315B is within the second leg 2333B. The first plurality of interconnection optical waveguides 2315A does not fully extend to the first end surface 2332A, which may be curved, for example. Laser written optical waveguides may be formed to optically couple the first plurality of interconnection optical waveguides 2315A to a plurality of substrate optical waveguides (not shown). The second plurality of interconnection optical waveguides terminates at the second end surface 2332B and is optically coupled to a plurality of active optical components 2017, for example.

Optical signals propagating away from the plurality of active optical components 2017 within the second plurality of interconnection optical waveguides 2315B are reflected into the first plurality of interconnection optical waveguides 2315A by the reflection surface 2338. Optical signals propagating away from the first end surface 2332A within the first plurality of interconnection optical waveguides 2315A are reflected into the second plurality of interconnection optical waveguides 2315B by the reflection surface 2338. The interconnection optical waveguides are created right up to or within several micrometers of the reflection surface 2338 from both directions so that light remains confined in the interconnection optical waveguide as it reflects off the reflection surface 2338.

Figure 24:
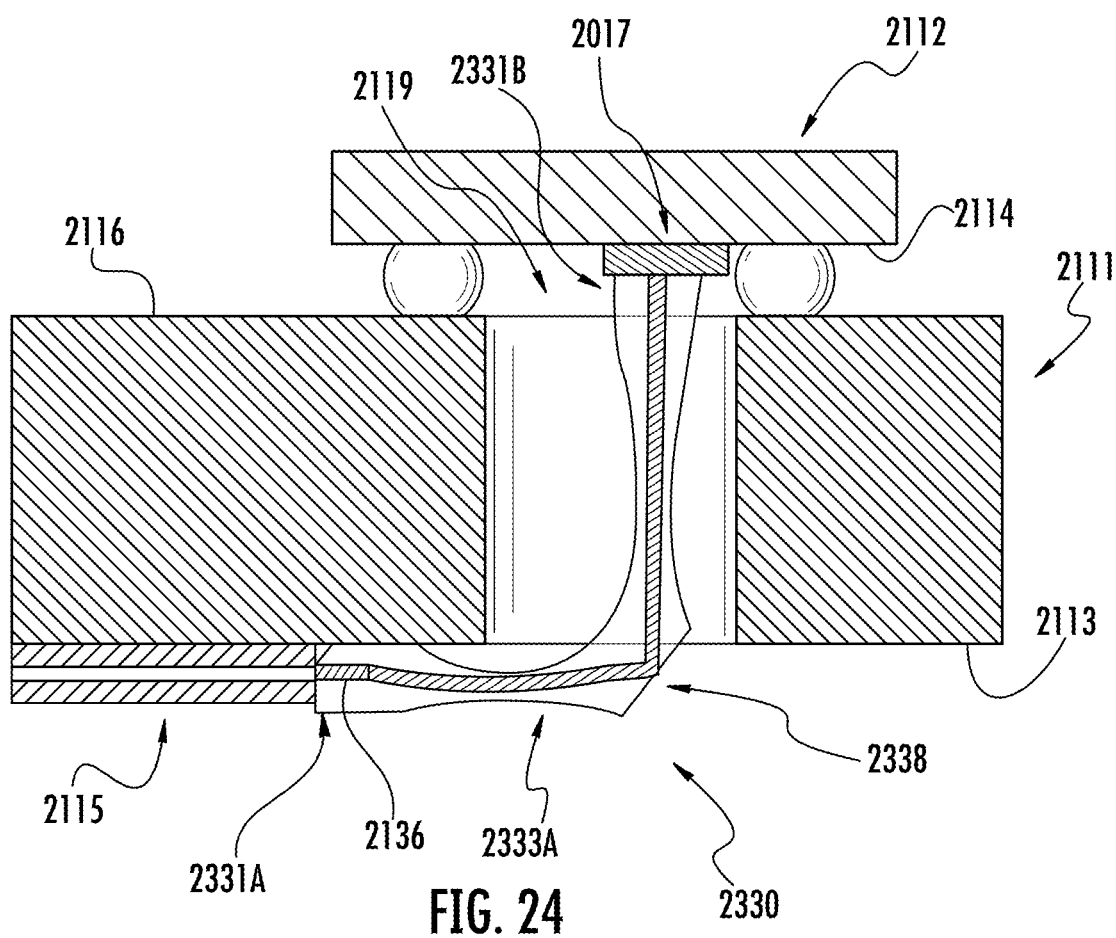
FIG. 24 schematically depicts a side view of an example optical interconnection assembly including an example right-angle glass interconnection substrate partially disposed in a through-hole via of a base substrate and optically coupled to an optical chip, according to one or more embodiments described and illustrated herein.
Figure 25:
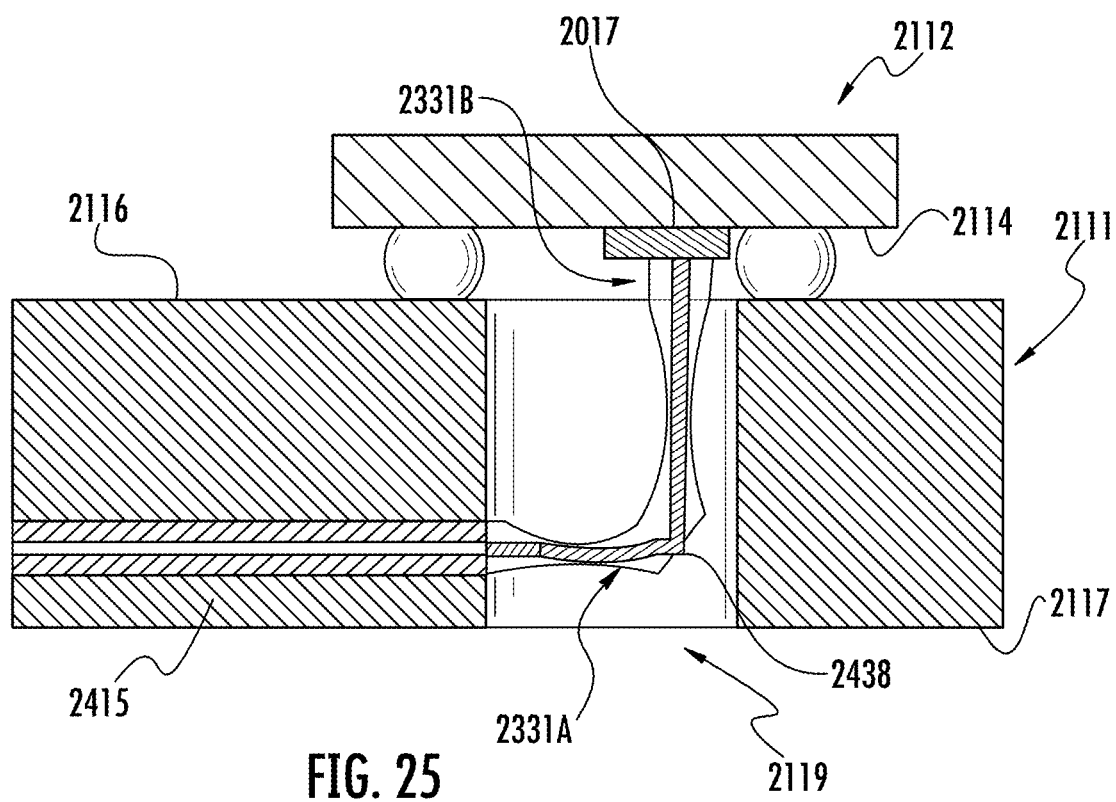
FIG. 25 schematically depicts a side view of an example optical interconnection assembly including an example right-angle glass interconnection substrate partially disposed in a through-hole via of a base substrate and optically coupled to an optical chip and embedded substrate optical waveguides, according to one or more embodiments described and illustrated herein.

The glass interconnection substrate 2330 can be used to optically connect with substrate optical waveguides 2115 that are located on a bottom surface 2113 of the base substrate 2111 as shown in FIG. 24, or with embedded substrate optical waveguides 2415 within the base substrate 2111 as shown in FIG. 25. The reflection surface 2338 enables a compact design that easily fits within a small size circuit board through-hole via 2119 below the optical chip 2112. This small size minimizes the amount of under-chip circuit board (i.e., base substrate 2111) surface area required by the optical interconnection, freeing up more circuit board area for traditional electrical interconnections and thermal dissipation.

During active alignment of the reflective glass interconnection substrate 2330 to the active optical components 2017 of the optical chip 2112, an amount of optical power coupled into the second plurality of interconnection optical waveguides 2315B may be measured to ensure optimal alignment. The second plurality of interconnection optical waveguides 2315B is optimally aligned with the active optical components when a maximum amount of optical power is coupled into the second plurality of interconnection optical waveguides 2315B.

Figure 26:
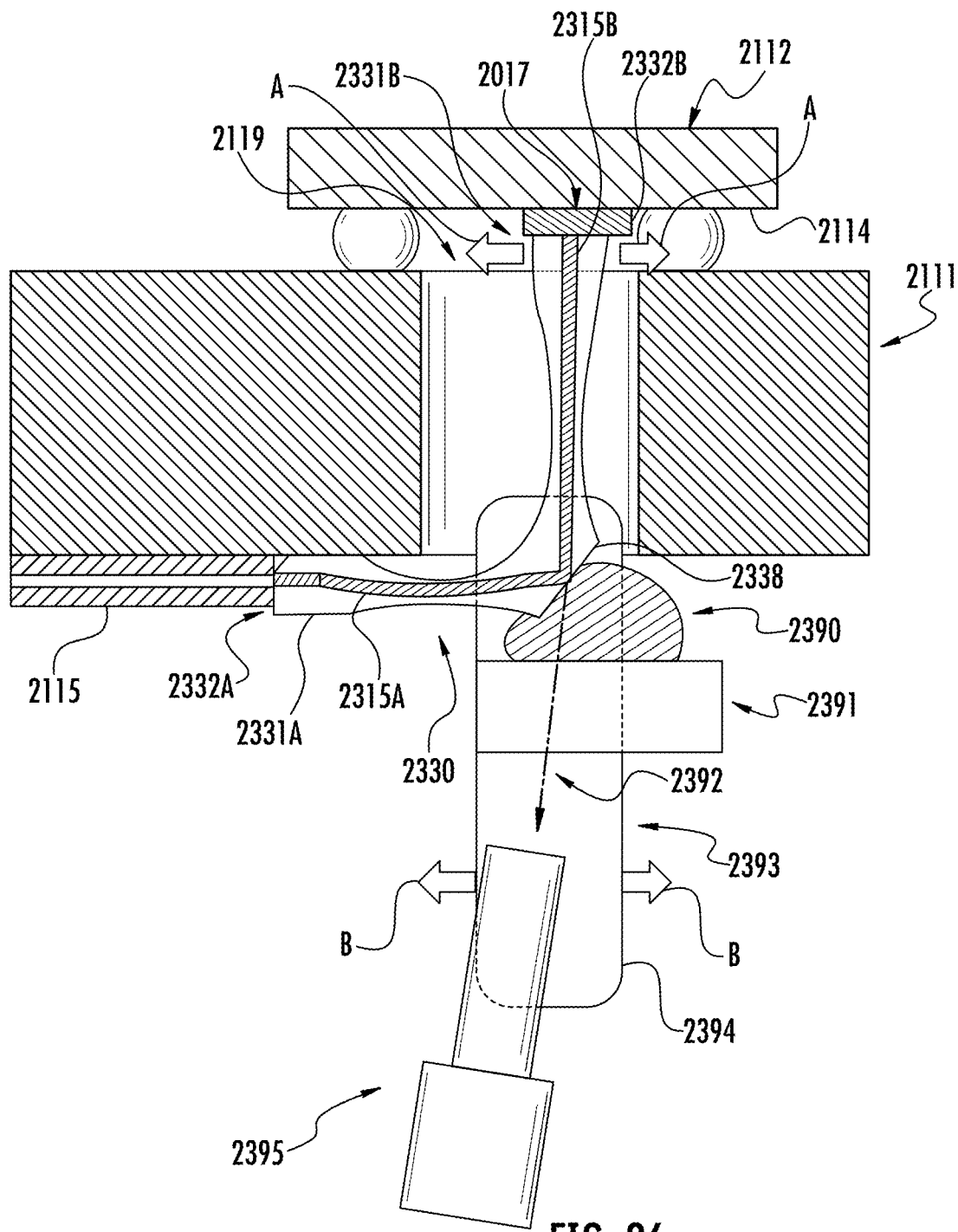
FIG. 26 schematically depicts a side view of an example method of aligning a right-angle glass interconnection substrate with respect to one or more active optical components of an optical chip, according to one or more embodiments described and illustrated herein.
Figure 27:
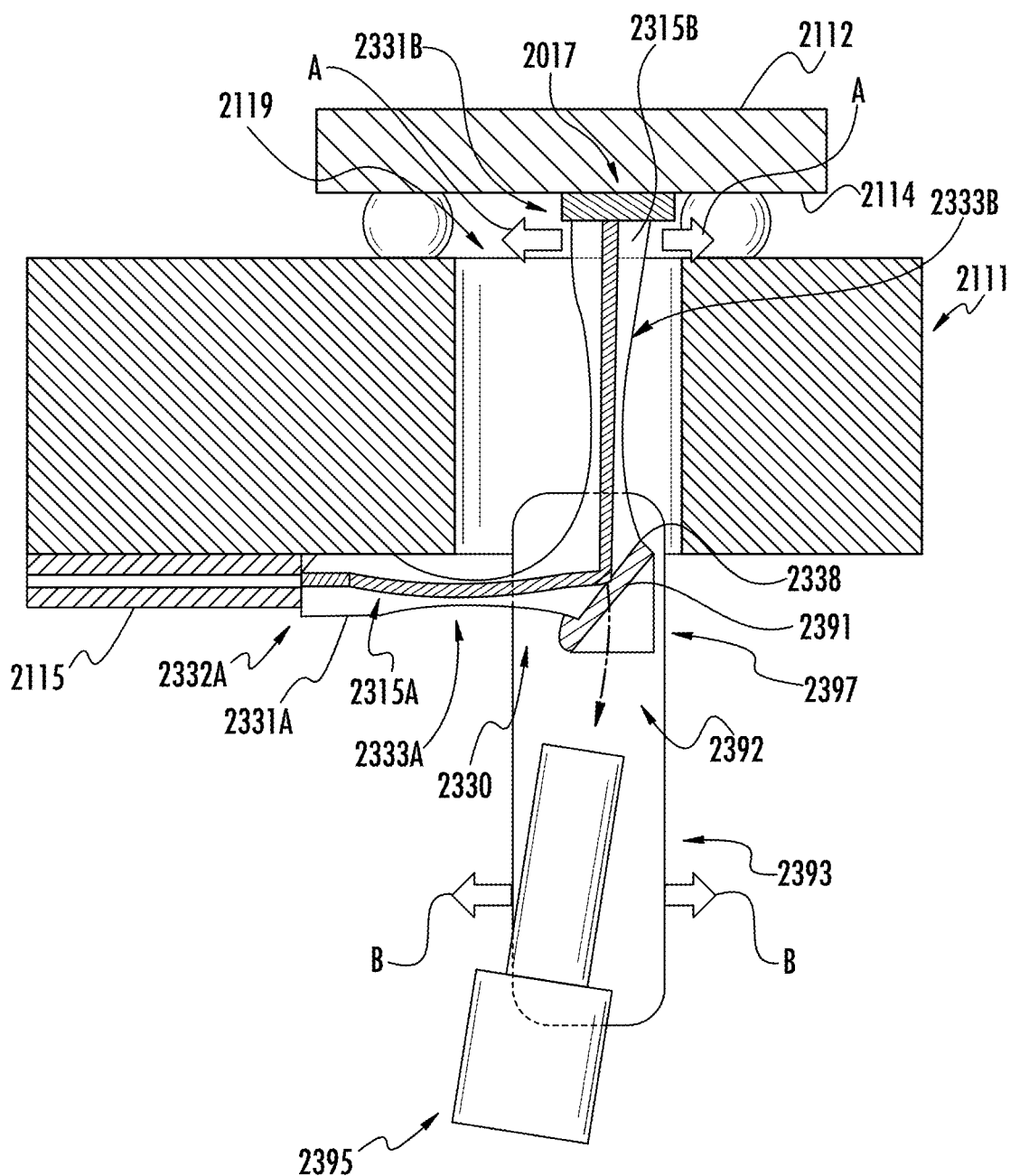
FIG. 27 schematically depicts an example method of aligning a right-angle glass interconnection substrate with respect to one or more active optical components of an optical chip, according to one or more embodiments described and illustrated herein.

One example solution to measure coupled optical power is to apply an index-matching material 2390 on the reflection surface 2338 to temporarily defeat the right angle reflection, as shown in FIG. 26. The index matching material 2390 can be applied to a glass sheet 2391 as shown in FIG. 26, or to a prism 2397 as shown in FIG. 27 that is then brought into close proximity to the reflection surface 2338 so that it completely wets the reflection surface 2338. Light 2392 from one or more active optical components 2017 that is coupled into one or more pre-written second interconnection optical waveguides 2315B is detected by a broad area photodetector 2395 so that during active alignment, the location of the glass interconnection substrate 2330 associated with a maximum coupled power can be detected as its lateral position is shifted using a positioning gripper 2393 as indicated by arrows A. Inversely, light may be coupled into one or more of the first interconnection optical waveguides 2315A with an external light source, e.g. a laser or light emitting diode, and may then be detected with an active optical component 2017 configured as a receiving device, such as a photodiode. Because the index match between the glass material and the index matching material 2390 is not perfect, minor light refraction will occur at the glass-fluid interface, but this bending angle can be taken into consideration in the optical design of the measurement setup.

Index matching materials (e.g., fluids, gels, oils, and elastomeric materials (e.g., transparent silicones, polytetrafluoroethylene) that provide a good match to glass (n ~1.45) are often sticky and difficult to completely remove from surfaces after application. However, an exact match to glass is not required. Instead, any liquid with a close match to glass is sufficient to defeat reflections at the reflection surface 2338 configured as a TIR surface. The following non-limiting fluids provide indices of refraction that are sufficiently close to glass:

n-Propyl alcohol: n=1.385
Isopropyl alcohol: n=1.377
Methyl alcohol: n=1.329

Index matching material may be dispensed to the reflection surface 2338 using a small tube (not shown) that is attached to the positioning gripper 2393 that also holds the glass interconnection substrate 2330. In this way, the index matching material 2390 can be easily applied to just the location where it is needed for alignment. After alignment is completed, removal of the index matching material 2390 from the reflection surface 2338 can be accelerated by blowing air, $N_2$ or other gasses on the reflection surface 2338 from the index matching dispensing tube, or separate but collocated dedicated tube. In some embodiments, one or more thin film layers (not shown) may be disposed between the index matching material and the reflection surface. These one or more thin film layers may act as a release sheet film that allow the index matching material to be easily removed by simply lifting the release sheet film off of the reflection surface.

In FIGS. 26 and 27, the pre-written second interconnection optical waveguide 2315B (i.e., a first pre-written optical waveguide segment) is shown following a path that extends directly below the active optical component 2017. In this case, light from the active optical component 2017 that is not completely coupled into the second interconnection optical waveguide 2315B will tend to propagate downward, diffracting as it roughly follows the path of the pre-written waveguide even though it is not being guided by it. A portion of this unguided light will escape through the wetted reflection surface 2338 and eventually arrive at the photodetector 2395 where it contributes an unwanted error signal. To reduce the amount of unguided light from the active optical component 2017 that arrives at the photodetector 2395, the path of the second interconnection optical waveguide 2315B can be angled away from the surface normal to the optical chip 2112. The photodetector 2395 can then be positioned in an angular region away from the reflection surface 2338 that captures light from the first interconnection optical waveguide 2315B but not from the unguided normal emission from the active optical component 2017.

Figure 28C:
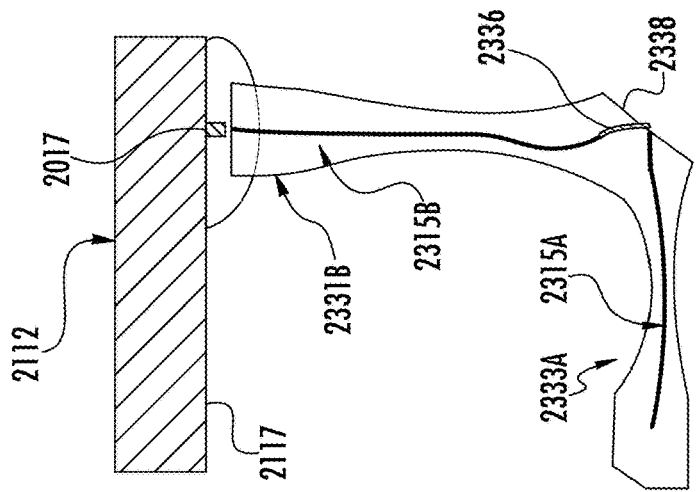
FIGS. 28A-28C schematically depict an example method of aligning a right-angle glass interconnection substrate with respect to one or more active optical components of an optical chip, and writing one or more laser written waveguides proximate a reflection surface, according to one or more embodiments described and illustrated herein.
Figure 28B:
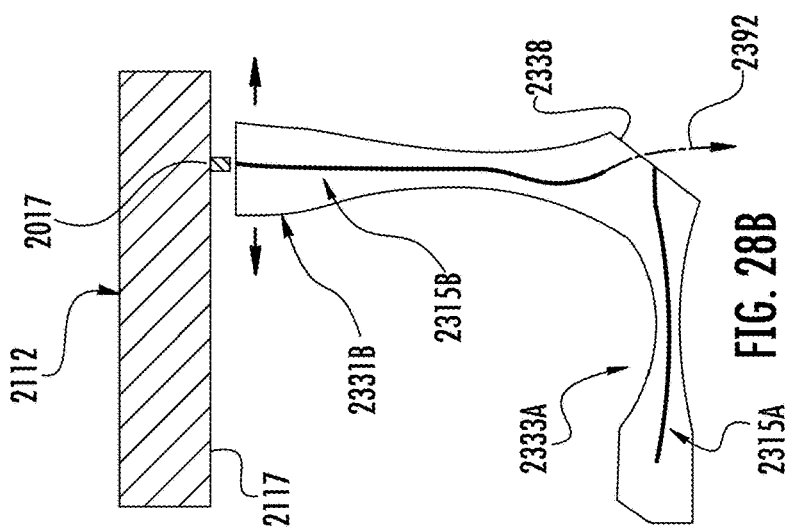
Figure 28A:
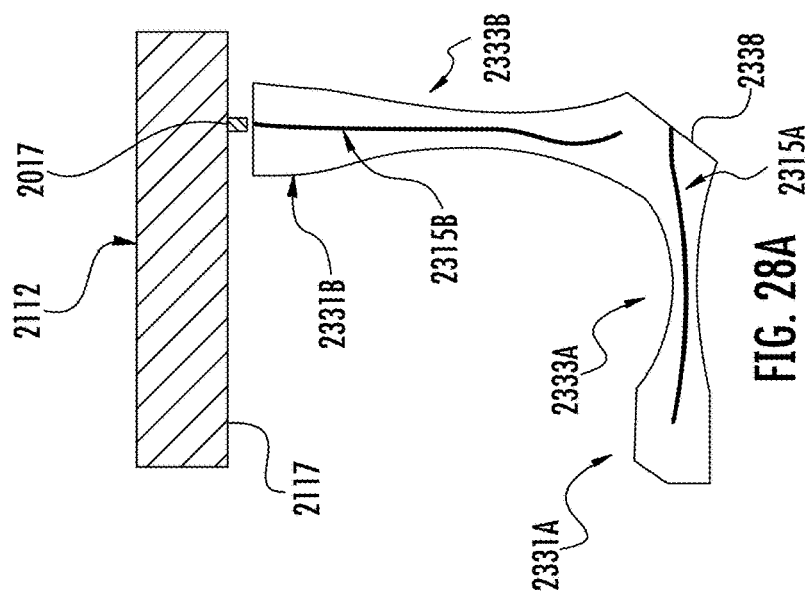

Referring to FIG. 28A, in another solution, the pre-written second interconnection optical waveguide 2315B may be written close to the reflection surface 2338 but not right up to it. Rather, a small turn is provided in the path of the second interconnection optical waveguide 2315B near the reflection surface 2338 that tilts the second interconnection optical waveguide 2315B toward the reflection surface 2338 normal. After light from the active optical component 2017 exits the second interconnection optical waveguide 2315B, it diffracts as it passes through the glass interconnection substrate 2330. Because of the small waveguide turn, the diffracted light strikes the reflection surface 2338 surface at too steep an angle to be reflected. Instead, the light 2392 refracts through the reflection surface 2338 and is captured by a photodetector device (not shown) as shown in FIG. 28B. After alignment and attachment, a new laser written optical waveguide segment 2336 is created with a small bend in the opposite direction from the first bend, as shown in FIG. 28C. This small bend tilts the optical waveguide away from the surface normal and terminates at the reflection surface 2338 at the location where it meets the pre-written first interconnection optical waveguide 2315A that extends within the glass interconnection substrate 2330 roughly parallel to the plane of the base substrate. The angle of the new laser written optical waveguide segment 2336 at the reflection surface 2338 is sufficient to enable total reflection of light into the first interconnection optical waveguide 2315A.

Figure 29A:
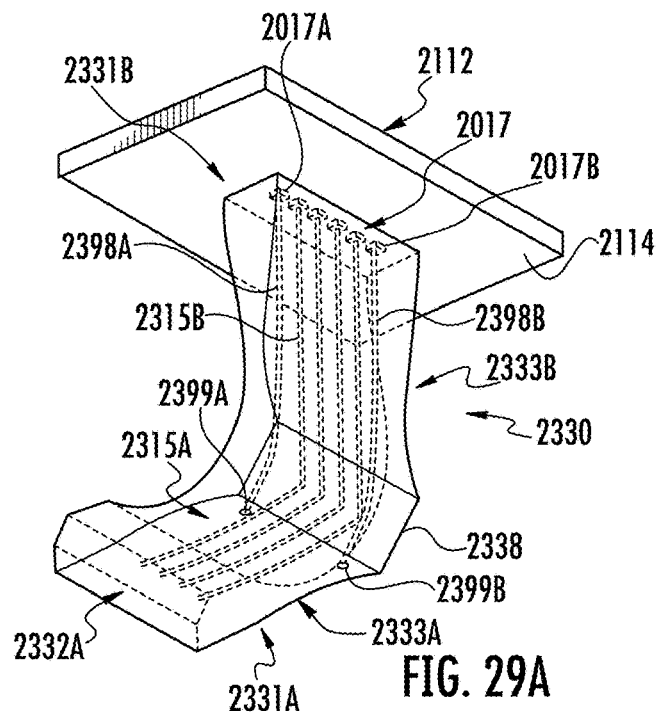
FIG. 29A schematically depicts a perspective view of an example right-angle glass interconnection substrate having alignment active optical components and alignment optical waveguides, according to one or more embodiments described and illustrated herein.

Referring now to FIG. 29A, additional active optical components devices 2017A, 2017B (e.g., VCSELs and detectors) used solely for alignment processes may be fabricated on the optical chip 2112 in regions dedicated to optical interconnection because photolithographic processes enable fabrication of additional devices at no extra cost. Further, the regions around these active optical components 2017 are often not fully populated due to the large size of optical interconnection structures relative to the small size of the optical waveguides they contain.

Figure 29B:
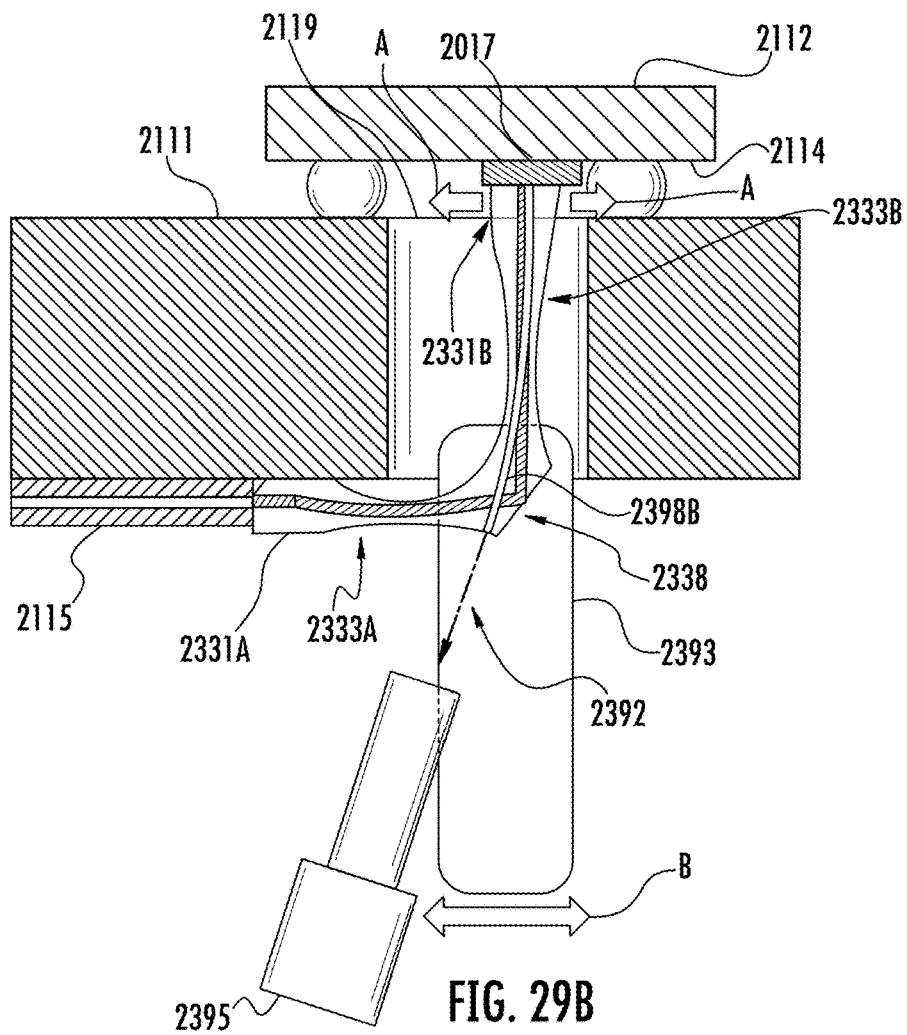
FIG. 29B schematically depicts an example method of aligning the right-angle glass interconnection substrate of FIG. 29A with respect to one or more active optical components of an optical chip, according to one or more embodiments described and illustrated herein.

Additional alignment active optical components 2017A, 2017B may be used to couple light into additional pre-written optical waveguides 2398A, 2398B within a glass interconnection substrate 2330, where the additional pre-written optical waveguides 2398A, 2398B are dedicated to the alignment of the glass interconnection substrate 2330 to the active optical components 2017 instead of data transmission to an external transceiver. As an example, two additional alignment optical waveguides 2398A, 2398B can be pre-written at outboard locations of the pre-written second plurality of interconnection optical waveguides 2315B. The alignment active optical components 2017A, 2017B may emit light into the alignment optical waveguides 2398A, 2398B. These alignment optical waveguides 2398A, 2398B may be routed within the glass interconnection substrate 2030 so that they intercept the surface of the substrate at locations 2399A, 2399B at a steep angle. As shown in FIG. 29B, this allows light 2392 from the alignment optical waveguides 2398A, 2398B to propagate into an external photodetector 2395 so that power measurements can provide feedback to an active alignment system. The amount of optical power may be measured as the position of the glass interconnection substrate 2030 is shifted as indicated by arrows A to determine the maximum optical power and therefore the optimal position of the glass interconnection substrate 2030 with respect to the optical chip 2112.

Figure 30A:
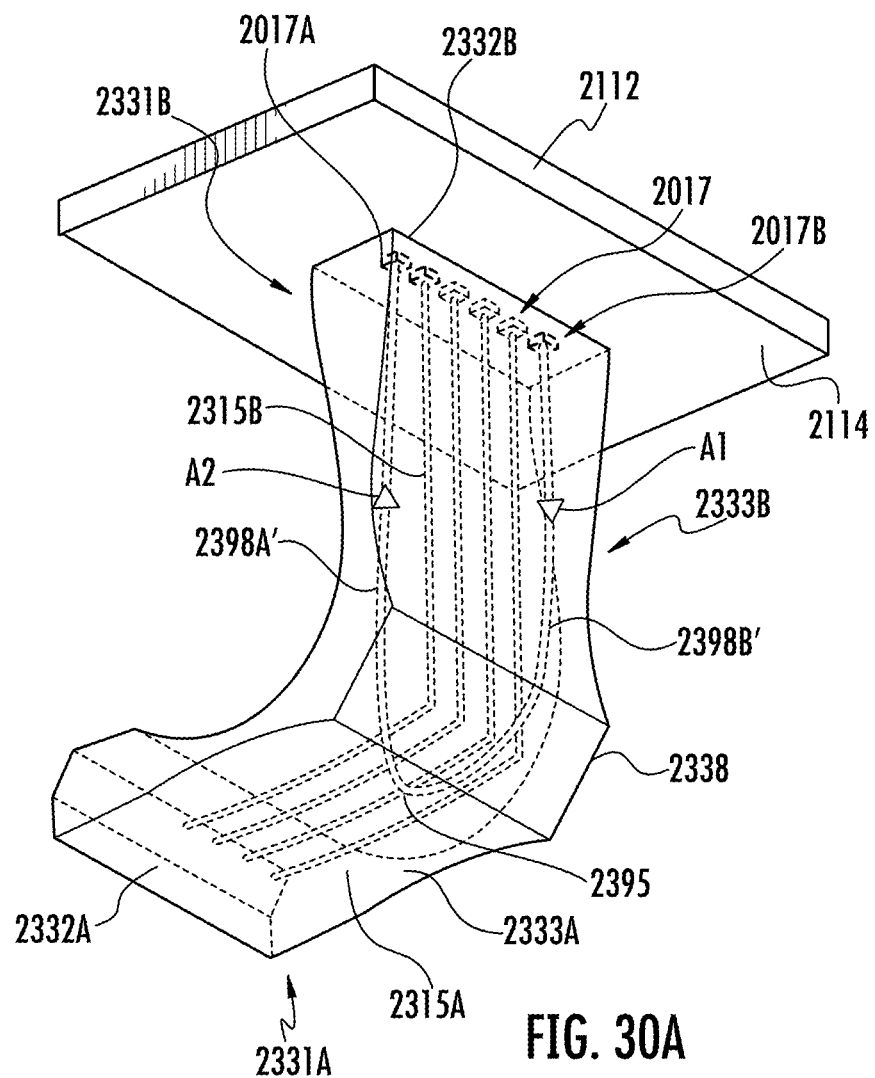
FIG. 30A schematically depicts a perspective view of an example right-angle glass interconnection substrate having alignment active optical components and alignment optical waveguides, according to one or more embodiments described and illustrated herein.
Figure 30B:
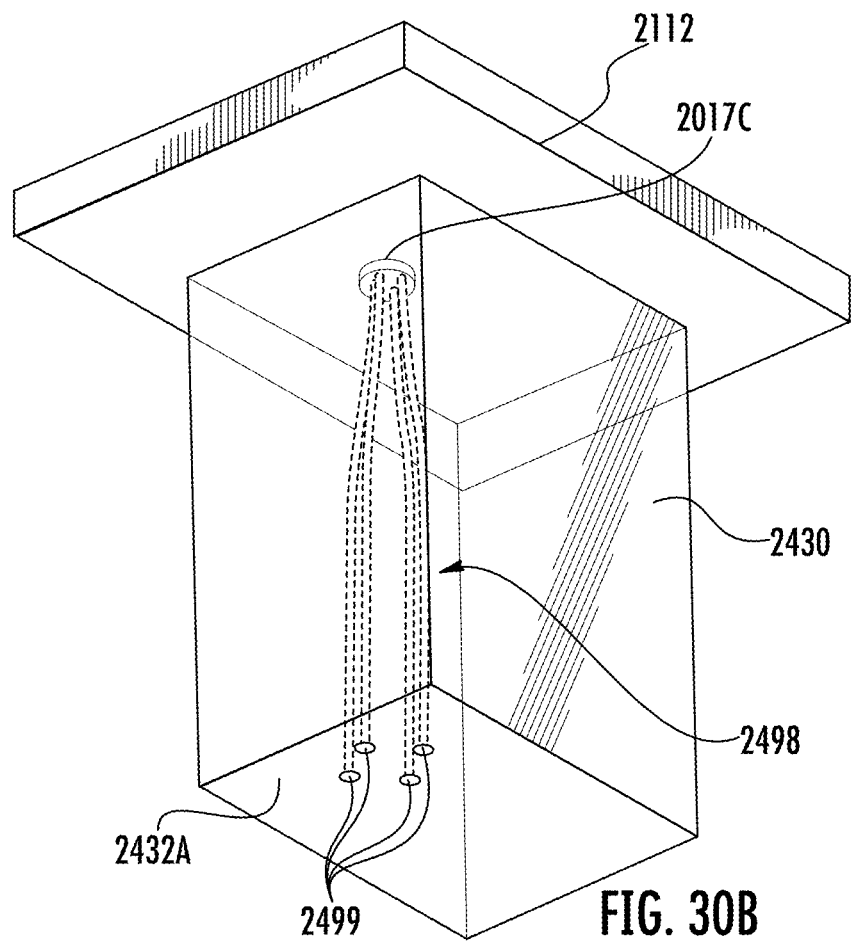
FIG. 30B schematically depicts a perspective view of an example glass interconnection substrate having an alignment active optical component and a plurality of alignment optical waveguides, according to one or more embodiments described and illustrated herein.
Figure 30C:
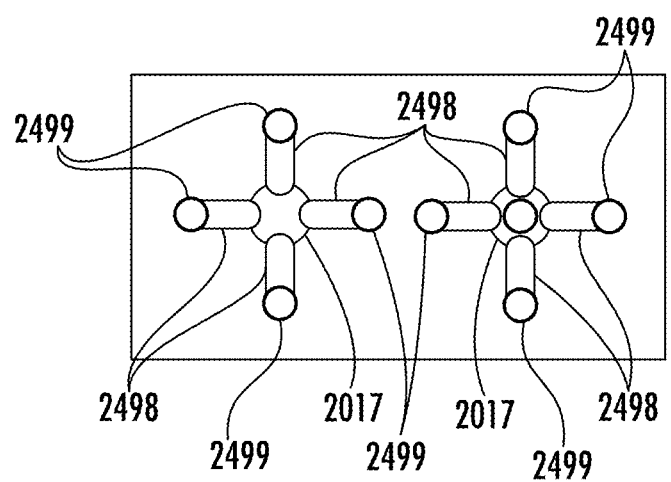
FIG. 30C schematically depicts a bottom view of the example glass interconnection substrate depicted in FIG. 30B according to one or more embodiments described and illustrated herein.

FIGS. 30A-30C schematically depict additional alignment techniques. Referring to FIG. 30A, in a loopback configuration, light A1 from an alignment active optical component 2017B configured as an emitter is coupled into one alignment optical waveguide 2398B', which reflects off a substrate surface 2395 and couples light A2 into a second alignment optical waveguide 2398A' that is directed to an alignment active optical component 2017A configured on the optical chip 2112 configured as a photodetector. During the alignment process, the glass interconnection substrate 2330 is moved until maximum coupled power is detected at the detector. Alternatively, if the laser written optical waveguide can create high index delta waveguides, a full 180° turn could be incorporated inside the glass interconnection substrate 2330.

Referring now to FIGS. 30B and 30C, in another approach, multiple pre-written alignment optical waveguides 2498 are routed within a glass interconnection substrate 2430 from a location in close proximity to an active optical component 2017 on an optical chip 2112 acting as an optical source. FIG. 30B is a perspective view of the glass interconnection substrate 2340 coupled to the optical chip 2112. FIG. 30C is a bottom view of the glass interconnection substrate 2340 depicted in FIG. 30B. It is noted that the glass interconnection substrate 2430 is schematically depicted as a generic glass block in FIG. 30B. It should be understood that the glass interconnection substrate 2430 may be configured as the L-shaped glass interconnection substrates discussed herein. The pre-written alignment optical waveguides 2498 extend within the glass interconnection substrate 2430 to a surface 2432A of the glass interconnection substrate 2340 where all the waveguide ends 2499 may be viewed simultaneously using a vision system. Light is emitted by the alignment active optical component 2017C.

As the glass interconnection substrate 2340 is laterally displaced during the alignment process, light is coupled most strongly into the alignment optical waveguide 2498 that is positioned closest to the alignment active optical component 2017C. A vision system monitors the amount of power coupled into each alignment optical waveguide 2498 at the waveguide ends 2499 and then makes a determination on which direction to move to equalize the amount of power coupled into all alignment optical waveguides 2498. When this condition is met for two outboard active optical components, all alignment optical waveguides 2498 are in a known position relative to all alignment active optical components 2017C. As a result, other pre-written optical waveguides in the glass interconnection substrate that are dedicated for data transmission to other transceivers will also be properly aligned for low-loss coupling.

One potential issue with coupling TIR (or otherwise reflective) glass interconnection substrates to optical chips is that the position of the glass interconnection substrate in a through-hole of a base substrate beneath the optical chip makes it difficult to laser write optical waveguide in regions of the glass interconnection substrate that are close to the active optical components. If the laser written optical waveguides are written from below the optical chip so that the beam is directed upward, at least a portion of the beam's energy will be coupled into the optical chip, leading to unwanted heating and the potential for damage.

Figure 31A:
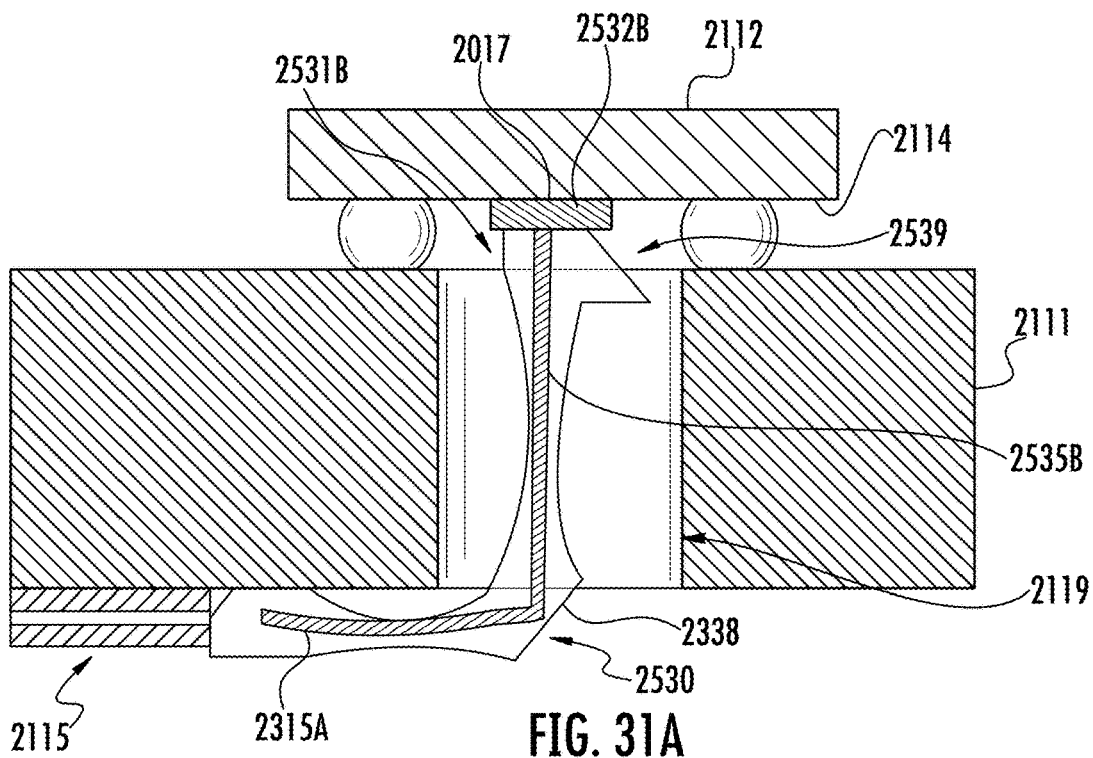
FIG. 31A schematically depicts a side view of an example optical interconnection assembly including an example right-angle glass interconnection substrate partially disposed in a through-hole via of a base substrate and optically coupled to an optical chip, wherein the right-angle glass interconnection substrate comprises a total internal reflection surface, according to one or more embodiments described and illustrated herein.

In embodiments, the shape of the glass interconnection substrate may be modified to include additional TIR structures (or other reflective structures) that are positioned in close proximity to the active optical component of the optical chip. Referring to FIG. 31A, an example glass interconnection substrate 2530 having a reflection surface 2338 is disposed within a through-hole 2119 of a base substrate 2111 and coupled to an active optical component 2017 disposed on an optical chip 2112 coupled to the base substrate 2111. The glass interconnection substrate 2530 comprises one or more pre-written second interconnection optical waveguides 2535B that do not fully extend to a second end surface 2532B of a second end 2531B. However, the presence of the optical chip 2112 and the position of the second end 2531B prevents one or more additional laser written optical waveguides from being written to optically couple the one or more second interconnection optical waveguides to the one or more active optical components 2017.

Figure 31B:
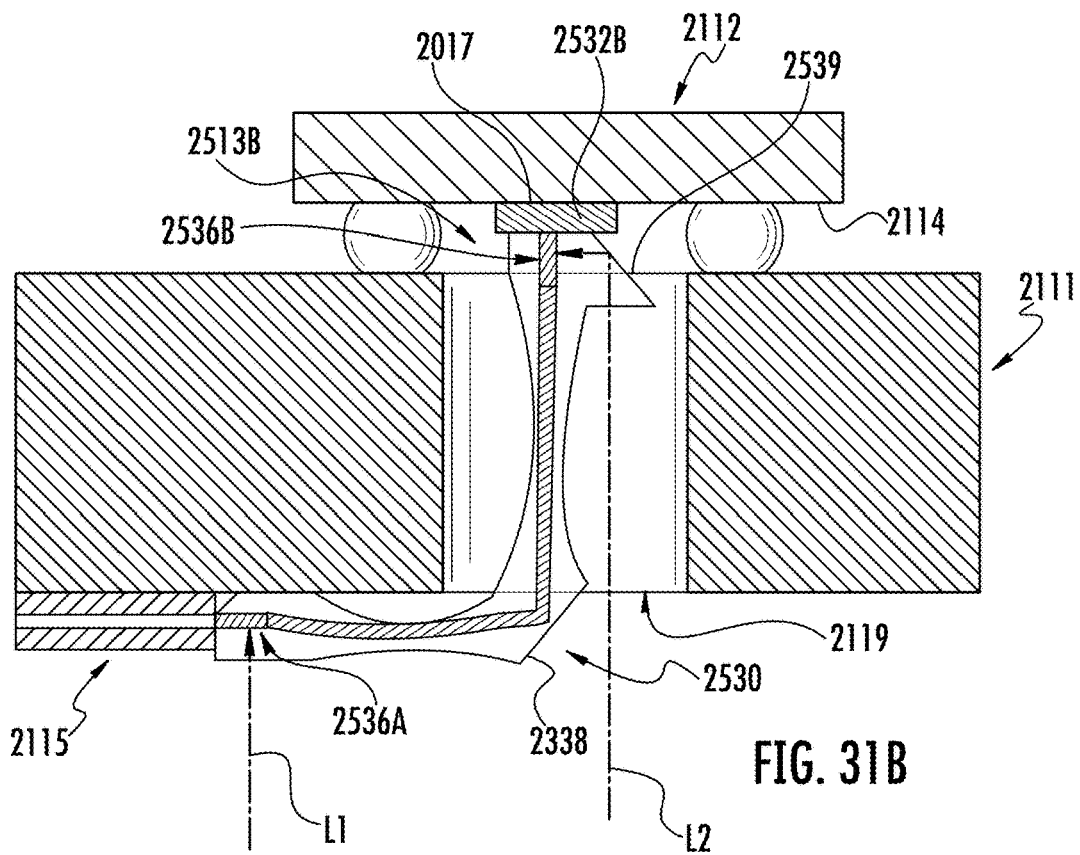
FIG. 31B schematically depicts an example method of writing one or more laser written optical waveguides in the right-angle glass interconnection substrate depicted in FIG. 31A, according to one or more embodiments described and illustrated herein.

The second end 2531B further includes an additional TIR surface 2539 (or other reflective structure) extending from the second end surface 2532B. Referring to FIG. 31B, the additional TIR surface 2539 is angled such that a laser beam L2 (e.g., a femtosecond pulse laser beam) directed upward through the through-hole 2119 are re-directed through a right angle turn by TIR at the additional TIR surface 2539 so that the laser beam propagates parallel to the optical chip. The focus of the laser beam is such that the beam waist is within the second end surface 2532B so the one or more laser written optical waveguides 2536B may be written. A laser beam L1 may be used to form one or more laser written optical waveguides 2536A.

Figure 31C:
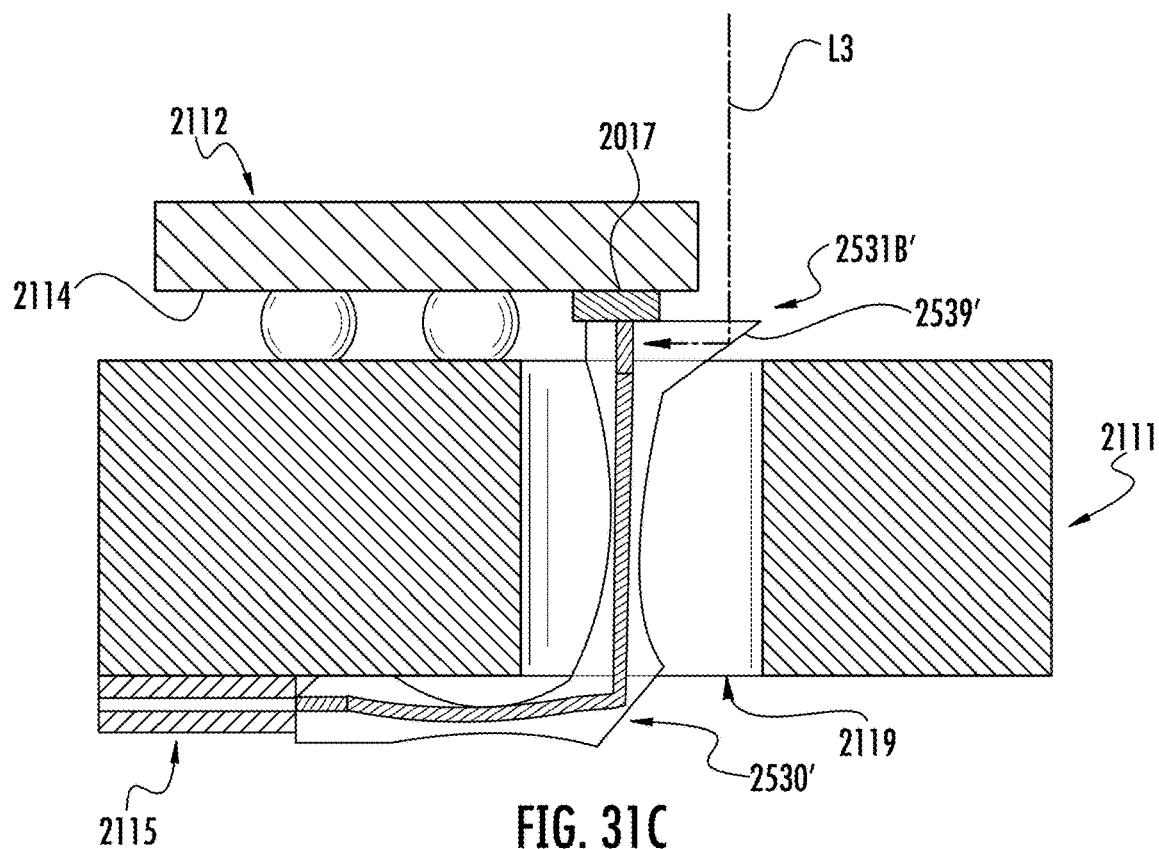
FIGS. 31C and 31D schematically depict side views of example optical interconnection assemblies including an example right-angle glass interconnection substrate partially disposed in a through-hole via of a base substrate and optically coupled to an optical chip, wherein the right-angle glass interconnection substrate comprises a total internal reflection surface, according to one or more embodiments described and illustrated herein.
Figure 31D:
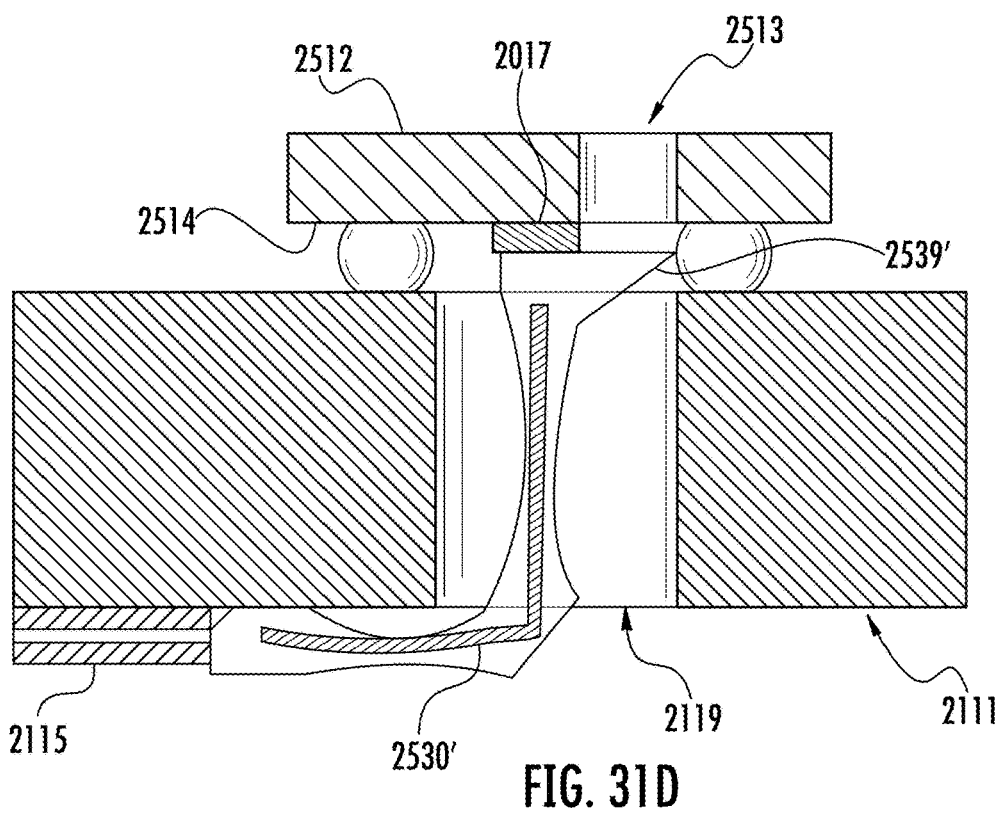

Referring to FIG. 31C, in another design variation, the additional TIR surface 2539' at the second end 2531B' is oriented so that it extends beyond an edge of the optical chip 2112. A laser beam L3 directed down toward the optical chip 2112 from above is turned by the additional TIR surface 2539' so that the laser beam L3 propagates parallel to the optical chip 2112. Referring to FIG. 31D, in cases where the 2017 is located toward the center of an optical chip 2512, a through-hole 2513 may be created in the optical chip 2512 to enable access to the additional TIR surface 2539' by a laser beam directed down toward the optical chip from above the chip.

Figure 32A:
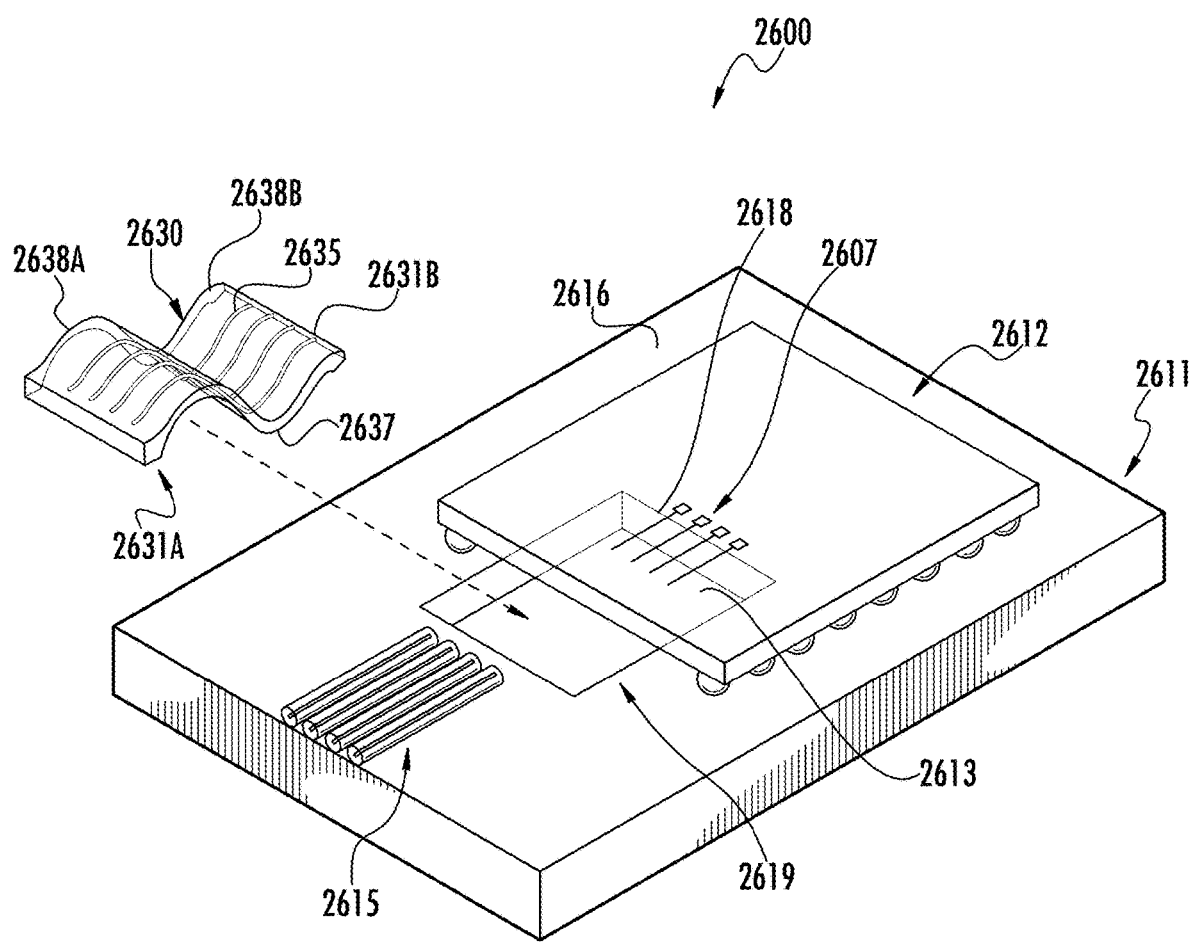
FIG. 32A-32D schematically depict perspective views of an assembly process of an example optical interconnection assembly including a base substrate, an optical chip coupled to a surface of the base substrate, and a glass interconnection substrate disposed within a well of the base substrate and beneath the optical chip, according to one or more embodiments described and illustrated herein.

Under-chip glass interconnection substrates may be utilized for providing optical connections to planar waveguides or active optical components that are located on the underside of a flip-chip-mounted optical chip. Referring now to FIG. 32A, an optical interconnection assembly 2600 includes a base substrate 2611, an optical chip 2612, and a glass interconnection substrate 2630. The optical chip 2612 may be flip-chip mounted to a surface 2616 of the base substrate 2611. The optical chip 2612 comprises active optical components 2607 that are optically coupled to chip optical waveguides 2618 at a bottom surface of the optical chip 2612. The base substrate 2611 includes a well 2619 within the surface 2616, the well having a recessed floor and sidewalls. The optical chip 2612 is at least partially positioned over the well 2619. The well 2619 is configured to receive the glass interconnection substrate 2630.

The glass interconnection substrate 2630 may be drawn or pressed from a glass sheet to have a serpentine side profile as shown in FIG. 32A. The example glass interconnection substrate 2630 has a first peak 2638A proximate a first end 2631A and a second peak 2638B proximate a second end 2631B. A valley 2637 is disposed between the first peak 2638A and the second peak 2638B. The glass interconnection substrate 2630 includes pre-written interconnection optical waveguides 2635 at an upper surface that are formed by any method, such as, without limitation, laser written, ion exchange, or deposited dielectric waveguide technologies. The glass interconnection substrate 2630 may include many of the features described above for chip edge interconnection substrates (e.g., slots, flats, bends, holes, grooves, notches, and the like).

The tip of the glass interconnection substrate 2630 that will extend beneath the optical chip 2612 may include features that enable coupling of light in a direction parallel to the plane of the optical chip 2612, such as waveguides or waveguide tapers for forming a directional coupler or tapered waveguide interface 2613 with the chip optical waveguides 2618. Alternatively, the glass interconnection substrate 2630 may be provided with tip features at an optical coupling end of the interconnection optical waveguides that enable coupling with active optical components or grating couplers along an optical path that is normal or nearly normal to the optical chip.

Figure 32B:
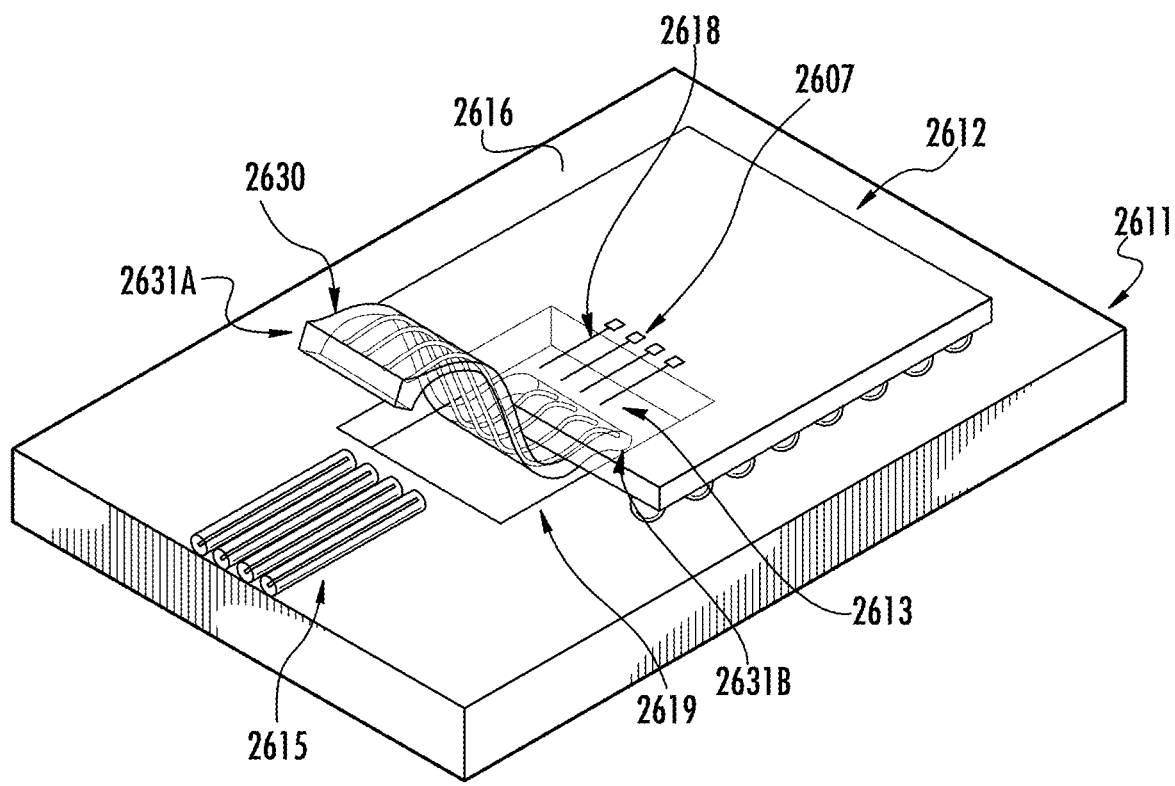

FIG. 32B schematically depicts the glass interconnection substrate 2630 during insertion into the well 2619 of the base substrate 2611, wherein the glass interconnection substrate 2630 is rotated so that the second end 2631B fits into a slot formed by the well 2619 and the optical chip 2612 that covers the well 2619. UV curable adhesive (not shown) may be applied to the first end 2631A and/or the second end 2631B prior to or after insertion into the well 2619. The glass interconnection substrate 2630 is designed to be thin and flexible, so that if necessary, it can bend slightly during insertion into the well 2619.

The well 2619 may include additional slots, ridges, holes, bosses, or stops that are located on the recessed floor or sidewalls of the well 2619 that aid in aligning the glass interconnection substrate 2630 during insertion into the well 2619, or hold it in place after insertion. The sidewalls, ends or bottom of the glass interconnection substrate 2630 may include mating tabs, slots, ridges, holes or bosses, so that these features engage well features to align or hold the glass interconnection substrate 2630 within the well 2619 prior to adhesive curing. Similar features may be integrated into the optical chip 2612 for precision alignment of the interconnection optical waveguides to the chip optical waveguides, gratings or active optical components associated with the optical chip 2612.

Figure 32C:
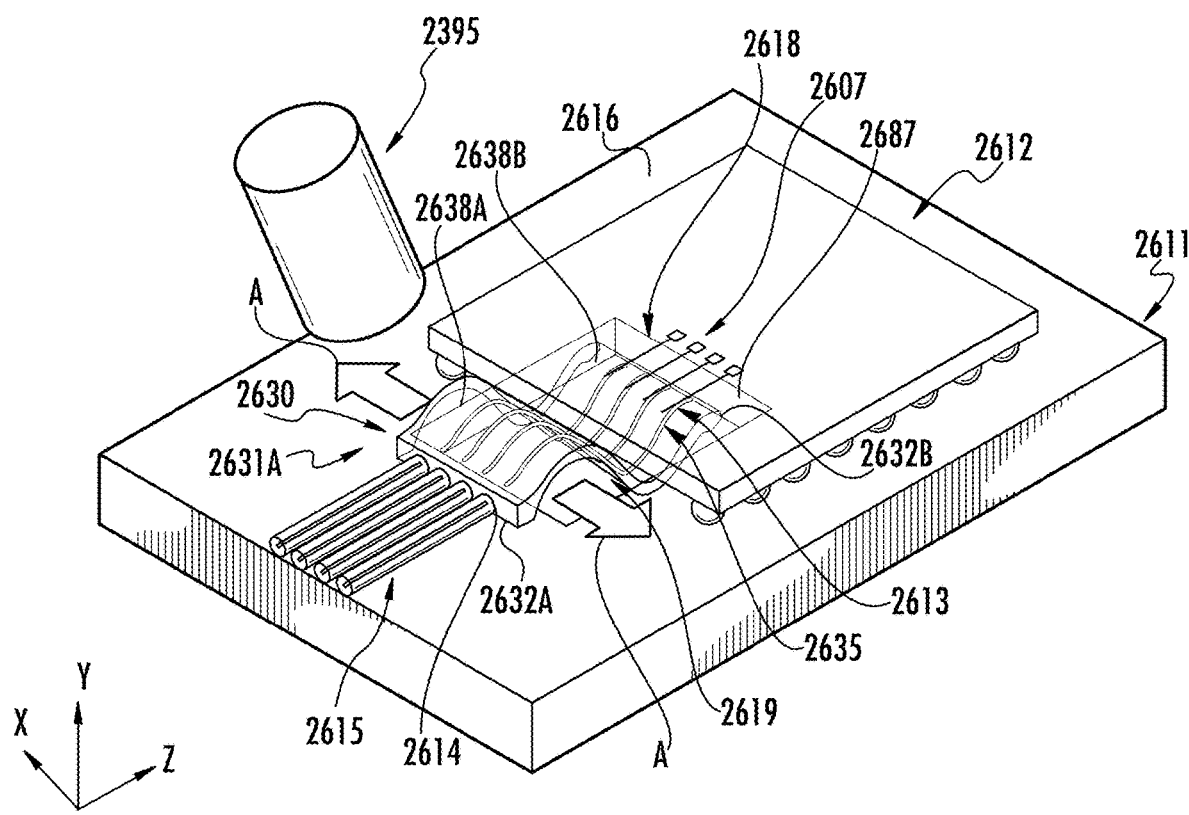

Referring to FIG. 32C, a first end surface 2632A of the first end 2631A contacts ends of the substrate optical waveguides 2615, and a second end surface 2632B of the second end 2631B contacts an end sidewall 2687 of the well 2619. Because the glass interconnection substrate 2630 is flexible, the spring force created by a portion of the serpentine glass interconnection substrate 2630 being inserted into the well 2619 causes the second end 2631B of the glass interconnection substrate 2630 to be forced upward into contact with the bottom side of the optical chip 2612. These spring forces may also be used to force glass interconnection substrate tabs, slots, ridges, holes, or bosses to be retained by mating features in the well 2619 or on the bottom surface of the optical chip 2612.

After the glass interconnection substrate 2630 is inserted into the well 2619, it can be moved left and right along the x-axis as indicated by arrows A so that the interconnection optical waveguides 2635 are aligned with the chip optical waveguides 2618 at the second peak 2638B. In this embodiment, the glass interconnection substrate 2630 employs taper or direction coupler interfaces at the second peak 2638B proximate the second end surface 2632B, since these interfaces can be made more tolerant to variations in z-axis overlap. A photodetector 2395 may be used to detect peak optical coupled power between active optical components 2607 or grating couplers (i.e., chip optical waveguides 2618) and visible interconnection optical waveguides 2635 on the glass interconnection substrate 2630 that are not blocked from view by the optical chip 2612. Alternatively, a vision system can identify fiducial marks on the optical chip 2612 and the glass interconnection substrate 2630 to determine when the interconnection optical waveguides 2635 beneath the optical chip are aligned, as described in more detail below.

A similar photodetector or vision system can be used if two-dimensional (x-axis and z-axis) and theta-y alignment are required to efficiently couple optical power into interconnection optical waveguides 2635. In the illustrated embodiment, the chip optical waveguides 2618 are oriented parallel to the z-axis, the y-axis is defined as normal to the optical PCB, and the x-axis is perpendicular to both the z- and y-axes. In all cases, the flexible bent-shape of the glass interconnection substrate 2630 allows it to deform so that it comes into firm contact with the end surface 2614 of the substrate optical waveguides. One or more alignment fiducials may be utilized on the glass interconnection substrate 2630 for use by a vision system.

After one-dimensional or two-dimensional alignment of the glass interconnection substrate 2630, the adhesive applied to the glass interconnection substrate 2630, the optical chip 2612 and/or the well 2619 may be cured by shining light on the glass interconnection substrate. As an example, UV adhesive curing light may be directed at the glass interconnection substrate 2630 at a low angle relative to the base substrate 2611, so that it is guided, scattered or reflected along the length of the glass interconnection substrate 2630, curing the UV adhesive located under the optical chip 2612. The UV curable adhesive is also used to permanently bond the glass interconnection substrate 2630 to the base substrate 2611 near the location where the end surface 2614 of the substrate optical waveguides 2615 meet the glass interconnection substrate.

Figure 32D:
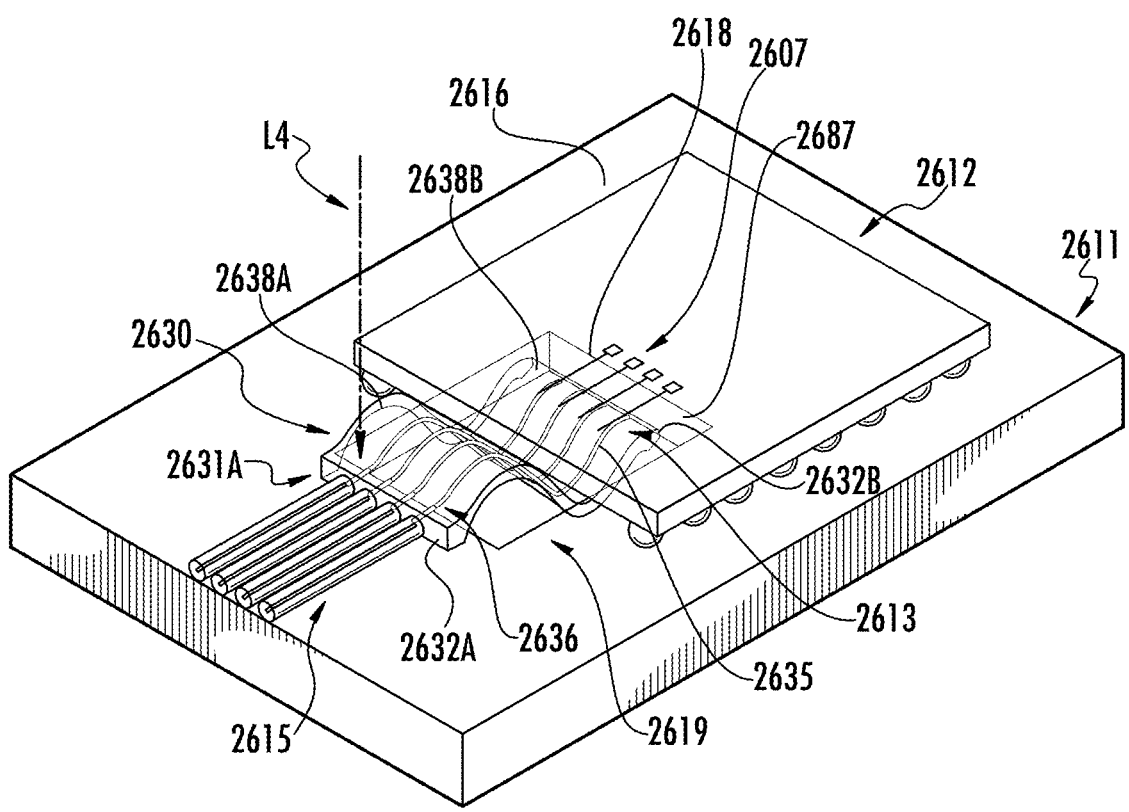

Referring to FIG. 32D, after the glass interconnection substrate 2630 is attached within the well 2619, laser written optical waveguides 2636 are formed within the under chip glass interconnection substrate using a laser beam L4 to optically couple the substrate optical waveguides 2615 and the pre-written interconnection optical waveguides 2635 within the glass interconnection substrate 2630.

Various under-chip glass interconnection substrate shapes may be utilized to provide spring force to hold the glass interconnection substrate in firm contact with the bottom surface of the optical chip. FIGS. 33A-33C schematically depict one or more substrate optical waveguides 2615 positioned on a surface 2616 of the base substrate 2611. FIG. 33A depicts the second end 2731B of a glass interconnection substrate 2730 inserted into a well 2619 of the base substrate 2611 such that it is beneath an optical chip 2612 having one or more chip optical waveguides 2618. The second end 2731B may be provided with different curved profiles on its top and bottom surfaces so that during rotation and insertion into the well 2619, the top surface of the second end 2731B comes into contact with the optical chip 2612. As the first end 2731A of the glass interconnection substrate is pushed downward, the middle of the glass interconnection substrate 2730 flexes so that the second end 2731B is forced upward to maintain firm contact with the optical chip 2612. The one or more interconnection optical waveguides 2735 are positioned at an upper surface of the glass interconnection substrate 2730 and are aligned with the one or more chip optical waveguides 2618 such that optical coupling between the one or more interconnection optical waveguides 2735 and the one or more chip optical waveguides 2618 is in a direction parallel to the optical chip 2612.

After bonding the glass interconnection substrate 2730 in place using UV curable adhesive, laser written optical waveguides 2736 may be formed within the glass interconnection substrate 2730 at the first end 2731A to link the one or more substrate optical waveguides 2615 to the one or more pre-written interconnection optical waveguides 2735 as shown in FIG. 33C.

FIGS. 34A-34C depict one or more substrate optical waveguides 2815 embedded within a base substrate 2811, as well as various example configurations for the glass interconnection substrate. It should be understood that the configurations depicted in FIGS. 34A-34B may also be employed in embodiments wherein the one or more substrate optical waveguides are disposed on a surface of the base substrate. These shapes may be pressed or drawn.

FIG. 34A depicts a glass interconnection substrate 2830 having an S-shaped bend disposed in a well 2819 of the base substrate 2811 that is deeper than the well 2619 depicted in FIGS. 33A-33C to accommodate the embedded substrate optical waveguides 2815. The end 2831 of the glass interconnection substrate 2830 contacts a bottom surface of the optical chip 2812 such that the one or more interconnection optical waveguides 2835 are aligned with the one or more chip optical waveguides 2818.

The end 2831' of the glass interconnection substrate 2830' depicted in FIG. 34B has a loop configuration such that an optical coupling end of the interconnection optical waveguides 2835' is located at the upper surface of the glass interconnection substrate 2830'. The interconnection optical waveguides 2835' are optically coupled to the chip optical waveguides 2818 at the optical coupling end. FIG. 34C depicts a glass interconnection substrate 2830" having a U-shaped bend.

In some embodiments, the glass interconnection substrate may be attached to the optical chip prior to attachment of the optical chip to the base substrate by a solder reflow process. An adhesive that survives flip-chip attachment solder reflow process conditions (e.g., Masterbond UV25) may be used to attach the glass interconnection substrate to the underside surface of the optical chip prior to optical chip solder reflow attachment to a base substrate.

Figure 35A:
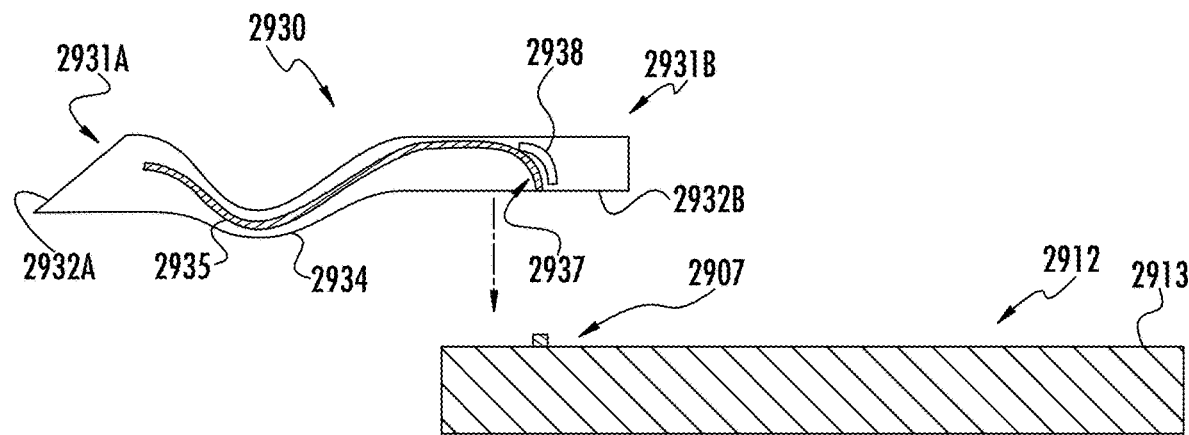
FIGS. 35A-35C and FIGS. 36A-36D schematically depict an example method of attaching a glass interconnection substrate to an optical chip prior to attaching the optical chip to a base substrate by a solder reflow process according to one or more embodiments described and illustrated herein.

FIG. 35A schematically illustrates a glass interconnection substrate 2930 prior to attachment to an optical chip 2912. The glass interconnection substrate 2930 includes a first end 2931A with a first end surface 2932A, a curved portion 2934, a second end 2931B with a second end surface 2932B, and one or more interconnection optical waveguides 2935. The optical chip 2912 includes one or more active optical components 2907 on a first surface 2913. In the illustrated embodiment, the second end surface 2932B is parallel to the first surface of the optical chip 2912. The one or more interconnection optical waveguides 2935 include a bent portion 2937 of a small radius such that the one or more interconnection optical waveguides 2935 terminate at the second end surface 2932B. Strong optical confinement of light within the bent portion 2937 is provided by a cavity 2938 formed within the glass interconnection substrate 2930 adjacent to the bent portion 2937. This cavity 2938 can be created using, for example a scanning focused laser beam that locally damages the glass. During a subsequent glass etching process, these damaged regions are etched away. The etching process leaves cavity sidewall surfaces smooth so that they do not contribute to scattering losses out of nearby waveguides.

Figure 35B:
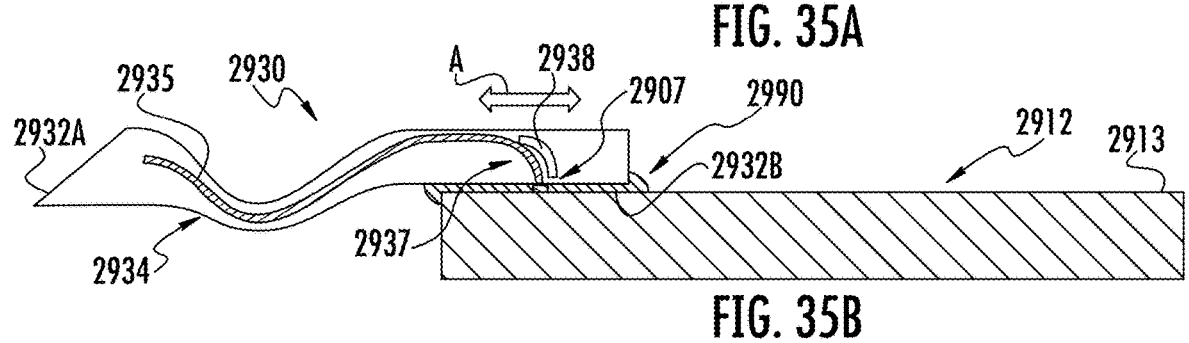
Figure 35C:
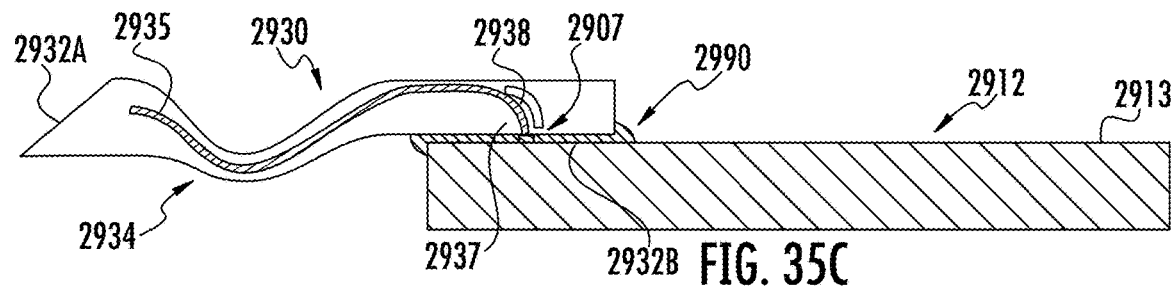

Referring to FIG. 35B, a two-dimensional and theta-y active alignment is utilized as indicated by arrow A to properly position the one or more interconnection optical waveguide locations at the second end surface 2932B to the active optical component 2907 (or waveguide grating locations in other embodiments). After alignment, the glass interconnection substrate 2930 is permanently attached to the optical chip 2912 by an adhesive capable of surviving the subsequent solder reflow process, as shown in FIG. 35C.

Figure 36A:
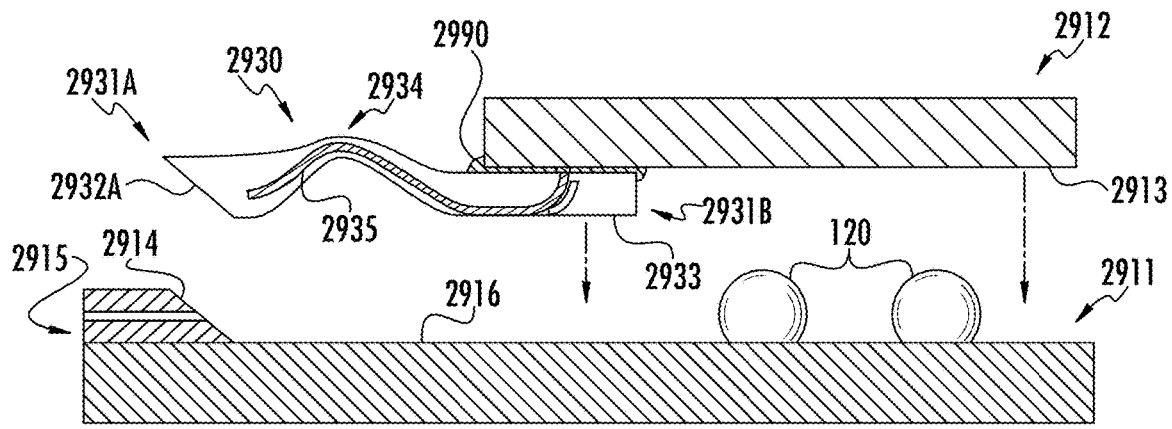
Figure 36B:
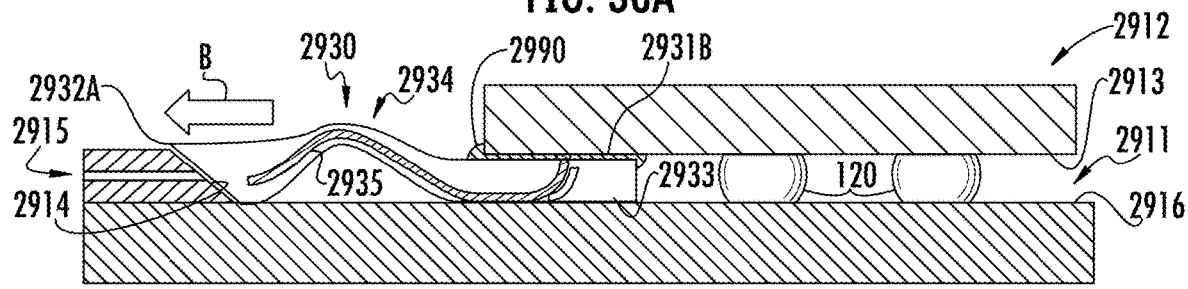

Next, referring to FIG. 36A, the glass interconnection substrate 2930/optical chip 2912 subassembly is flip-chip mounted on solder balls/bumps 120 or other attachment media present on a surface 2916 of a base substrate 2911. The subassembly is then biased so that the glass interconnection substrate 2930 is coarsely aligned with one or more substrate optical waveguides 2915, as indicated by arrow B. In the illustrated example, both the end surface 2914 of the one or more substrate optical waveguides 2915 and the first end surface 2932A of the glass interconnection substrate 2930 are angled such that they are non-orthogonal with respect to the surface 2916 of the base substrate 2911.

Figure 36C:
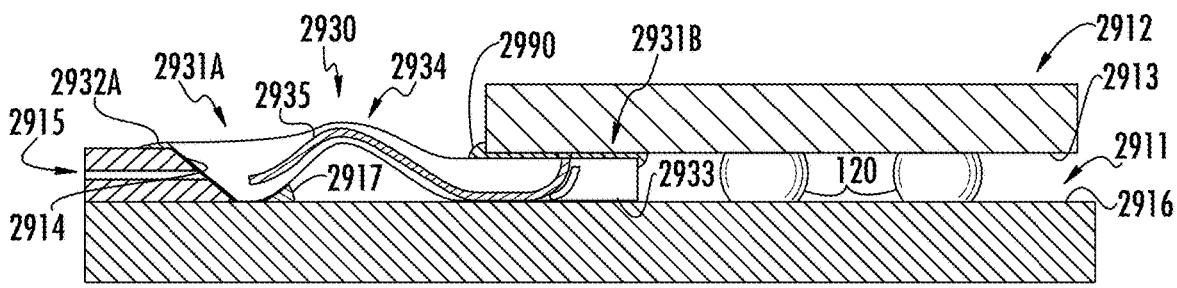
Figure 36D:
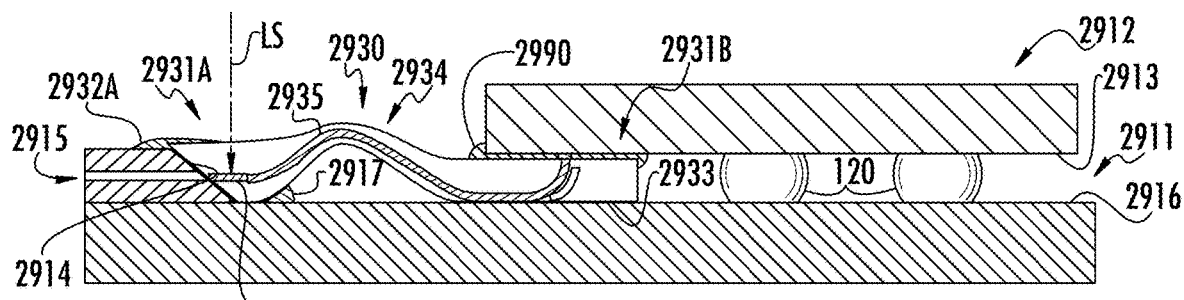

After a reflow process that attaches the optical chip 2912 to the base substrate 2911, the flexible glass interconnection substrate 2930 can be mechanically displaced so that it firmly contacts the end surface 2914 of the one or more substrate optical waveguides 2915 as shown in FIG. 36C (e.g., by applying downward force on the exposed curved portion 2934 of the glass interconnection substrate 2930). Adhesive 2917 is applied to the glass interconnection substrate 2930 to join it to the base substrate 2911, and is then cured. Referring to FIG. 36D, in some embodiments, laser writing of laser written optical waveguides 2936 within the glass interconnection substrate 2930 is performed to optically couple the one or more substrate optical waveguides 2915 with the one or more pre-written interconnection optical waveguides 2935.

In embodiments, the glass interconnection substrate may be attached to the optical chip after the solder reflow process. As described above, attachment of the glass interconnection substrate to the optical chip after solder reflow uses an active alignment process (two-dimensional and theta-y). Instead of monitoring waveguide coupled power during a power peaking process, accurate measurements of pre-written waveguide locations can be made against precision alignment ridges (or trenches) formed in the surface of the interconnection substrate via the glass drawing process.

Figure 37A:
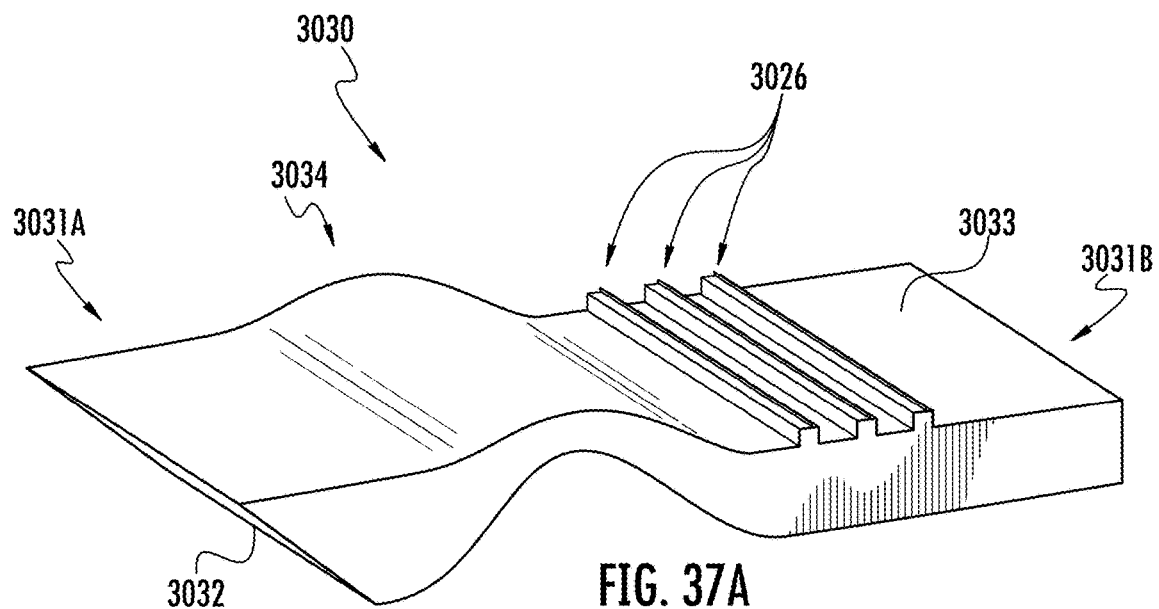
FIG. 37A schematically depicts an example glass interconnection substrate having a plurality of alignment ridges according to one or more embodiments described and illustrated herein.

FIG. 37A schematically depicts an example glass interconnection substrate 3030 having a first end 3031A with an angled first end surface 3032, a curved portion 3034, a second end 3031B, and an upper surface 3033 proximate the second end 3031B. A plurality of alignment features configured as alignment ridges 3026 are provided at the upper surface 3033. The alignment features may also be configured as trenches, or as other features that are detectable during an active alignment process.

Figure 37B:
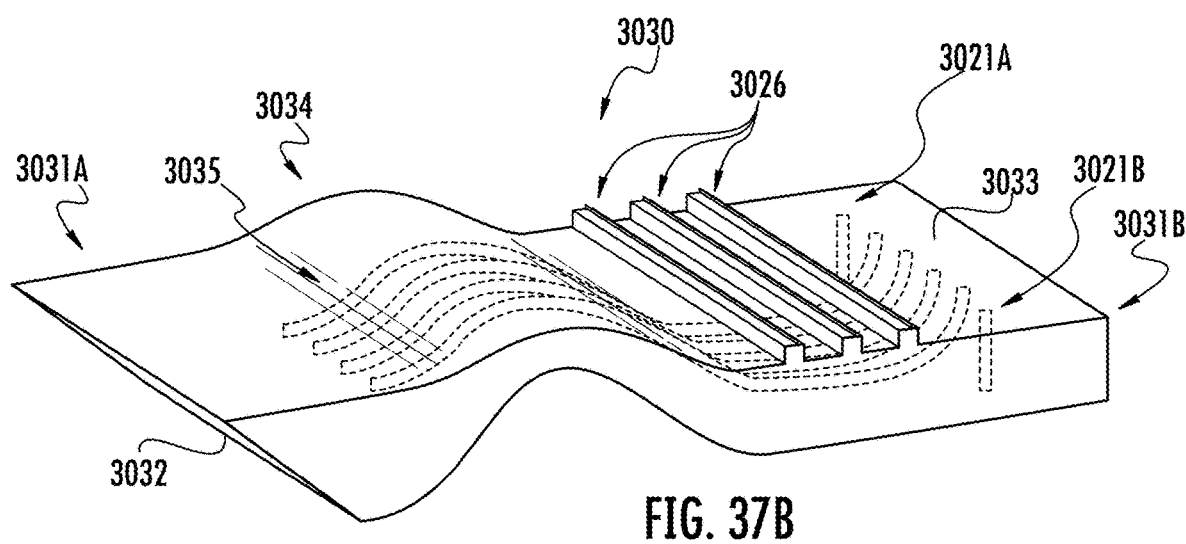
FIG. 37B schematically depicts an example glass interconnection substrate having a plurality of alignment ridges and alignment waveguides according to one or more embodiments described and illustrated herein.

Referring to FIG. 37B, laser written alignment optical waveguides 3021A, 3021B aligned to pre-written interconnection optical waveguides 3035 may also be written into the glass interconnection substrate 3030. Fiducial/alignment features can also be fabricated on assembled components using photolithographic processes, or random ink or paint splatter processes used in 3D image correlation photogrammetry, for example.

Referring now to FIG. 38A, accurate measurements of distances (e.g., A1 and A2) between alignment ridges 3026 and alignment optical waveguides 3021A, 3021B may be made using back-illumination of the glass interconnection substrate. The distances A1 and A2 allow distances B1 and B2 of outboard interconnection optical waveguide 3035 ends to be determined. Accurate measurements can also be made of offsets of active optical components 3007 from diced chip edges 3025 (e.g., C1 and C2) or specific edge features. Using this measurement information, it is possible to position the glass interconnection substrate 3030 beneath the optical chip 3012 and then actively align the interconnection optical waveguides 3035 to the active optical components 3007 using top side imaging metrology.

Figure 39A:
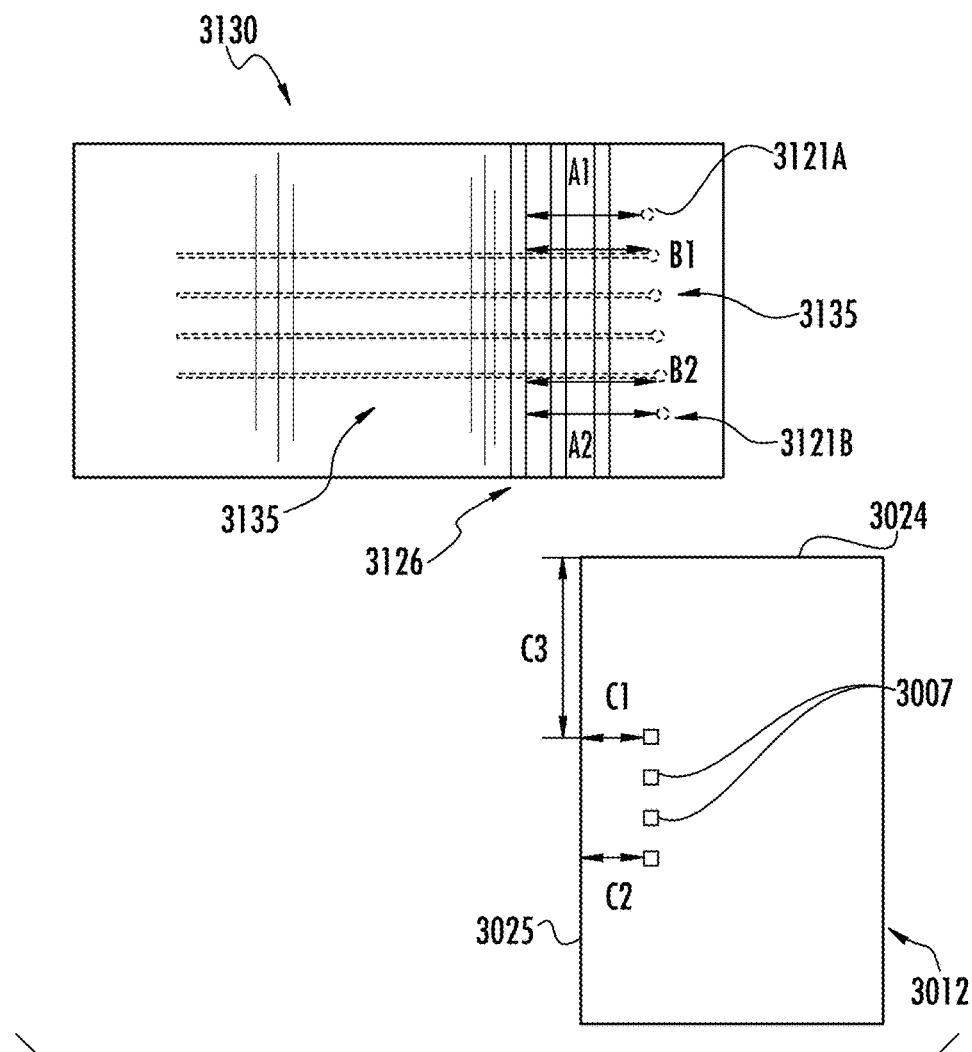
FIGS. 39A and 39B schematically depict an example coupling of an example glass interconnection substrate to an example optical chip using a plurality of alignment ridges and interconnection optical waveguides in an angled path, according to one or more embodiments described and illustrated herein.
Figure 39B:
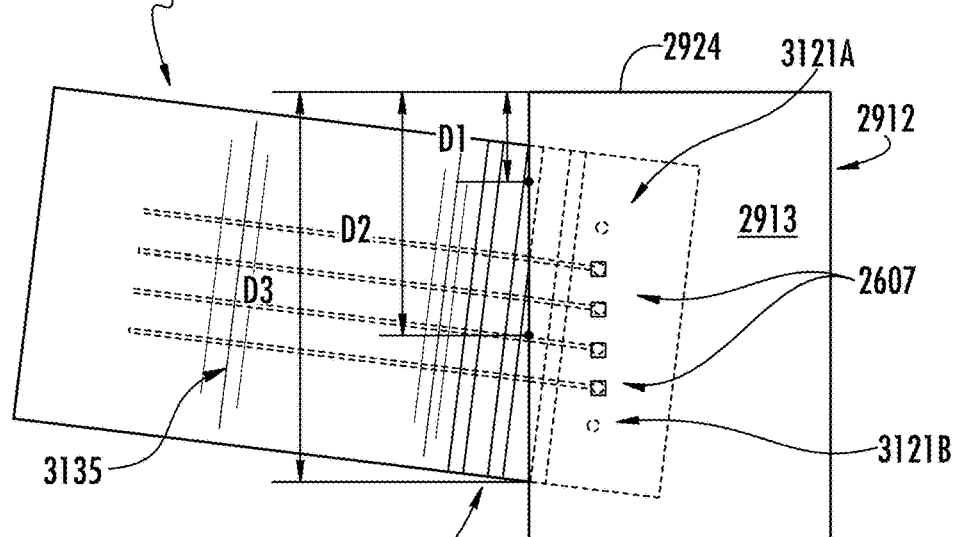

As shown in FIG. 39A top side vision system positioning accuracy of the glass interconnection substrate 3130 relative to the optical chip 3012 may be increased by forming the pre-written interconnection optical waveguides 3135 such that they terminate along an angled path relative to the alignment ridges 3126. The alignment optical waveguides 3121A, 3121B also contribute to the angled path. The distance A1 from a first alignment ridge 3126 to alignment optical waveguide 3121A is less than the distance A2 from the first alignment ridge 3126 to alignment optical waveguide 3121B. The active optical components 3007 are positioned on the optical chip 3012 in a path parallel to edge 3025 such that distance C1 and C2 of outboard active optical components 3007 are substantially equal. Further, distance C3 from edge 3024 to a first outboard active optical component 3007 may be calculated. During assembly, the angled alignment ridges 3126 serve as an edge vernier that provides accurate two dimensional feedback on positioning of the glass interconnection substrate tip waveguide features to active optical components on the optical chip 3012 (FIG. 39B).

It will be apparent to those skilled in the art that various modifications and variations can be made without departing from the spirit or scope of the disclosure. Since modifications, combinations, sub-combinations and variations of the disclosed embodiments incorporating the spirit and substance of the disclosure may occur to persons skilled in the art, the disclosure should be construed to include everything within the scope of the appended claims and their equivalents.

What is claimed is:

1. An optical interconnection assembly comprising:
a glass interconnection substrate comprising:
a first end and a second end;
a curved portion disposed between the first end and the second end; and
an optical waveguide extending from the first end to the second end and at least partially positioned within the curved portion,
wherein the glass interconnection substrate is flexible such that the first end is bendable with respect to the second end so that an end surface of the first end is non-parallel with respect to an end surface of the second end.

2. The optical interconnection assembly of claim 1, wherein:
the optical waveguide is one of a plurality of optical waveguides;
the plurality of optical waveguides has a first pitch between individual optical waveguides at the first end;
the plurality of optical waveguide has a second pitch between the individual optical waveguides at the second end; and
the first pitch is different from the second pitch.

3. The optical interconnection assembly of claim 1, wherein a thickness of the glass interconnection substrate at a point along a length of the glass interconnection substrate is less than a thickness of the glass interconnection substrate at the first end or the second end.

4. The optical interconnection assembly of claim 1, wherein a depth of the optical waveguide within the glass interconnection substrate varies along a length of the glass interconnection substrate.

5. The optical interconnection assembly of claim 1, wherein a depth of the optical waveguide within the glass interconnection substrate is such that the optical waveguide is closer to a convex surface of the glass interconnection substrate than a corresponding concave surface of the glass interconnection substrate.

6. The optical interconnection assembly of claim 1, wherein at least a portion of the glass interconnection substrate is coated with a layer having an index of refraction between an index of refraction of air and an index of refraction of the glass interconnection substrate.

7. The optical interconnection assembly of claim 1, wherein at least one of the first end and the second end of the glass interconnection substrate comprises a planar surface.

8. The optical interconnection assembly of claim 1, wherein at least one of the first end and the second end comprise a first planar surface, a second planar surface, and a third planar surface.

9. The optical interconnection assembly of claim 1, wherein a tip of at least one of the first end and the second end comprises a curved surface.

10. The optical interconnection assembly of claim 1, wherein at least one of the first end and the second end has a stepped shape comprising an overhang portion.

11. The optical interconnection assembly of claim 1, wherein a tip of at least one of the first end and the second end comprises a notch.

12. The optical interconnection assembly of claim 1, wherein the curved portion comprises a first planar surface and a second planar surface.

13. The optical interconnection assembly of claim 12, wherein the curved portion comprises a total internal reflection surface positioned between the first planar surface and the second planar surface.

14. The optical interconnection assembly of claim 1, wherein an optical axis of the first end is in a first plane, an optical axis of the second end is in a second plane, and the first plane and the second plane are different.

15. The optical interconnection assembly of claim 1, wherein the glass interconnection substrate comprises one or more gripping features.

16. The optical interconnection assembly of claim 15, wherein the one or more gripping features are configured as grooves positioned at the first end or the second end.

17. The optical interconnection assembly of claim 15, wherein the one or more gripping features comprise a first hole and a second hole at the first end and the second end.

18. The optical interconnection assembly of claim 17, wherein the curved portion of the glass interconnection substrate further comprises a first perimeter notch and a second perimeter notch.

19. The optical interconnection assembly of claim 1, further comprising at least one slot within the curved portion.

20. The optical interconnection assembly of claim 19, wherein the at least one slot is curved.

21. The optical interconnection assembly of claim 19, wherein the at least one slot extends from one of the first end and the second end.

22. The optical interconnection assembly of claim 1, wherein:
the optical waveguide is one of a plurality of optical waveguides;
the glass interconnection substrate comprises a plurality of slots within the curved portion; and
an individual slot of the plurality of slots is adjacent one or more individual optical waveguides of the plurality of waveguides.

23. The optical interconnection assembly of claim 22, wherein:
optical waveguides of the plurality of optical waveguides are curved; and
slots of the plurality of slots are curved.

24. The optical interconnection assembly of claim 22, wherein the plurality of slots extend from an end surface of at least one of the first end and the second end and into the other of the first end and the second end.

25. The optical interconnection assembly of claim 22, wherein the plurality of slots extend from an end surface of the first end and an end surface of the second end.

26. The optical interconnection assembly of claim 22, wherein:
a first subset of the plurality of slots extends from an end surface of the first end and into the second end; and
a second subset of the plurality of slots extends from an end surface of the second end and into the first end.

27. The optical interconnection assembly of claim 1, wherein:
an end surface of the first end of the glass interconnection substrate defines a first plane and an end surface of the second end of the glass interconnection substrate defines a second plane; and
the first plane is substantially parallel to the second plane.

28. The optical interconnection assembly of claim 1, further comprising at least one alignment ridge extending from an upper surface of the glass interconnection substrate.

29. The optical interconnection assembly of claim 1, further comprising at least one alignment waveguide extending through the bulk of the glass interconnection substrate.

30. The optical interconnection assembly of claim 1, wherein:
an end surface of the first end of the glass interconnection substrate defines a first plane and an end surface of the second end of the glass interconnection substrate defines a second plane; and
the first plane is orthogonal to the second plane.

31. The optical interconnection assembly of claim 1, wherein:
an end surface of the first end of the glass interconnection substrate defines a first plane and an end surface of the second end of the glass interconnection substrate defines a second plane; and
the first plane is transverse to the second plane.

32. The optical interconnection assembly of claim 31 further comprising:
a base substrate;
a substrate optical waveguide coupled to the base substrate, the substrate optical waveguide comprising an end surface; and
an optical chip comprising an optical coupling surface.

33. The optical interconnection assembly of claim 32, wherein:
the base substrate comprises a through-hole extending between a first surface of the base substrate and a second surface of the base substrate;
the first surface of the base substrate is opposite from the second surface of the base substrate;
the substrate optical waveguide is coupled to the first surface of the base substrate,
the optical chip is coupled to the second surface of the base substrate;
the optical chip comprises an active optical component disposed on a surface facing the through-hole;
a portion of the glass interconnection substrate is disposed within the through-hole of the base substrate; and
the first end of the glass interconnection substrate is coupled to the substrate optical waveguide and the second end of the glass interconnection substrate is coupled to the active optical component.

34. The optical interconnection assembly of claim 31, wherein the glass interconnection substrate is continuously curved from an end surface of the first end to an end surface of the second end.

35. The optical interconnection assembly of claim 31, wherein the glass interconnection substrate further comprises a first support block at the first end and a second support block at the second end.

36. The optical interconnection assembly of claim 31, wherein:

the glass interconnection substrate comprises a first plurality of optical waveguides and a second plurality of optical waveguides;

the optical waveguide is one of the first plurality of optical waveguides or the second plurality of optical waveguides; and the glass interconnection substrate further comprises at least one slot disposed between the first plurality of optical waveguides and the second plurality of optical waveguides.

37. The optical interconnection assembly of claim 31, wherein:

the optical waveguide comprises a first optical waveguide and a second optical waveguide; and the glass interconnection substrate further comprises at least one slot disposed between the first optical waveguide and the second optical waveguide.

38. The optical interconnection assembly of claim 31, wherein the first end defines a first leg and the second end defines a second leg.

39. The optical interconnection assembly of claim 38, wherein the glass interconnection substrate comprises a reflection surface between the first leg and the second leg.

40. The optical interconnection assembly of claim 38, wherein the glass interconnection substrate comprising at least one alignment waveguide within at least one of the first leg and the second leg.

41. The optical interconnection assembly of claim 31, wherein at least one of the first end and the second end of the glass interconnection substrate comprises a total internal reflection surface.

42. The optical interconnection assembly of claim 1, wherein the curved portion comprises a first peak, a second peak and a valley disposed between the first peak and the second peak.

43. The optical interconnection assembly of claim 42, further comprising:

a base substrate;

a substrate optical waveguide coupled to the base substrate, the substrate optical waveguide comprising an end surface; and an optical chip comprising an optical coupling surface.

44. The optical interconnection assembly of claim 43, wherein:

the base substrate comprises a well comprising a recessed floor within a surface of the base substrate;

the optical chip at least partially covers the well;

the optical chip comprises a chip optical waveguide at a surface facing the well; and the glass interconnection substrate is at least partially disposed within the well of the base substrate.

45. The optical interconnection assembly of claim 44, wherein:

an optical coupling end of the optical waveguide is located at an upper surface of the glass interconnection substrate at the second peak; and the optical coupling end of the optical waveguide is optically coupled to the chip optical waveguide.

46. The optical interconnection assembly of claim 45, wherein a coupling of light between the optical coupling end of the at least one waveguide and the chip optical waveguide is in a direction substantially parallel to the optical chip.

47. The optical interconnection assembly of claim 44, wherein the first end of the glass interconnection substrate contacts an end surface of the substrate optical waveguide, the second end of the glass interconnection substrate contacts a sidewall of the well, and an upper surface of the second peak of the glass interconnection substrate contacts the surface of the optical chip facing the well.

48. The optical interconnection assembly of claim 44, wherein the substrate optical waveguide is one of a plurality of substrate optical waveguides, the optical waveguide is one of a plurality of optical waveguides, and the chip optical waveguide comprises a plurality of chip optical waveguides.

49. The optical interconnection assembly of claim 43, wherein the curved portion comprises a loop, and an optical coupling end of the at least one waveguide is located at an upper surface of the loop.

50. The optical interconnection assembly of claim 1, wherein:

the first end comprises a first end surface and the second end comprises a second end surface;

the glass interconnection substrate comprises an upper surface between the first end surface and the second end surface, and a lower surface between the first end surface and the second end surface;

the optical waveguide comprises an optical coupling end that is offset from one of the first end surface and the second end surface; and the optical coupling end of the optical waveguide is located at one of the upper surface and the lower surface.

51. The optical interconnection assembly of claim 1, wherein the glass interconnection substrate has a thickness in a range of about 50 μm and about 200 μm.

52. The optical interconnection assembly of claim 1, wherein the optical waveguide comprises a pre-written waveguide at least partially within the curved portion, and at least one laser-written optical waveguide optically coupled to the pre-written waveguide and extending to at least one of the first end and the second end.

53. An optical interconnection assembly comprising:

a base substrate;

a substrate optical waveguide coupled to the base substrate, the substrate optical waveguide comprising an end surface;

an optical chip comprising an optical coupling surface; and a glass interconnection substrate comprising:

a first end optically coupled to the end surface of the substrate optical waveguide;

a second end optically coupled to the optical coupling surface of the optical chip;

a curved portion disposed between the first end and the second end; and an optical waveguide extending from the first end to the second end and at least partially positioned within the curved portion, wherein the glass interconnection substrate is flexible such that the first end is bendable with respect to the second end so that an end surface of the first end is non-parallel with respect to an end surface of the second end.

54. The optical interconnection assembly of claim 53, wherein:

the substrate optical waveguide is one of a plurality of substrate optical waveguides;

the plurality of optical waveguides is optically coupled to the plurality of substrate optical waveguides at the first end of the glass interconnection substrate;

the optical chip comprises a plurality chip optical waveguides; and the plurality of optical waveguides is optically coupled to the plurality of chip optical waveguides at the second end of the glass interconnection substrate.

55. The optical interconnection assembly of claim 53, wherein:
- at least one of the first end and the second end has a stepped shape comprising an overhang portion; and
- the optical chip comprises an upper surface, and an underside surface of the overhang portion is disposed over the upper surface of the optical chip.

56. The optical interconnection assembly of claim 53, wherein:
- a tip of at least one of the first end and the second end comprises a notch; and
- at least a portion of the notch is disposed at a lower surface of the optical chip.

57. The optical interconnection assembly of claim 53, further comprising a spacer positioned between a surface of the base substrate and at least one of the first end and the second end of the glass interconnection substrate.

58. The optical interconnection assembly of claim 53, further comprising a first glass block and a second glass block coupled to the glass interconnection substrate such that at least one of the first end and the second end of the glass interconnection substrate is disposed between the first glass block and the second glass block.

59. The optical interconnection assembly of claim 53, further comprising an overhang portion disposed on the substrate optical waveguide such that at least a portion of the overhang portion extends beyond the end surface of the optical waveguide and is disposed over the at least one of the first end and the second end of the glass interconnection substrate.

60. The optical interconnection assembly of claim 53, wherein the base substrate comprises a cutout, and one of the first end and the second end of the glass interconnection substrate is positioned within the cutout.

61. The optical interconnection assembly of claim 53, wherein:
- the second end of the glass interconnection substrate comprises a first surface, a second surface, and a second end surface between the first surface and the second surface;
- the optical waveguide comprises a turn such that the optical waveguide terminates at the second surface;
- the optical chip comprises an active optical component disposed on a first surface of the optical chip; and
- the second surface of the glass interconnection substrate is coupled to the first surface of the optical chip such that the optical waveguide is optically coupled to the active optical component.

62. The optical interconnection assembly of claim 53, wherein:
- the second end of the glass interconnection substrate comprises a first surface, a second surface, and a second end surface between the first surface and the second surface;
- the optical waveguide comprises a turn such that the optical waveguide terminates at the first surface;
- the optical chip comprises an active optical component disposed on a second surface of the optical chip; and
- the first surface of the glass interconnection substrate is coupled to the second surface of the optical chip such that the optical waveguide is optically coupled to the active optical component, and the second end of the glass interconnection substrate is disposed between the base substrate and the optical chip.

* * * * *